(12) United States Patent
Tsuji

(10) Patent No.: US 7,486,547 B2
(45) Date of Patent: *Feb. 3, 2009

(54) SEMICONDUCTOR INTEGRATED CIRCUIT DEVICE AND MAGNETIC MEMORY DEVICE CAPABLE OF MAINTAINING DATA INTEGRITY

(75) Inventor: Takaharu Tsuji, Hyogo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/889,029

(22) Filed: Aug. 8, 2007

(65) Prior Publication Data

US 2007/0291532 A1 Dec. 20, 2007

Related U.S. Application Data

(63) Continuation of application No. 11/062,496, filed on Feb. 23, 2005, now Pat. No. 7,272,032.

(30) Foreign Application Priority Data

Feb. 23, 2004 (JP) ............................. 2004-046004

(51) Int. Cl.
 *G11C 11/00* (2006.01)
(52) U.S. Cl. .................. 365/158; 365/157; 365/171; 365/173; 365/66
(58) Field of Classification Search ................. 365/158, 365/157, 171, 173, 66, 55
See application file for complete search history.

(56) References Cited

U.S. PATENT DOCUMENTS

| 6,097,626 | A | 8/2000 | Brug et al. |
| 6,418,046 | B1 | 7/2002 | Naji |
| 6,618,317 | B1 | 9/2003 | Tsuji et al. |
| 6,731,535 | B1 | 5/2004 | Ooishi et al. |
| 7,272,032 | B2 * | 9/2007 | Tsuji .......................... 365/158 |
| 2003/0117834 | A1 | 6/2003 | Iwata et al. |
| 2003/0161197 | A1 | 8/2003 | Iwata et al. |
| 2004/0001353 | A1 | 1/2004 | Hidaka |
| 2004/0125648 | A1 | 7/2004 | Iwata |
| 2004/0151052 | A1 | 8/2004 | Hidaka |
| 2005/0157546 | A1 | 7/2005 | Lammers et al. |

FOREIGN PATENT DOCUMENTS

| JP | 2000-163990 | 6/2000 |
| JP | 2003-109374 | 4/2003 |
| JP | 2003-123464 | 4/2003 |
| JP | 2003-168785 | 6/2003 |
| JP | 2003-249629 | 9/2003 |

* cited by examiner

*Primary Examiner*—Thong Q Le
(74) *Attorney, Agent, or Firm*—Buchanan Ingersoll & Rooney PC

(57) ABSTRACT

Magnetic memory devices integrated together with a logic circuit on a common semiconductor chip are arranged to have layouts mirror-symmetrical (mirror inversion) with respect to an axis parallel to a magnetization-hard axis of a magneto-resistance element of a magnetic memory cell in the magnetic memory device. The logic circuit is arranged between the magnetic memory devices. The magnetic memory device capable accurately of maintaining integrity in logical level between write data and read data is achieved.

1 Claim, 44 Drawing Sheets

DDCA1

CDA1

DDCB1

SEMICONDUCTOR INTEGRATED CIRCUIT DEVICE AND MAGNETIC MEMORY DEVICE CAPABLE OF MAINTAINING DATA INTEGRITY

CROSS REFERENCE TO RELATED APPLICATION

This application is a continuation application of application Ser. No. 11/062,496, filed Feb. 23, 2005, now U.S. Pat. No. 7,272,032, issued Sep. 18, 2007.

BACKGROUND OF THE INVENTION

1. Field of the Invention

The present invention relates to a magnetic memory using a magneto-resistance element as a data storage element as well as a semiconductor integrated circuit device containing such magnetic memory, and particularly to a magnetic memory, which can maintain integrity between write data and storage data or read data.

2. Description of the Background Art

Attention has been given to an MRAM Magnetic Random Access Memory: magnetic memory device) as a storage device, which nonvolatilely stores data with a low power consumption. The MRAM utilizes such a property that magnetization caused within a ferromagnetic material by an externally applied magnetic field resides within the ferromagnetic material even after the externally applied magnetic field is removed. Several elements such as a Giant Magneto-Resistance element (GMR element), a Colossal Magneto-Resistance element (CMR element) and a Tunnel Magneto-Resistance element (TMR element) have been known as data storage elements of memory cells of the MRAM.

A data storage section of the MRAM cell has a structure, in which two magnetic substance layers are stacked with an insulating film in between. One of these two magnetic substance layers is a fixed layer, of which magnetization direction is utilized as a reference magnetization direction, and the magnetization direction of the other magnetic substance layer (free layer) is changed according to storage data. A magnetic resistance value changes depending on match/mismatch between the magnetization directions of these magnetic substances, and accordingly an amount of current flowing through the storage section changes. Data reading is performed by determining the current flowing through the magnetic substance (magnet) layers of the storage section. For data writing, the direction of the current flow is determined according to the storage data, and a magnetic field induced by this current sets the magnetization direction of the magnet layer (free layer) for data storage.

According to tendencies of down-sizing semiconductor integrated circuit devices and of increasing storage capacities thereof, the MRAMs have been also required to have the increased storage capacities. In this case, it is required to arrange the MRAM cells in the memory cell array at a high density. A prior art reference 1 (Japanese Patent Laying-Open No. 2003-168785) discloses a structure, which aims to arrange MRAM cells in a memory cell array at a high density.

In this prior art reference 1, MRAM cells are stacked three-dimensionally, and a read select gate is arranged commonly to a predetermined number of MRAM cells aligned in a column direction. The MRAM cells in the stacked structure are arranged symmetrically with respect to a write interconnection line transmitting a write current so that interconnection lines are reduced in number to suppress deterioration in flatness of the multi-layer interconnection structure of the MRAM cells, which may be otherwise caused by increased number of interconnection lines.

In the structure disclosed in the prior art reference 1, the magnetic field of the same intensity is applied to the free layers of the memory cells arranged symmetrically with respect to the write interconnection line for achieving suppression of variations in intensity of the magnetic field in the write operation. In the data write operation, therefore, the writing magnetic fields of the same magnitude are applied to the memory cells arranged symmetrically with respect to the write interconnection line, and a leak magnetic field may invert the data in an unselected memory cell. In the structure of the prior art reference 1, an interconnection line (bit line), which is connected to the free layer, and causes an assisting magnetic field for the writing magnetic field in the data write operation, are likewise arranged symmetrically. In the case where the write interconnection line applies the magnetic fields of the same magnitude to the free layers of the memory cells arranged symmetrically, the magnetic fields applied from the magnetic field assisting interconnection line (bit line) may cause a problem of magnetic disturbance of erroneous writing in an unselected memory cell. In this prior art reference 1, no consideration is given on an influence of the leak magnetic field exerted on adjacent unselected cells in the data write operation.

Prior art references 2 and 3 (Japanese Patent Laying-Open Nos. 2003-123464 and 2003-109374) disclose structures for overcoming the above problem of magnetic disturbance.

The structure of the prior art reference 2 aims to prevent occurrence of such a situation that electrical charges charged on a parasitic capacitance of a write power supply line cause a rushing current when the writing starts, to cause overshoot in a writing current waveform. In this prior art reference 2, program operation time periods are made being overlapping with each other such that a write current is always consumed in an operation of successively writing data. Thereby, the parasitic capacitance of the write current supply is prevented from accumulating excessive charges, and a peak current (rushing current) in the write current is prevented from occurring during the write operation. Although the structure disclosed in the prior art reference 2 may be applied to the mode of writing data successively, this structure likewise causes the peak current in the write current when data of one bit is to be written or data writing is performed once, and thus the problem of magnetic disturbance arises. Further, no consideration is made on an influence exerted on an adjacent memory cell by the magnetic field induced by the writing magnetic field in a period of overlapping of the write currents in by the operation of successively writing data into adjacent memory cells. In this case, therefore, such a problem still arises that the problem of magnetic disturbance due to the magnetic field induced by the write current cannot be reliably overcome.

In the structure of the prior art reference 3, a current driving power of a write current supply is gradually increased over a plurality of steps to reduce a peak current in the write operation, for preventing erroneous writing. In the structure of the prior art reference 3, write current supplies supplying the write current are arranged corresponding to respective write drivers, and amounts of driving currents of the write drivers are commonly adjusted, resulting in an increased circuit occupation area as well as an increased load on control of the write current sources.

A prior art reference 4 (Japanese Patent Laying-Open No. 2003-249629) discloses a structure, in which write word lines for transmitting write currents in a write operation are also used for read bit lines for transmitting read currents in a data read operation, for improving an integration degree of a memory cell array. In this structure of the prior art reference 4, write word lines/read bit lines extending in a row direction are arranged corresponding to the memory cell rows, and are connected to the memory cells in the corresponding rows, respectively. Corresponding to memory cell columns, source lines and write bit lines are arranged. A read gate is arranged commonly to a predetermined number of memory cells arranged in the column direction, and connects the predetermined number of memory cells to a corresponding source line. Each source line is coupled to a ground node via a column select gate. In the data read operation, the column select gate in the selected column turns conductive according to a column address. In the data read operation, a write-word/read-bit line is selected according to a row address signal, and is coupled to a read circuit via a common data bus.

In the data write operation, write currents are supplied to both the write bit line and the write-word/read-bit line to perform data writing.

In the structure disclosed in the prior art reference 4, the read gate is commonly arranged for the plurality of memory cells instead of arranging a read gate for each memory cell for reducing an area occupied by the memory cells. Further, the write word lines are used also as the read bit lines so that the interconnection lines can be reduced in number, to reduce the array area.

In the structure of the prior art reference 4, no consideration is given to the problem of the disturbance, which will be caused by the leak magnetic field induced by the write current when an interval between the memory cells decreases according to an increased integration degree of the memory cell array.

In this prior art reference 4, a memory array is utilized as a macro. A memory cell array structure is registered as a library and, in expanding the memory cell array, the memory cell array structure (memory macro) is repetitively arranged in the row and column directions to expand the memory cell array.

In this prior art reference 4, in the memory macro, the memory cell array is arranged on one side of the write word drivers driving the write-word/read-bit lines, and no consideration is given to how to place the memory macro when the memory cell arrays are to be arranged on the both sides of the write word line drivers for reducing the lengths of the write-word/read-bit lines.

A prior art reference 5 (U.S. Pat. No. 6,418,046) discloses a structure, in which memory cell arrays are arranged on both sides of an axis extending in the column direction with a control circuit, a row decoder and a digit line current supply being a center. Bit lines are arranged extending in the column direction in both memory cell arrays, and the digit lines in each memory cell array are arranged directing toward row decode circuitry in the central area. The digit lines and the read word lines are interconnected, respectively. By utilizing one memory cell array as a macro, it is intended to facilitate the expansion of the memory cell array. Arranging the digit line current supply in the central region allows both the memory cell arrays to share the digit line drive current supply. The digit line current is supplied only to a selected memory array. Bit line write current drive circuitry is arranged such that the current can be supplied bidirectionally to a bit line according to write data. In this prior art reference 5, however, the memory cell is formed into substantially a regular square form, and no consideration is given to the directions of a magnetization-easy axis and a magnetization-hard axis of a magneto-resistance element of the memory cell in the arrangement of the memory cell array.

A prior art reference 6 (U.S. Pat. No. 6,097,626) discloses a structure for overcoming the problem of the magnetic disturbance in the write operation, in which an unselected cell adjacent to a selected cell is supplied, during a write operation, with a canceling current in a direction opposite to that of a write current supplied to the selected cell, for preventing data inversion in the unselected adjacent memory cell due to a magnetic field induced by the write current. In this prior art reference 6, no consideration is given to a problem of increase of the leak magnetic field, which is caused by a peak current when supply of the write current starts or stops.

In constructing a system LSI such as a System On Chip (SOC), a logic and a memory are integrated on a common semiconductor chip. For arranging a memory in the SOC, a memory macro, which is already designed and registered as a library, is used in view of design efficiency. In the construction of the prior art reference 5 as described above, the memory arrays arranged on both sides of the control circuit share the digit line current supply and only expansion of the memory arrays in a single memory chip is considered. No consideration is given to how to arrange the memory and to construct the memory when embedded with a logic.

The memory macro may be configured to cover an entire memory circuit including a memory cell array as well as a row decoder, a digit line drive circuit and a bit line drive circuit. In this case, upon integration mixedly with a logic, it may become necessary to arrange the memory macros into a point-symmetrical lay-out depending on a positional relationship between the memory macros and the logic. MRAM cell stores data according to a parallel/anti-parallel relationship between the magnetization directions of the free and fixed layers of the magneto-resistance element. On the same semiconductor chip, the magnetization directions of the fixed layers of the memory cells are usually set forcedly by an external magnetic field in a wafer process, and are equal to each other. Due to a symmetrical operation of the layout of the memory macro, the relationship between the magnetization direction of the free layer relative to the magnetization direction of the fixed layer and the logical level of the write data may differ from the original relationship in the macro.

A prior art reference 7 (Japanese Patent Laying-Open No. 2000-163990) discloses a configuration, in which a logical level of storage data is selectively inverted according to a relationship between an externally applied logical address and an internal actual address (physical address) in a memory cell array. For testability, there are provided an address scramble circuit that converts an external address so as to match the logical address with the physical address, and a data scramble circuit for controlling inversion of data according to a logical or physical address. In a structure in which a memory cell is connected to one of complementary bit lines as the case of a DRAM (Dynamic Random Access Memory) cell, such a situation may occur depending on an address that externally applied logical data differs in logical value from corresponding physical data actually stored in a memory cell. The prior art reference 7 also intends to perform correctly testing even in such case. The prior art reference 7 requires the address scramble circuit and the data scramble circuit, and thus makes complicated the circuit construction. In the case where inversion/non-inversion of the data varies depending on the position of the memory cell array and the magnetization direction of the fixed layer, it is difficult to set uniquely in advance the address scramble and the data scramble.

In the conventional magnetic memory devices, as described above, it is impossible to suppress efficiently the magnetic disturbance resulting from the write peak current in writing in an increased integration degree, and an integrity cannot be maintained between the logical data (external write/read data) and the physical data (stored data in memory cells).

In a system on chip or a system LSI constructed by utilizing a memory macro, the relationship between the logical data and the magnetization direction of the free layer with respect to the fixed layer may vary depending on the positional relationship between the logic and the memory macro. This results in a problem that integrity cannot be maintained between logical data and physical data or between external write data and external read data.

SUMMARY OF THE INVENTION

An object of the invention is to provide a magnetic memory device, which can accurately maintain integrity between logical data and physical data.

Another object of the invention is to provide a magnetic memory device, which can accurately write data without causing magnetic disturbance.

Still another object of the invention is to provide a magnetic memory device, in which memory expansion can be easily effected while maintaining integrity between external write data and external read data.

Yet another object of the invention is to provide a magnetic memory device, which has a layout suitable for mixed integration with a logic.

A semiconductor integrated circuit device according to a first aspect of the invention includes a logic circuit for effecting a predetermined processing on applied data; and a plurality of magnetic memories integrated with the logic circuit on a semiconductor chip, for at least storing data to be used by the logic circuit. Each magnetic memory has a plurality of magnetic memory cells arranged in rows and columns. Each magnetic memory cell includes a magneto-resistance element formed of a fixed layer having a magnetization direction fixed independently of storage data, a free layer having a magnetization direction set according to the storage data, and a non-magnetic substance layer arranged between the fixed and free layers. The fixed layers in the plurality of magnetic memories have the same magnetization direction, and the plurality of magnetic memories have layouts allowing, in all the magnetic memories, the same relationship in parallelism/anti-parallelism of magnetization directions between the free and fixed layers for a logical level of externally applied write data.

A magnetic memory device according to a second aspect of the invention includes at least one memory cell array having a plurality of magnetic memory cells arranged in rows and columns. Each magnetic memory cell includes a magneto-resistance element having a fixed layer and a free layer each having a magnetization-easy axis and a magnetization-hard axis. The free layer has a magnetization direction set according to storage data, and the fixed layer has a magnetization direction fixedly set independently of the storage data.

The magnetic memory device according to the second aspect of the invention further includes an inverted data holding circuit arranged commonly to the memory cells of the at least one memory cell array, for fixedly storing inversion control data inverting a logical level of at least one of write data and read data of the at least one memory cell array.

The magnetic memory device according to the second aspect of the invention further includes a data polarity inverting circuit for inverting a logical level of one of the write data and the read data of the at least one memory cell array according to the inversion control data received from the inverted data holding circuit.

A magnetic memory device according to a third aspect of the invention includes a plurality of magnetic memory cells arranged in rows and columns; a plurality of bit lines arranged corresponding to memory cell columns; and a plurality of bit line drivers arranged on the opposite sides of the respective bit lines, for supplying a current to corresponding bit lines when made active. Each bit line driver includes a charging transistor coupled to a power supply node and a discharging driver coupled to a ground node.

The magnetic memory device according to the third aspect of the invention further includes a plurality of bit line drive control circuits arranged corresponding to the bit line drivers, for activating corresponding bit line drivers according to a column select signal and write data. The bit line drive control circuits arranged corresponding to a common bit line, when selected, drive the charging transistor of the bit line driver on one end of the bit line and the discharging transistor of the bit line driver on the other end.

A magnetic memory device according to a fourth aspect of the invention includes a plurality of magnetic memory cells arranged in rows and columns; a plurality of bit lines arranged corresponding to the memory cell columns; a plurality of digit lines arranged corresponding to the memory cell rows; a plurality of column select signal lines, arranged parallel to the bit lines in a planar layout, each for transmitting a column select signal; a plurality of bit line drive circuits arranged on the opposite sides of respective bit lines, for supplying a write current for writing data into a memory cell to a corresponding bit line when active; and a plurality of bit line drive control circuits arranged corresponding to the bit line drive circuits. In data writing, each of the bit line drive control circuits activates the corresponding bit line drive circuit according to a write timing signal produced based on write data and a column select timing signal produced based on a column select signal on a corresponding column select signal. This activation of the column select signal is effected at a timing faster than activation of the write timing signal, and deactivation of the column select signal is effected at a timing later than deactivation of the write timing signal. An active period of the write timing signal determines a time period of flow of the write current through the bit line.

The magnetic memory device according to the fourth aspect of the invention further includes digit line drive circuitry arranged corresponding to the plurality of digit lines, for supplying a current to a digit line on a selected row according to an address signal in the data write operation. The digit line drive circuit is activated at a timing between activation of the column select signal and activation of the write timing signal, and is deactivated at a timing between deactivation of the column select signal and deactivation of the write timing signal.

A magnetic memory device according to a fifth aspect of the invention includes a plurality of magnetic memory cells arranged in rows and columns; a plurality of write current lines arranged corresponding to the memory cell columns; a plurality of control signal lines of divided structure, arranged parallel to and non-overlapping in a plan view with the write current lines and arranged in an interconnection layer different from that of said write current lines in an elevation view, each having divided lines transferring a common control signal; and a plurality of current drive circuits arranged corresponding to the write current lines, for supplying a write current for writing data into a memory cell to a corresponding write current line according to the signal on a corresponding control signal and the write data when being active.

According to the first aspect of the invention, the plurality of magnetic memories arranged for the logic circuit are configured to have the layout, in which the same relationship is established between the external write data and the magnetization direction of the free layer in all the magnetic memories. Therefore, it is possible to maintain integrity between the logical data and the physical data in each magnetic memory so that data processing can be accurately performed without switching the polarities of input or output data for each magnetic memory.

According to the invention of the second aspect, the write or read data of the memory cell is selectively inverted according to the inversion control data. Therefore, inversion/non-inversion of the write or read data can be performed according to the data storage characteristics of the memory cells so that the integrity can be equivalently maintained in the logical data and the physical data.

According to the invention of the third aspect, when the write current is supplied to the bit line, the charging and discharging transistors of the bit line driver are driven to the on state at different timings, and the conduction degree of the discharging transistor is set smaller than the conduction degree of the charging transistor. Therefore, it is possible to suppress a peak current at the start of supply of the write current to prevent the storage data of the adjacent cell from being adversely affected by the write magnetic field caused by a peak current, and the magnetic disturbance can be prevented from occurring.

According to the invention of the fourth aspect, the digit line is activated following the activation of the column select signal, and then the write current is supplied to the selected bit line. Therefore, the magnetic field induced by a peak current in driving the column select signal and the digit line can be prevented from adversely affecting the selected memory cell, so that data corresponding to the write data can be accurately written into the memory cell.

According to the invention of the fifth aspect, the control signal lines related to selection of the write current lines have the divided structure, and are arranged being displaced from the write current lines in a plan view so that a distance between the control signal and the memory cell can be made long, and the magnetic field induced by the control signal line can be small. Thus, it is possible to suppress the influence exerted on the memory cell by the magnetic field induced by the control signal line. Also, the data corresponding to the write data can be accurately written into the memory cell.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
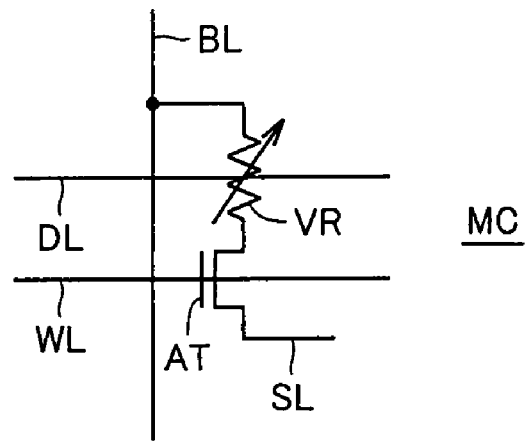
FIG. 1 shows an electrically equivalent circuit of a magnetic memory cell.

FIG. 1 shows an electrically equivalent circuit of a memory cell MC in a magnetic memory device according to the invention. In FIG. 1, magnetic memory cell MC includes a magneto-resistance element VR connected at its one end to a bit line BL and having a resistance value changing in accordance with storage data, and an access transistor AT connecting the other end of magneto-resistance element VR to a source line SL according to a signal potential on a word line WL. A digit line DL is arranged corresponding to magneto-resistance element VR and in parallel with word line WL. Magneto-resistance element VR is formed of an element having a Tunneling Magneto-Resistance (TMR) effect, for example. Memory cells MC are arranged in rows and columns in the memory cell array. In the following description, an extending direction of bit line BL is referred to as a "column direction", and an extending direction of word line WL and digit line DL is referred to as a "row direction".

Figure 2:
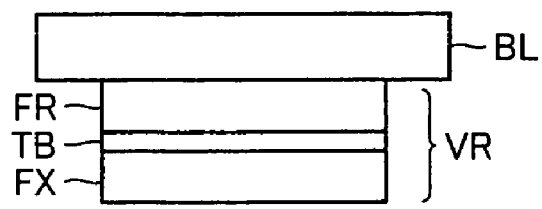
FIG. 2 schematically shows a sectional structure of a magneto-resistance element of the memory cell.

FIG. 2 schematically shows a structure of a magneto-resistance element VR. In FIG. 2, magneto-resistance element VR includes a fixed magnetization layer (fixed layer) FX having a fixed predetermined magnetization direction, a free magnetization layer (free layer) FR that is magnetized in a direction corresponding to an externally applied magnetic field, and a tunneling insulation film TB arranged between fixed and free magnetization layers FX and FR. Free layer (free magnetization layer) FR is connected to bit line BL via an upper electrode contact (not shown). Usually, digit line DL is arranged under fixed layer FX.

Fixed layer FX and free layer FR are both formed of ferromagnetic layers. The magnetization direction of free layer FR is set equal or opposite to the magnetization direction of fixed layer FX according to the logical level of the write data. Fixed layer FX, tunneling insulation film TB and free layer FR form a magnetic tunnel junction.

Figure 3:
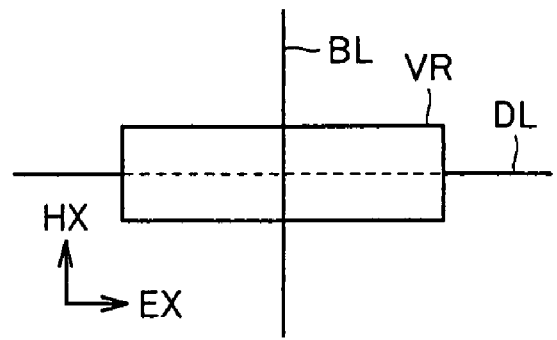
FIG. 3 schematically shows a planar structure of the magneto-resistance element.

FIG. 3 schematically shows a planar layout of magneto-resistance element VR. As shown in FIG. 3, magneto-resistance element VR has a rectangular form having short sides extending along bit line BL and long sides extending along digit line DL. Each of the fixed and free layers of magneto-resistance element VR has a magnetization-hard axis (referred to as hard axis hereinbelow) HX in the extending direction of bit line BL and an magnetization-easy axis (referred to as easy axis hereinbelow) EX in the extending direction of digit line DL. Magneto-resistance element VR has the rectangular form having long and short sides, and the hard axis is made coincident with the direction of the short side, and the hard axis is made coincident with the direction of the long side. The current flowing through bit line BL induces the magnetic field acting in the direction of the easy axis on magneto-resistance element VR. The current flowing through digit line DL induces the magnetic field acting in the direction of hard axis HX on magneto-resistance element VR. A combined magnetic field formed of these magnetic fields determines the magnetization direction of free layer FR.

Figure 4:
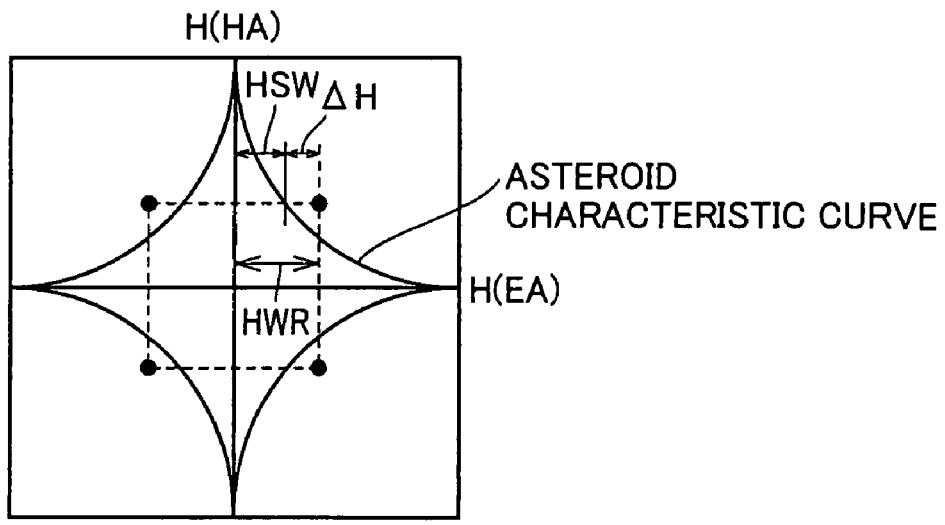
FIG. 4 illustrates magnetization characteristics of the magneto-resistance element.

FIG. 4 illustrates a state of magnetization of the magneto-resistance element in a data write. In FIG. 4, the abscissa H(EA) measures the magnetic field applied in the direction of the easy axis of free layer FR of magneto-resistance element VR and induced by the current flowing through bit line BL. The ordinate H(HA) measures a magnetic field induced in the direction of hard axis HX of free layer FR by the current flowing through digit line DL.

In FIG. 4, solid point marks indicate operation points of the combined field applied to the memory cell, or to magneto-resistance element VR. The direction of the write current supplied to digit line DL is constant independently of the logical level of write data. Therefore, the operation points of the combined magnetic field applied to magneto-resistance element VR of the memory cell consist of two points that are symmetrical with respect to the ordinate H(HA) in FIG. 4 and are located on either the upper side or the lower side of magnetic field H(EA) in the direction of easy axis EX.

An asteroid characteristic curve represents a threshold of magnetic inversion of the free layer. Thus, in the data writing, the magnetization direction of free layer FR can be set in the case when the combined magnetic field of magnetic fields H(EA) and H(HA) reaches a region outside the asteroid characteristic curve shown in FIG. 4. In the case when the combined magnetic field of magnetic fields H(EA) and H(HA), i.e., the combined magnetic field of a bit line write magnetic field H(BL) and a digit line magnetic field H(DL) has an intensity corresponding to a region inside the asteroid characteristic curve, the magnetization direction of free layer FR does not change. By applying the magnetic field in the direction of hard axis HX to free layer FR, it is possible to reduce a magnetization threshold required for changing the magnetization direction in the direction of easy axis EX, to reduce an amount of the write current flowing through bit line BL.

When the asteroid characteristic curve and the operation points are set as shown in FIG. 4, the values of the write currents flowing through bit line BL and digit line DL are set such that the data writing magnetic field in the direction of easy axis EX attains the intensity of HWR in the memory cell of the data writing target. In general, intensity HWR of the data writing magnetic field produced in the data write is represented by a sum of a switching magnetic field HSW required for switching the magnetization direction of free layer FR and a margin Δ H.

In magneto-resistance element VR formed into a rectangular form as shown in FIG. 3, the magnetic field induced by bit line BL is set in the direction of easy axis EX of free layer FR. The write current flowing through bit line BL predominantly sets the magnetization direction of free layer FR of magneto-resistance element VR. The current flowing through digit line DL is utilized as an assisting magnetic field for reducing the threshold for switching the magnetization direction in magneto-resistance element VR. Therefore, following description relating to the data writing will be made mainly with reference to the write current flowing through the bit line, unless otherwise noted.

Figure 5:
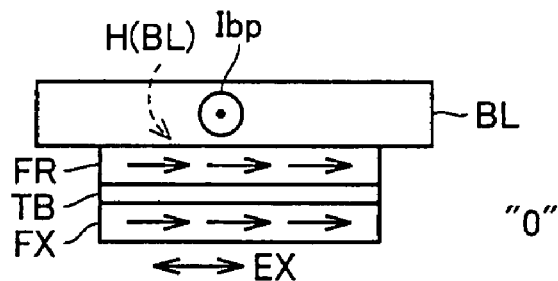
FIG. 5 schematically shows magnetization directions of the magneto-resistance element in data writing.

FIG. 5 shows an example of the relationship between the bit line write current in the data write and the magnetization direction of the free layer. Fixed layer FX is fixedly magnetized in advance in the direction of easy axis EX. In FIG. 5, fixed layer FX is magnetized along easy axis EX in the direction from the left to the right of FIG. 5. When a bit line write current Ibp flows through bit line BL in the direction from the rear side of the drawing sheet of FIG. 5 to the front side thereof, bit line write current Ibp induces counter-clockwise magnetic field H(BL). Bit line write magnetic field H(BL) is applied as the magnetic field in the easy axis direction to free layer FR as shown in FIG. 3, and free layer FR is magnetized in the direction from the left to the right along easy axis EX. If the magnetization directions of free and fixed layers FR and FX are parallel to each other (i.e., the same magnetization direction), magneto-resistance element VR has the minimum resistance value. This state is correlated with a state of storing data "0".

Figure 6:
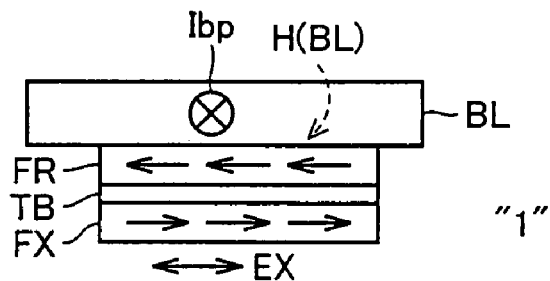
FIG. 6 schematically shows magnetization directions of the magneto-resistance element of the memory cell in data writing.

If bit line write current Ibp flows through bit line BL in the direction from the front side of the drawing sheet of FIG. 6 to the rear side thereof, it induces clockwise bit line write magnetic field H(BL), and free layer FR is magnetized in the direction from the right to the left in FIG. 6 along easy axis EX. In this state, the magnetization directions of free layer FR and fixed layer FX are anti-parallel to each other (the state of magnetized in opposite directions), and magneto-resistance element VR has the maximum resistance value. This state is correlated with a state of storing data "1".

As shown in FIGS. 5 and 6, the magnetization direction of free layer FR is set according to the storage data, and accordingly the resistance value of magneto-resistance element VR can be changed so that the memory cell can store binary data.

For data reading, word line WL is driven to the selected state in the structure of memory cell MC shown in FIG. 1. Access transistor AT is turned on to connect magneto-resistance element VR to source line SL. In this state, the amount of current flowing from bit line BL to source line SL is detected to produce internal read data according to the current amount thus detected.

Figure 7:
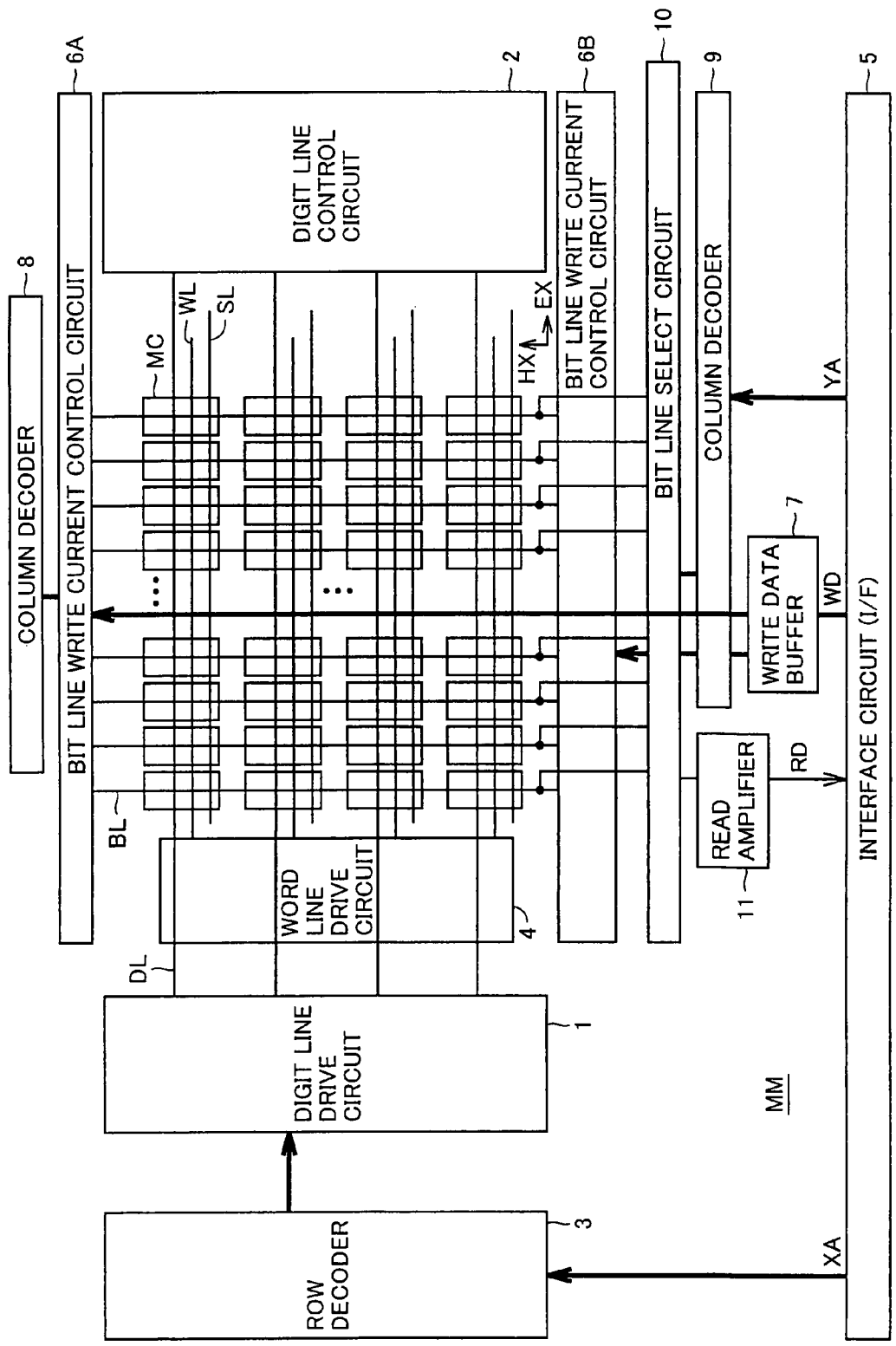
FIG. 7 schematically shows a whole structure of the magnetic memory device according to the invention.

FIG. 7 schematically shows a construction of a main portion of the magnetic memory device. In FIG. 7, the magnetic memory device includes the plurality of memory cells MC arranged in rows and columns, bit lines BL arranged corresponding to the columns of memory cells MC, respectively, as well as digit lines DL, word lines WL and source lines SL arranged corresponding to the rows of memory cells MC.

Memory cell MC is shown in FIG. 7 so as to have a rectangular form having a long side along the extending direction of bit line BL, for the purpose of representing that digit line DL, word line WL and source line SL are arranged corresponding to each row of the memory cells. The magneto-resistance element included in memory cell MC has the hard axis HX in the extending direction of bit line BL and the easy axis EX in the direction perpendicular to bit line BL. Thus, bit line BL is arranged along hard axes HX of the free and fixed layers of the magneto-resistance element included in memory cell MC, and digit line DL, word line WL and source line SL are arranged along easy axes EX.

A digit line drive circuit 1 is arranged on first sides of digit lines DL, and a digit line control circuit 2 is arranged on opposite second sides of digit lines DL. Digit line drive circuit 1 supplies a current to digit line DL arranged corresponding to a selected row according to a row select signal applied from a row decoder 3. A digit line control circuit 2 couples each digit line DL or a selected digit line to a ground node. In the data writing, therefore, the digit line write current flows through digit line DL in the direction from digit line drive circuit 1 to digit line control circuit 2 independently of the logical level of the write data.

A word line drive circuit 4 is arranged for word lines WL. In data reading, word line drive circuit 4 drives word line WL, arranged corresponding to a selected row, to the selected state according to the row select signal provided from row decoder 3. For the sake of simplicity, FIG. 7 does not show a path of the row select signal transmitted from row decoder 3 to word line drive circuit 4. Row decoder 3 decodes an X address signal XA applied via an interface circuit 5, to produce the row select signal designating a selected row.

Bit line write current control circuits 6A and 6B are arranged oppositely on the first and second sides of bit lines BL. Bit line write current control circuits 6A and 6B are supplied with complementary data from a write data buffer 7, respectively, and supply the bit line write current in the direction corresponding to the write data, to the bit line on a selected column in data writing. Bit line write current control circuits 6A and 6B are supplied with the column select signal from a column decoder 8 via column select signal lines arranged on the array. For the sake of simplicity, FIG. 7 does not show the transmission path of the column select signal to bit line write current control circuit 6B. Also, column decoder 8 is supplied with a column address signal YA from interface circuit 5 via a not shown path.

As described above, bit line write current control circuits 6A and 6B are arranged on the opposite sides of bit lines BL, and are supplied, from write data buffer 7, the complementary write data. Thereby, the current can be caused to flow through the bit line corresponding to the selected column in the direction corresponding to the write data.

For bit lines BL, a bit line select circuit 10 is further provided for selecting the bit line according to the column select signal received from column decoder 9. In data reading, bit line select circuit 10 selects bit line BL corresponding to a selected column, and couples it to a read amplifier 11. Column decoder 9 receives a column address signal YA from interface circuit 5.

Read amplifier 11 detects the bit line current, produces internal read data RD according to the detected current, and externally outputs the read data via interface circuit 5.

The magnetic memory device shown in FIG. 7 includes a control circuit for producing necessary internal control signals according to an externally applied command instructing an operation mode and a clock signal defining an operation cycle. However, this control circuit is not shown in FIG. 7. Interface circuit (I/F) 5 is provided for achieving compatibility in specification of signals of external devices, and includes I/O buffers.

Figure 8:
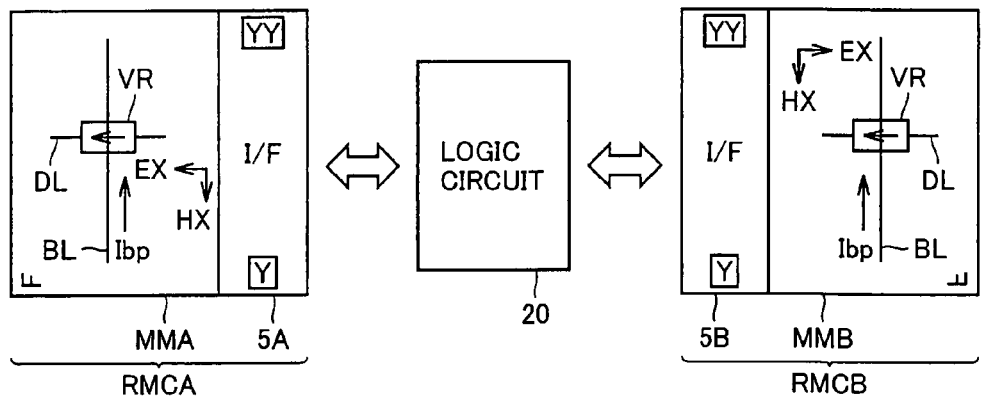
FIG. 8 schematically shows an arrangement of memory macros in a semiconductor integrated circuit device according to a first embodiment of the invention.

As shown in FIG. 8, a logic circuit 20 such as a processor is integrated with MRAM macros RMCA and RMCB, which store data to be used by logic circuit 20, on the same semiconductor chip, to implement a system on chip, to achieving the system of small sizes, light weight and low power consumption.

In the magnetic memory device shown in FIG. 7, a memory circuit MM, which is formed interface circuit 5 and the other circuits are registered as one macro into a library. Alternatively, memory circuit MM portion other than interface circuit 5 may be registered as the library.

FIG. 8 schematically shows a construction of a semiconductor integrated circuit device according to the first embodiment of the invention. In the construction of the semiconductor integrated circuit device shown in FIG. 8, MRAM macros RMCA and RMCB are arranged on the opposite sides of logic circuit 20. Memory macro RMCA has an interface circuit 5A and a memory circuit MMA, and an MRAM macro RMCB has an interface circuit 5B and an internal circuit MMB. Each of interface circuits 5A and 5B extends in the extending direction of bit line BL, or in the direction of the hard axis HX, and is arranged on one side of corresponding memory macro RMCA or RMCB, or at a side near logic circuit 20. MRAM macros RMCA and RMCB have digit lines DL arranged perpendicularly to the extending direction of the respective interface circuits 5A and 5B. Magneto-resistance element VR has the long side in the direction of easy axis EX, and has the short side in the hard axis direction.

As can be seen from letters "F", MRAM macros RMCA and RMCB are arranged symmetrically with respect to logic circuit 20, or the axis parallel to hard axis HX, and have mirror-symmetrical layouts. Therefore, interface circuits 5A and 5B have mirror-symmetrical layouts in the MRAM macros.

Figure 9:
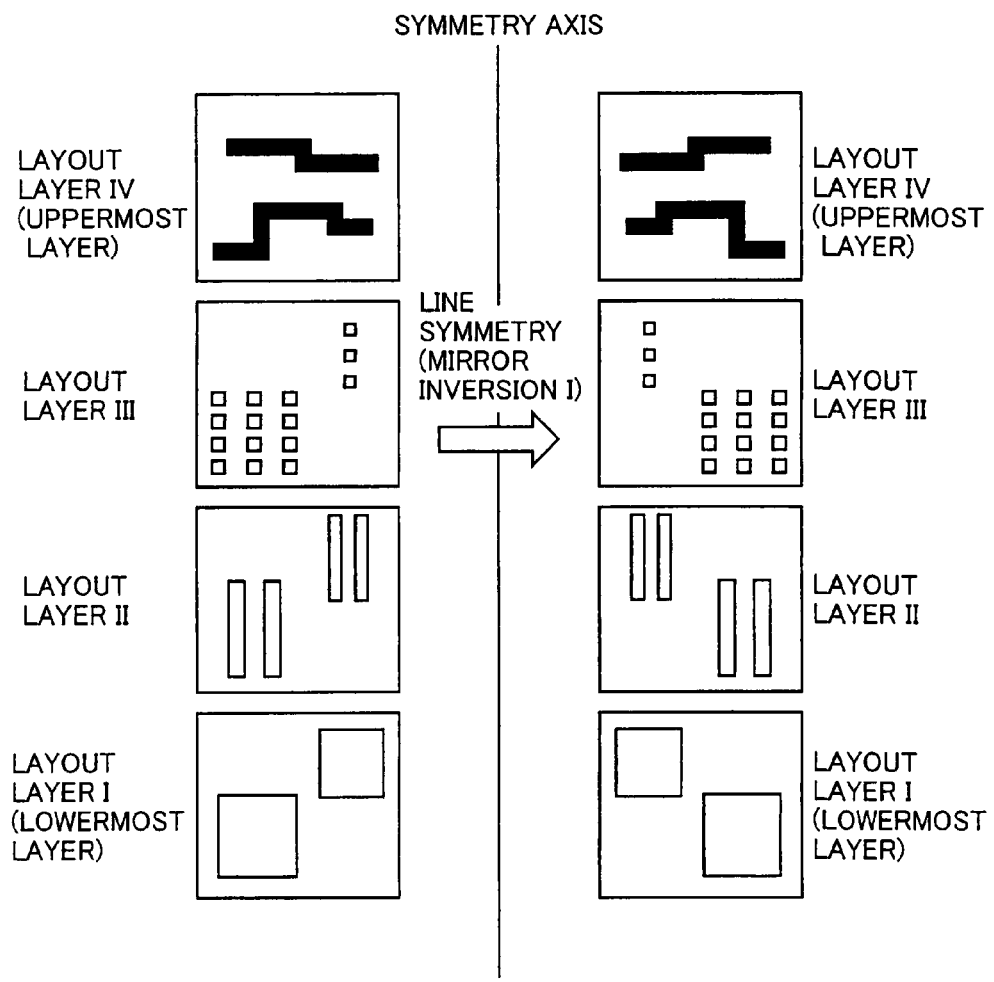
FIG. 9 shows an operation for mirror-symmetrization (mirror-inversion) of the memory macros according to the first embodiment of the invention.

FIG. 9 illustrates a mirror-inverting operation for forming the mirror-symmetrical layout. FIG. 9 representatively illustrates four layout layers including a lowermost layout layer I and an uppermost layout layer IV. These layout layers I-IV include an active region layer including diffusion regions for forming transistors, a contact hole layer having contact holes formed for electrical connections between interconnection lines or elements, and an interconnection layer having interconnection lines formed including voltage transmitting lines such as a signal line, a power supply line and a ground line.

According to a mirror-inversion operation, as shown in FIG. 9, a layout of layout layers I-IV, e.g., on the right side of the symmetry axis is obtained by folding back the layouts of layout layers I-IV on the left side with respect to the symmetry axis. In this mirror-inverting operation, an original order of the layout layers is maintained, and the corresponding layout layers have a line-symmetrical geometry (pattern) with respect to the symmetry axis.

Figure 10:
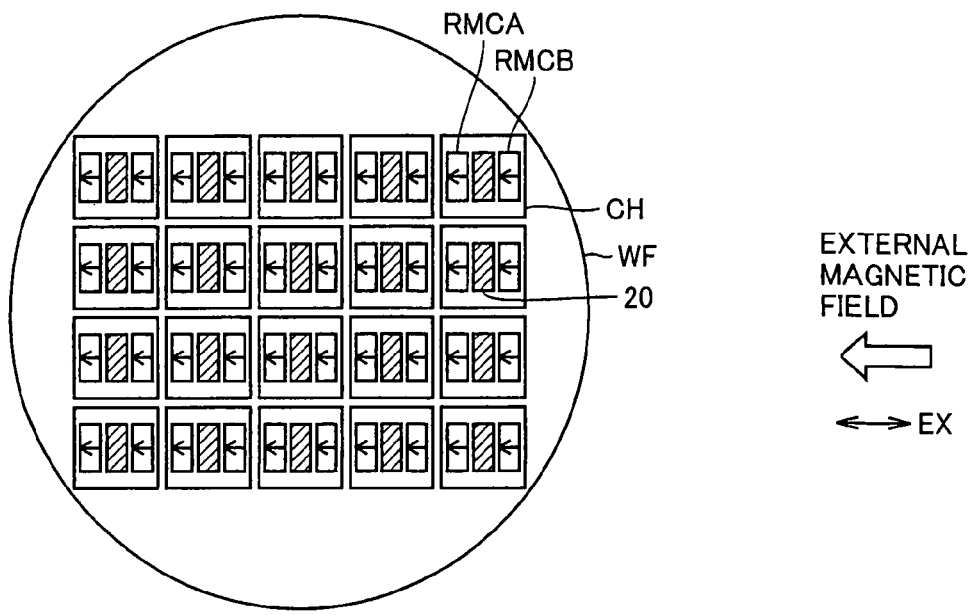
FIG. 10 shows a magnetization direction of a fixed layer of the magneto-resistance element of the memory macro in the semiconductor integrated circuit device according to the first embodiment of the invention.

FIG. 10 schematically shows a step of setting the magnetization direction of the fixed layer. In FIG. 10, semiconductor chips CH are aligned on a semiconductor wafer WF. Semiconductor chip CH includes MRAM macros RMCA and RMCB as well as logic circuit (logic macro) 20 arranged between these MRAM macros RMCA and RMCB. This semiconductor chip CH implements an MRAM-assembled system LSI (SOC).

For magnetizing the fixed layer, an external magnetic field is applied in the direction of easy axis EX to wafer WF. Responsively, in all semiconductor chips CH on semiconductor wafer WF, the magnetization directions of the fixed layers of the magneto-resistance elements in MRAM macros RMCA and RMCB can be uniformly set leftward along easy axis EX.

Figure 11:
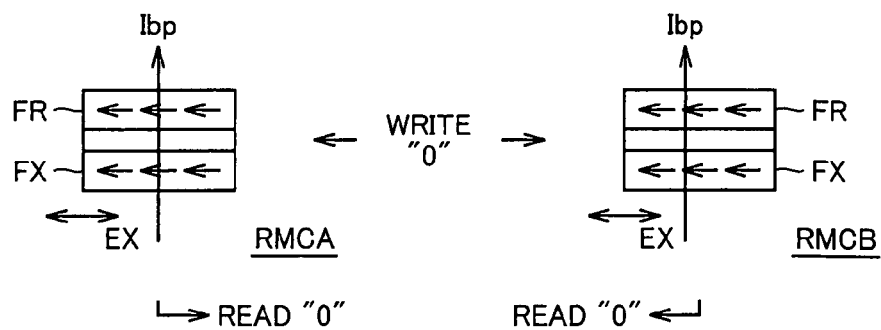
FIG. 11 shows a relationship between write and read data in the semiconductor integrated circuit device according to the first embodiment of the invention.

FIG. 11 shows a relationship between the bit line current and the magnetization direction of the free layer in writing data "0" in the semiconductor integrated circuit device shown in FIG. 8. Fixed layer FX is magnetized in the leftward direction as indicated by an arrow. For writing data "0", bit line write current Ibp flowing upward in FIG. 11 is supplied to bit line BL. In this case, the write current flows from a point Y to a point YY in FIG. 8. In both MRAM macros RMCA and RMCB, bit line write current Ibp flows in the same direction, and free layers FR in MRAM macros RMCA and RMCB are magnetized leftward along easy axis EX as indicated by arrows, similarly to fixed layer FX.

In this state, the current flowing direction of the digit line in MRAM macro RMCA is opposite to that in MRAM macro RMCB. In this case, therefore, the digit line current in MRAM macro RMCA induces the magnetic field in a direction opposite to that in MRAM macro RMCB. As illustrated by the asteroid characteristic line in FIG. 4, however, the magnetic field induced by the digit line is used merely as the assisting magnetic field for reducing the amount of bit line write current Ibp, and bit line write current Ibp determines the magnetization direction of free layer FR. In both memory macros RMCA and RMCB, therefore, free layers FR are magnetized in the direction parallel to that of fixed layer FX.

In this state, memory cells in MRAM macros RMCA and RMCB have stored data "0". In the data reading, large currents flow through the bit lines so that data "0" can be accurately read out.

Figure 12:
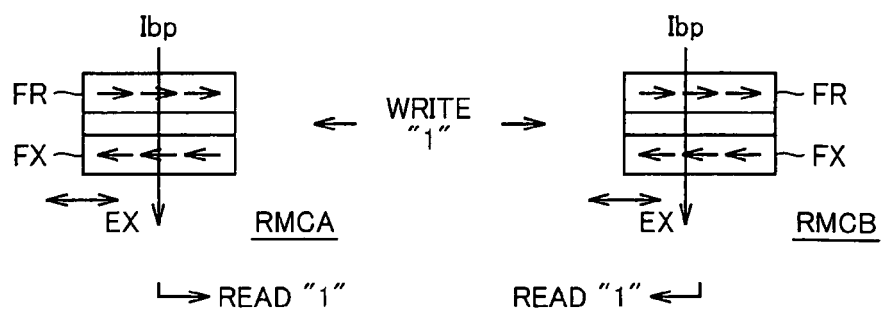
FIG. 12 shows a relationship between the write and read data of each macro in the semiconductor integrated circuit device according to the first embodiment of the invention.

FIG. 12 shows a relationship between the bit line current and the magnetization direction of the free layer in writing data "1" into the memory cell. Fixed layer FX is already magnetized leftward in FIG. 12. In writing data "1", bit line write currents Ibp flow in the direction from point YY to point Y in both MRAM macros RMCA and RMCB shown in FIG. 8. In this case, in both MRAM macros RMCA and RMCB, free layer FR is magnetized rightward in the direction of easy axis EX, and is magnetized in the direction anti-parallel to that of fixed layer FX so that the magneto-resistance element enters into the high-resistance state. In the data reading, data "1" is read similarly to the write data in both MRAM macros RMCA and RMCB.

More specifically, as shown in FIG. 8, memory macros RMCA and RMCB, which are arranged on the opposite sides of logic circuit 20, respectively, have a mirror-symmetrical layout symmetrical with respect to the axis parallel to hard axis HX, and the same positional relationship in the direction from point Y to point YY is maintained in memory macros RMCA and RMCB. In MRAM macros RMCA and RMCB, therefore, the bit line write currents for the data of the same logical level can be set in the same direction.

In the construction in which MRAM macros RMCA and RMCB each have the direction of the magnetization of the fixed layer set to the same direction, the direction of flow of the bit line write current for the data of the same logical level can be set to the same direction in MRAM macros RMCA and RMCB. Accordingly, in both MRAM macros RMCA and RMCB, an integrity can be maintained between the logical data (external write data) and the physical data (storage data of memory cell), and it is possible to eliminate the operation of inverting the logical level of the write or read data according to the arranged positions of the MRAM macros.

Consequently, it is not necessary to change the construction of the memory control circuit according to the magnetization direction of the fixed layer in a wafer process, and it is possible to suppress deterioration in flexibility of layout arrangement on a system on chip. Also, lowering of design efficiency can be suppressed.

In the above description, each of MRAM macros (RMCA and RMCB) includes interface circuit 5 and internal memory circuit MM. However, for the layout having the MRAM macros arranged mirror-symmetrically, the layout of only internal memory circuit MM registered as the library may be used.

In designing chips on the macro base by utilizing the registered libraries, an original layout and a mirror-inverted layout are registered as libraries and are used.

Second Embodiment

Figure 13:
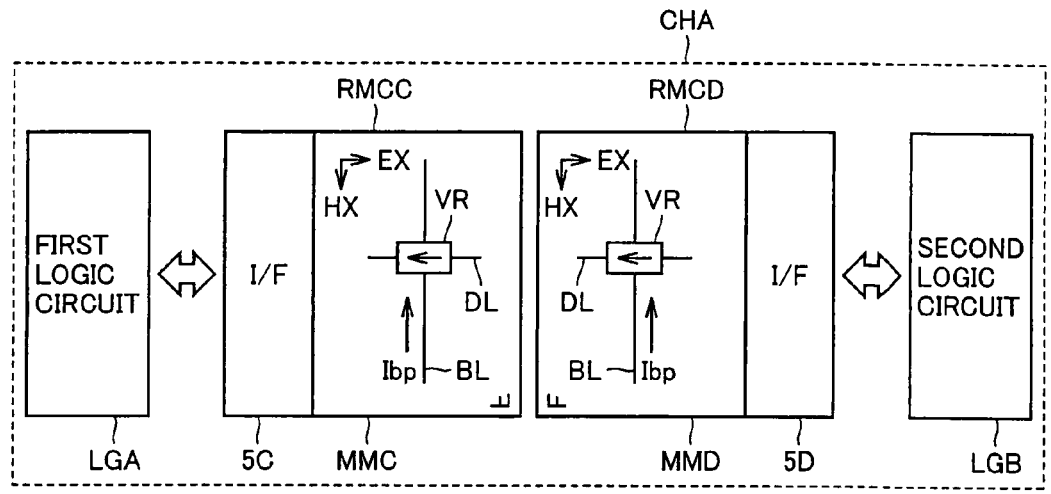
FIG. 13 schematically shows a structure of a semiconductor integrated circuit device according to a second embodiment of the invention.

FIG. 13 schematically shows a construction of a semiconductor integrated circuit device according to a second embodiment of the invention. In FIG. 13, the semiconductor integrated circuit device includes first and second logic circuits LGA and LGB arranged being spaced apart from each other on a semiconductor chip CHA. An MRAM macro RMCC faces to first logic circuit LGA, and an MRAM macro RMCD faces to second logic circuit LGB. MRAM macro RMCC has an internal memory circuit MMC and an interface circuit (I/F) 5C that arranged in a side portion near first logic circuit LGA. Likewise, MRAM macro RMCD has a memory circuit MMD and an interface circuit (I/F) SD that is arranged on the side near second logic circuit LGB.

First logic circuit LGA executes necessary processing by utilizing the storage data of MRAM macro RMCC. Second logic circuit LGB executes necessary processing by utilizing storage data of MRAM macro RMCD. Each of MRAM macro RMCC and RMCD includes magneto-resistance elements VR as storage units. Bit lines BL are arranged in the direction of the hard axis of magneto-resistance element VR, and digit lines DL are arranged extending in the direction of easy axis EX. As apparent from letters "F" in FIG. 13, in the above construction, MRAM macros RMCC and RMCD have mirror-symmetrical layouts with respect to an axis parallel to hard axis HX.

The semiconductor integrated circuit device shown in FIG. 13 implements an on-chip multiprocessor system having two logic circuits LGA and LGB.

In the arrangement of the semiconductor integrated circuit device shown in FIG. 13, MRAM macros RMCC and RMCD have the layouts symmetrical with respect to the axis parallel to hard axis HX. In both MRAM macros RMCC and RMCD, the fixed layers have the same magnetization direction independently of the directions of easy axes EX. In both MRAM macros RMCC and RMCD, therefore, the same relationship is achieved between the logical level of the write data and the magnetization direction of the free layer similarly to the first embodiment, and the integrity can be maintained between the logical data and the physical data (storage data).

The MRAM macros and logic circuits can be efficiently arranged on semiconductor chip CHA without a restriction on the application direction of the external magnetic field in a wafer process. Further, it is not necessary in each MRAM macro to arrange a data polarity changing circuit for maintaining the integrity of the logics between the logical data and the physical data so that control of data writing/reading can be easy.

Third Embodiment

For the memory macro used in a system including a logic and a memory integrated on the same chip in a mixed fashion, variations in storage capacity and data bit width are required depending on the system employing the memory macro and on the logic circuit connected thereto. For flexibly accommodating such variations, expansion or reduction of the storage capacity, switching of the bit width and others are usually performed based on one memory macro (library) having guaranteed performance.

Figure 14:
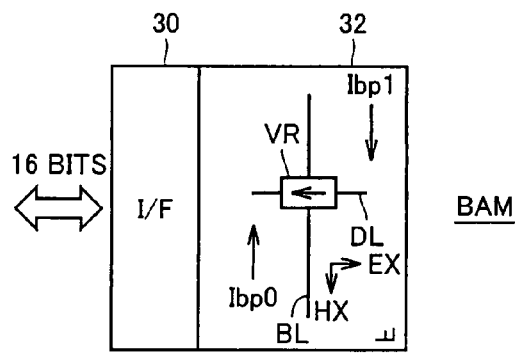
FIG. 14 schematically shows a structure of a basic macro of a magnetic memory device according to a third embodiment of the invention.

FIG. 14 shows, by way of example, a construction of a memory macro (basic macro) BAM of a basic construction used as a base. In FIG. 14, a basic macro BAM includes an interface circuit (I/F) 30 and an internal memory circuit 32. Memory circuit 32 has substantially the same construction as memory circuit MM in the first and second embodiments, although being different in storage capacity. Memory circuit 32 has a memory cell array including magneto-resistance elements VR arranged in rows and columns. FIG. 14 representatively shows one magneto-resistance element VR. Digit line DL extends in the direction of easy axis EX of magneto-resistance element VR, or in the direction crossing interface circuit 30. Bit line BL extends in the direction of hard axis HX.

Basic macro BAM shown in FIG. 14 performs input/output of external data of 16 bits. In writing data "0", bit line BL is supplied with a bit line write current Ibp0 flowing upward in FIG. 14. In writing data "1", a bit line write current Ibp1 flows downward in FIG. 14.

Figure 15:
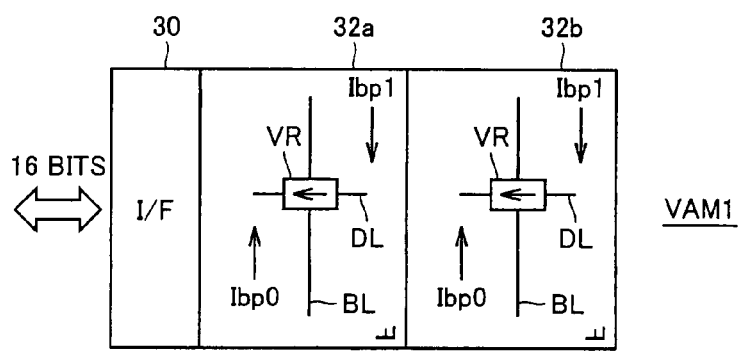
FIGS. 15, 16 and 17 schematically show expanded memory structures utilizing a basic macro shown in FIG. 14, respectively.

FIG. 15 shows, by way of example, a construction of a variation of a memory macro having a different storage capacity. In FIG. 15, a memory macro VAM1 of a first variation has interface circuit 30 and two internal circuits 32a and 32b. These internal circuits 32a and 32b have the same construction as memory circuit 32 in basic macro BAM, and internal circuits 32a and 32b have translated layouts (parallel displacement layouts) with each other. Internal circuits 32a and 32b may have the same construction as memory circuit 32 shown in FIG. 14, or may be configured to share an overlapping circuit portions between integrated circuits 32a and 32b.

In memory macro VAM1 shown in FIG. 15, internal circuits 32a and 32b have a layout subject to parallel displacement (translation), and are supplied with bit line write currents Ibp0 and Ibp1 in the same direction as bit line write current Ibp0 and Ibp1 in memory circuit 32 of basic macro BAM. Memory macro VAM1 shown in FIG. 15 has double the storage capacitance of memory macro BAM of the basic structure, and performs data input/output of 16 bits at a time.

Figure 16:
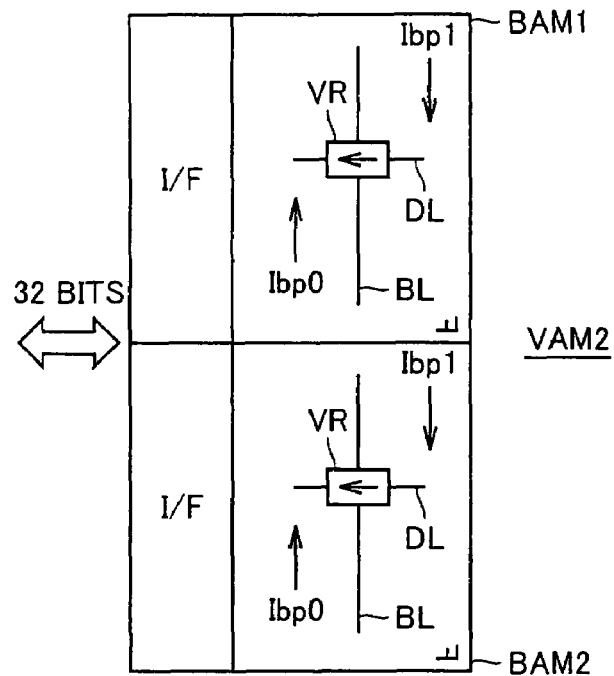

FIG. 16 schematically shows another example of the variation of the memory macro. A memory macro VAM2 shown in FIG. 16 has two basic macros BAM1 and BAM2 arranged in parallel. Basic macros BAM1 and BAM2 have the same construction as basic macro BAM shown in FIG. 14, and operate in parallel to perform input/output of 32-bit data. Basic macros BAM1 and BAM2 have layouts merely parallel-displaced with each other, and bit line write currents Ibp0 and Ibp1 flow through bit lines BL therein in the same direction.

In the variation shown in FIG. 16, memory macro VAM2 has double the storage capacity of basic macro BAM, and the number of storage words is equal to that of basic macro BAM shown in FIG. 14, and memory macro VAM2 performs input/output of 32-bit data.

Figure 17:
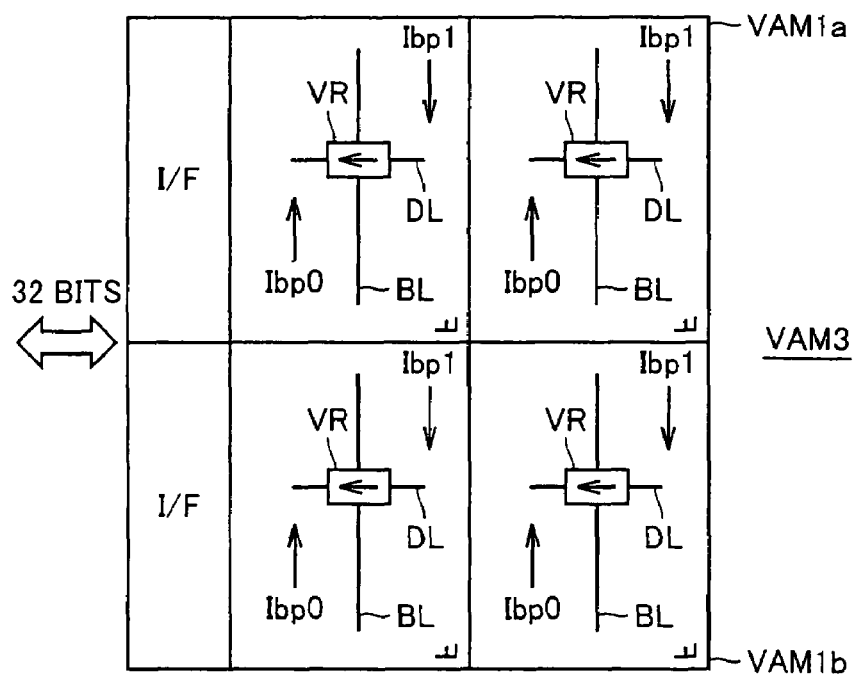

FIG. 17 shows a construction of further another variation of the memory macro. Referring to FIG. 17, a memory macro VAM3 is formed using memory macro VMA1 shown in FIG. 15 by two in number and includes two sub memory macros VAM1a and VAM1b. These sub memory macros VAM1a and VAM1b have layouts translated (parallel-displaced) from each other, and operate in parallel. Memory macro VAM3 performs input/output of 32-bit data. For memory macro VAM3 shown in FIG. 17, the storage capacity is four times as large as that of basic macro BAM, and the input/output bit width of data is twice as large as that of basic macro BAM.

Memory macros VAM1-VAM3 of various variations shown in FIGS. 15 to 17 are appropriately utilized depending on the system employing the memory macro(s) or the construction of the logic circuit connected thereto. The following description will be given on the case where memory macros of various variations are integrated on a common semiconductor chip to implement a system on chip.

Figure 18:
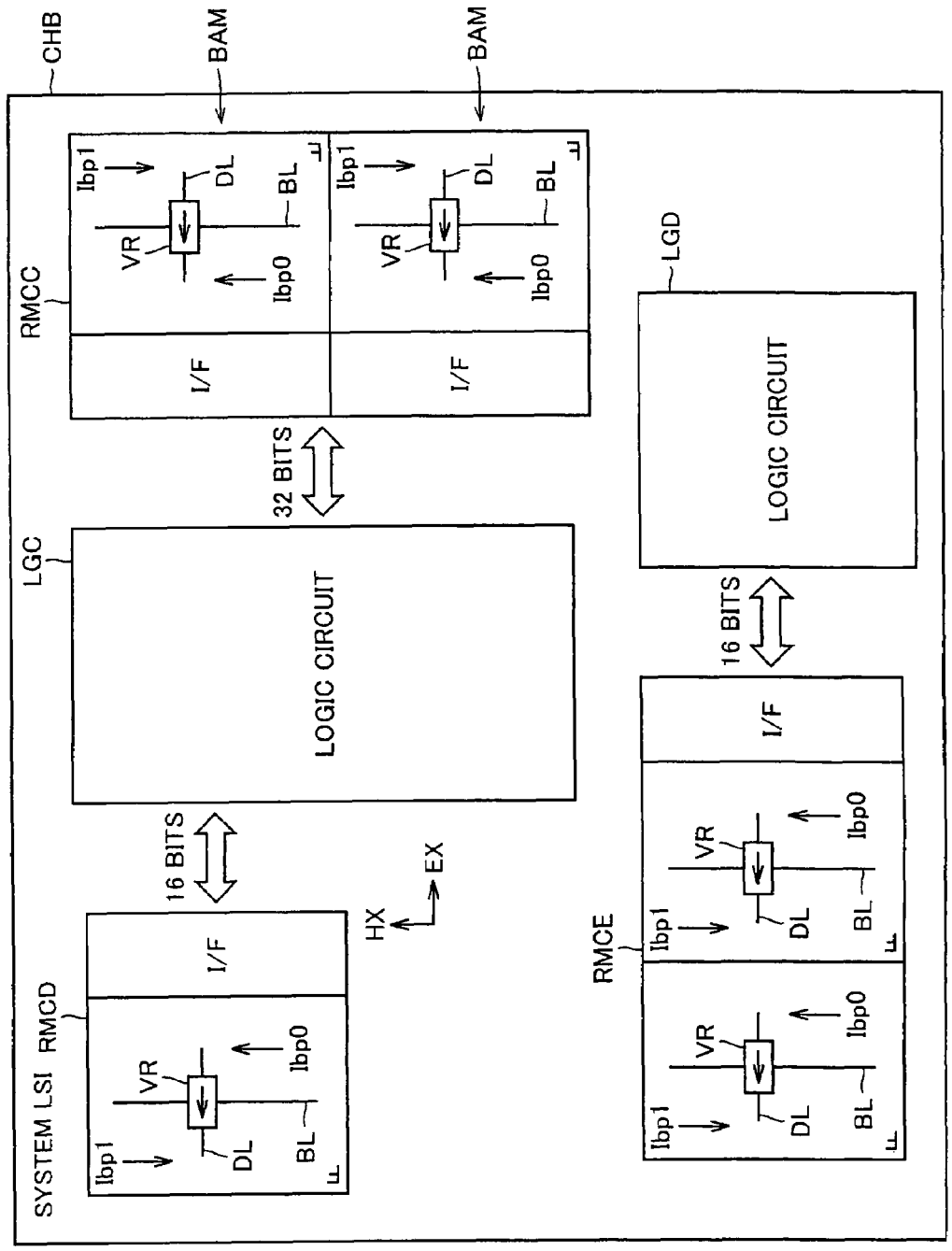
FIG. 18 schematically shows a structure according to a third embodiment of the invention.

FIG. 18 schematically shows a whole construction of the semiconductor integrated circuit device according to the third embodiment of the invention. Referring to FIG. 18, logic circuits LGC and LGD are arranged on a semiconductor chip CHB. Logic circuit LGC is coupled to MRAM macro RMCD via a 16-bit bus, and is coupled to MRAM macro RMCC via a 32-bit bus arranged on one side of the chip. Logic circuit LGD is coupled to an MRAM macro MCE via a 16-bit bus arranged on the other side of the chip.

MRAM macro RMCC is formed arranging two basic macros BAM shown in FIG. 14 in parallel. Magneto-resistance element VR has the easy axis perpendicular to bit line BL, and the fixed layer is magnetized in the direction of the easy axis, or in the direction indicated by an arrow in FIG. 18. It is assumed that in MRAM macro RMCC, integrity is maintained between the write data and the read data. Under this assumption, MRAM macro RMCD has a layout obtained through mirror-inversion of the layout of basic macro BAM shown in FIG. 14 with respect to the axis parallel to hard axis HX. An MRAM macro RMCE provided for logic circuit LGD is also formed based on a block having a layout arranged mirror-symmetrically to basic macro BAM shown in FIG. 14 with respect to the axis parallel to the hard axis. Therefore, MRAM macro RMCE has a layout mirror-symmetrical to that of memory macro VAM1 shown in FIG. 15 with respect to the axis parallel to hard axis HX. Through the above mirror-inverting operation, even in the case where the interface circuit (I/F) is located in the position opposite to that of the interface circuit in the basic macro, MRAM macros RMCD and RMCE can cause bit line write currents Ibp1 and Ibp0 to flow in the same direction as bit line write current Ibp0 and Ibp1 in MRAM macro RMCC, and can maintain the integrity of the logical levels between the write data and the read data. Therefore, the integrity between the logical data and physical data (storage data) can be maintained in this system LSI (system on chip).

In this system LSI, the relationship in logical level between the logical data and physical data can be the same in all the memory macros on semiconductor chip CHB. Therefore, such a state can be prevented from occurring that different relationships in logical level are present among the memory macros.

If the logical levels of the logical data and physical data do not match with each other in basic macro BAM, the relationships in logical level between the logical data and physical data are non-coincident relation in all the memory macros on semiconductor chip CHB. Therefore, if such state is detected in a test stage, the following countermeasure is employed to achieve the matching between the logic levels of the logical data and the logic levels of the physical data in the semiconductor integrated circuit: the direction of the external magnetic field applied in the process is changed; logic circuits LGC and LGD are configured to invert the logical level of either write data or read data; and memory macros MCC, MCD and MCE have the interface circuits (I/F) converting the logical level of either write data or read data. Pending that the memory macros arranged on semiconductor chip CHB have the easy axes in the same direction and the hard axes in the same direction, restrictions on the layout positions of the memory macros are mitigated, and the memory macros can be efficiently arranged on semiconductor chip CHB when designing the system LSI (system on chip).

[Modification]

Figure 19:
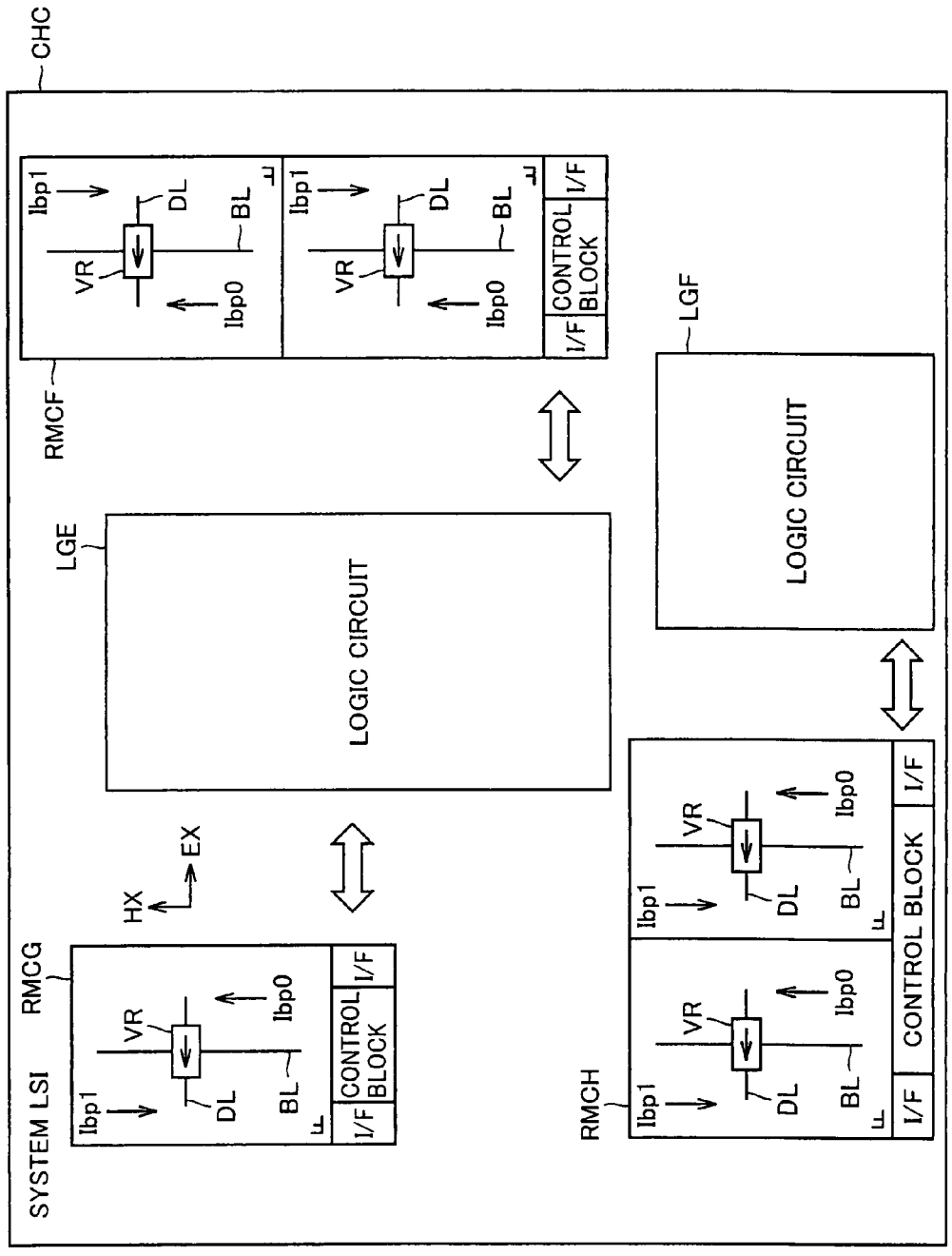
FIG. 19 schematically shows a structure of a modification of the third embodiment according to the invention.

FIG. 19 shows a construction of a semiconductor integrated circuit device of a modification of the third embodiment according to the invention. The semiconductor integrated circuit device shown in FIG. 19 includes logic circuits LGE and LGF arranged on a semiconductor chip CHC. MRAM macros RMCG and RMCF are arranged on the opposite sides of logic circuit LGE, respectively and MRAM macro RMCH is arranged on one side of logic circuit LGF. MRAM macro RMCF has a layout obtained by parallel displacement of MRAM macro RMCG. MRAM macro RMCG includes at an end side region (peripheral region) perpendicular to a side facing to corresponding logic circuit LGE, a control block including a peripheral control circuit controlling an internal memory access operation and interface circuit (I/F) regions having interface circuits located on both opposite sides of the control block for interface with logic circuit LGE formed therein. In this MRAM macro RMCG, data and signals are transferred through the interface circuit arranged closer to logic circuit LGE. The memory circuit has the same layout between MRAM macro RMCD in FIG. 18 and MRAM macro RMCG. Bit line BL conducting the write current arranged extending along hard axis HX.

An MRAM macro RMCF includes two memory circuits, and has the interface circuits (I/F) arranged in the same positions as in MRAM macro RMCG. In MRAM macro RMCF, there are provided, at an end side region perpendicular to a side facing to corresponding logic circuit LGE, a control block including a peripheral control circuit controlling memory access and others as well as interface circuit (I/F) regions located on the respective opposite sides of the control block. In this MRAM macro RMCF, data and signals are transferred through the use of the interface circuit closer to corresponding logic circuit LGE.

A MRAM macro RMCH includes interface circuits (I/F) in the same positions as in MRAM macro RMCG. More specifically, a control block is arranged in an end side region perpendicular to a side facing to corresponding logic circuit LGF, and the interface circuit (I/F) regions are arranged on the opposite sides of the control block, respectively. In this MRAM macro RMCH, the data and signals are likewise transferred through the using of the interface circuit closer to corresponding logic circuit LGF.

Therefore, MRAM macros RMCG, RMCF and RMCH include the memory circuits having layouts obtained through parallel displacement. In these MRAM macros RMCG, RMCF and RMCH, the magnetization directions of the fixed and free layers in all the magneto-resistance elements can establish the same relationship with respect to the logical level of the write data.

As shown in FIG. 19, the macro having the interface circuits (I/F) and the control block located in the end side region facing to a corresponding logic circuit is used as a basic macro. Accordingly, it is not necessary to arrange the internal memory circuit in a mirror-symmetrical layout depending on the position of the logic circuit. Further, even in the case of parallel displacement, one of the interface circuit (I/F) regions on the opposite sides of the control block on the end side region is used depending on the positional relation to the corresponding logic circuit, the integrity between the write and read data can be maintained and the data access time from the corresponding logic circuit can be made uniform.

Even in the case where the interface circuit (I/F) is located in the lower end side of the corresponding MRAM macro, a mirror-inverting operation of the layout of the internal memory circuit is not required owing to the arrangement of the interface circuit regions on the opposite sides of the control block, and it is not necessary to prepare basic macros having the interface circuits in different positions, to improve the design efficiency.

The layout of the memory circuit is obtained merely by parallel displacement, and bit line write currents Ibp0 and Ibp1 flow in the same direction through bit lines BL in all MRAM macros RMCF, RMCG and RMCH. Also, the magnetization directions of the fixed layers are uniform to be parallel to the easy axis EX. Therefore, the logical levels of the write and read data can match with each other in all the memory macros. Further, the restrictions on layout of the interface circuit can be reduced in connection with the arrangement position of the memory macros on semiconductor chip CH so that a system LSI can be efficiently designed using MRAM macros.

Fourth Embodiment

Figure 20:
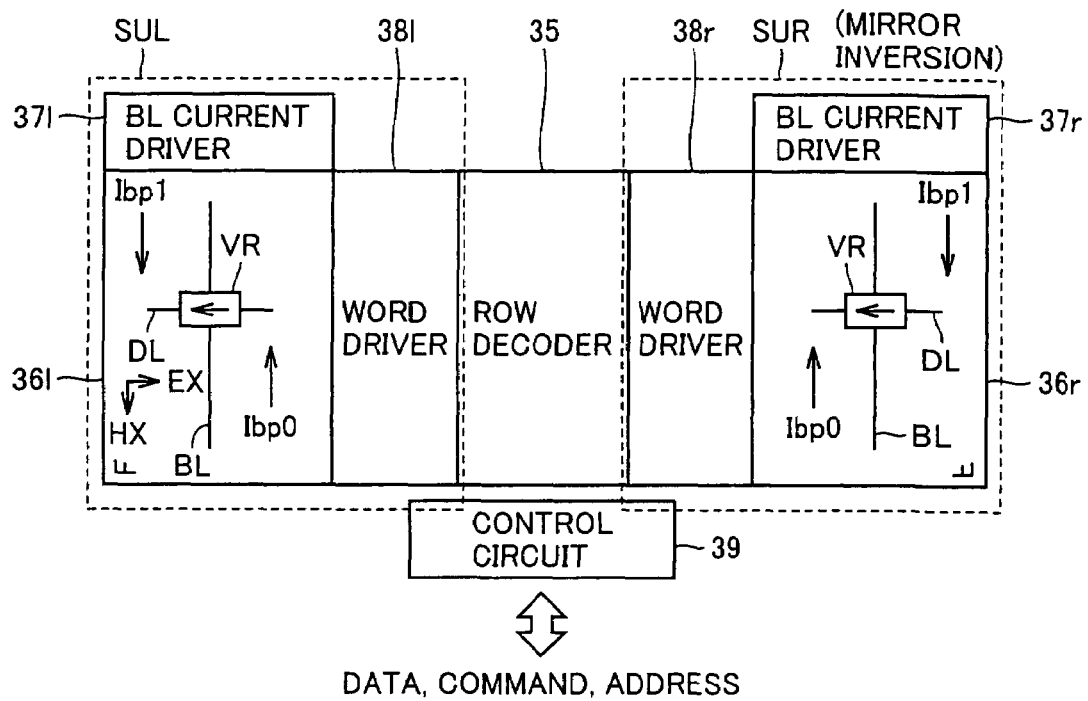
FIG. 20 schematically shows a structure of a magnetic memory device according to a fourth embodiment of the invention.

FIG. 20 schematically shows a whole construction of a magnetic memory device according to a fourth embodiment of the invention. In FIG. 20, the magnetic memory device includes sub-array units SUL and SUR arranged on the opposite sides of a row decoder, respectively, and a control circuit 39 producing internal write data, internal operation control signals and internal address signals according to externally applied command, address and data.

Sub-array unit SUL includes a memory cell array 36*l* having memory cells arranged in rows and columns, a bit line (BL) current driver 37*l* for supplying a write current to a bit line BL, and a word driver 38*l* for driving a word line (not shown) to a selected state in a data read. In memory cell array 36*l*, a magneto-resistance element VR is representatively shown. This magneto-resistance element VR has a rectangular form having a long side parallel to easy axis EX and a short side parallel to hard axis HX. Bit line BL is arranged extending along hard axis HX. Digit line DL is arranged extending along the long side of magneto-resistance element VR, or along the easy axis.

Likewise, sub-array unit SUR includes a memory cell array 36*r*, a bit line (BL) current driver 37*r* and a word driver 38*r*.

Sub-array units SUL and SUR have layouts mirror-symmetric through mirror-inversion with respect to an axis parallel to hard axis HX. Sub-array units SUL and SUR share a row decoder 35 to reduce a chip area of this magnetic memory device.

Although sub-array units SUL and SUR include digit line drive circuits for driving the digit line as well as bit line write current control circuits for controlling the bit line write currents, these circuits are not shown in FIG. 20 for the simplicity purpose.

Magneto-resistance elements VR in sub-array units SUR and SUL have the same structure, and FIG. 20 shows a state in which the fixed layer is magnetized leftward.

As shown in FIG. 20, a shared circuit portion (row decoder 35) is arranged along the hard axis direction, and sub-array units SUL and SUR are arranged into mirror-symmetrical layout with this shared circuit portion (row decoder 35) being a symmetric axis. Also, bit line BL is arranged extending along hard axis HX. In sub-array units SUL and SUR, bit line write currents Ibp1 and Ibp0 flow in the same directions when writing data "1" and "0", respectively, and the correspondence relationship in logical level between the write data and read data can be coincident in sub-array units SUL and SUR independently of the magnetization direction of the fixed layers. Control circuit 39 is, therefore, not required to convert the logical level of the write or read data according to a selected sub-array unit.

[Modification]

Figure 21:
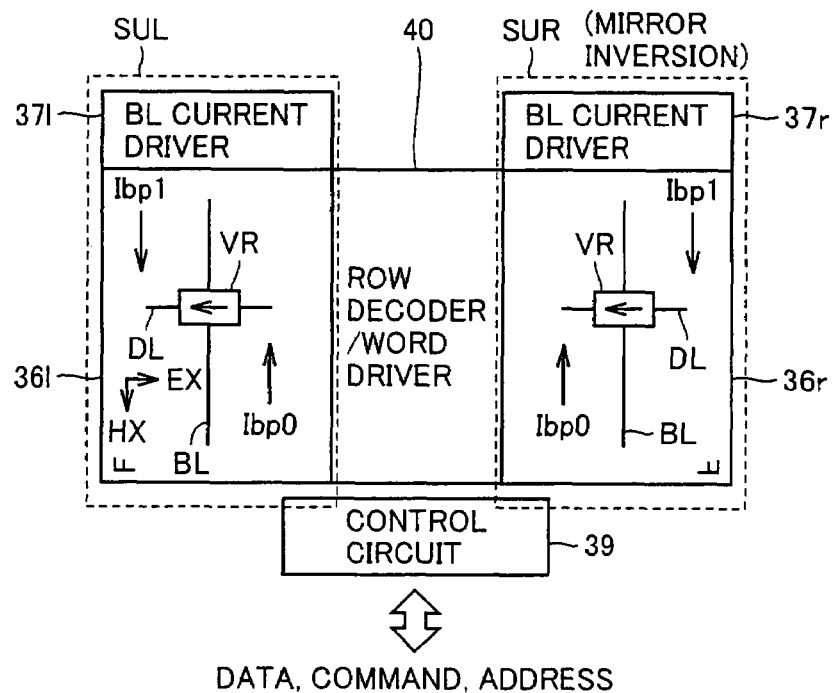
FIG. 21 schematically shows a modification of the magnetic memory device according to the fourth embodiment of the invention.

FIG. 21 schematically shows a structure of a modification of the fourth embodiment of the invention. A magnetic memory device shown in FIG. 21 includes a row-decoder/word-driver circuit 40 shared between sub-array units SUL and SUR. Sub-array units SUL and SUR have layouts mirror-symmetrical through mirror-inversion with respect to row-decoder/word-driver circuit 40. Other constructions in the magnetic memory device shown in FIG. 21 are the same as those in the magnetic memory device shown in FIG. 20, and the corresponding portions are allotted with the same reference numerals, and description thereof will not be repeated.

In the construction of the magnetic memory device shown in FIG. 21, sub-array units SUL and SUR have the layouts mirror-symmetrical with respect to the axis parallel to hard axis HX of magneto-resistance element VR. Specifically, the layout of sub-array unit SUR can be obtained by mirror-inversion of the layout of sub-array unit SUL with respect to row-decoder/word-drive circuit 40 arranged in the direction of hard axis HX. In these sub-array units SUL and SUR, therefore, the correspondence relationship between bit line write currents Ibp1 and Ibp0 and the write data can be the same and the correspondence relationship between the write and read data can be the same, as in the magnetic memory device shown in FIG. 20.

Since sub-array units SUL and SUR also share the word driver, the array area can be reduced.

FIG. 21 does not explicitly show the digit line driver for driving the digit line in the magnetic memory device. Sub-array units SUL and SUR may likewise share this digit line driver, and accordingly may share the circuitry related to selection of a memory cell row. It is merely required to satisfy such conditions that, in sub-array units SUL and SUR, the circuitry for supplying the write currents to the bit lines in the data writing are formed to have the layouts mirror-symmetrical with respect to an axis parallel to hard axis HX.

Fifth Embodiment

Figure 22:
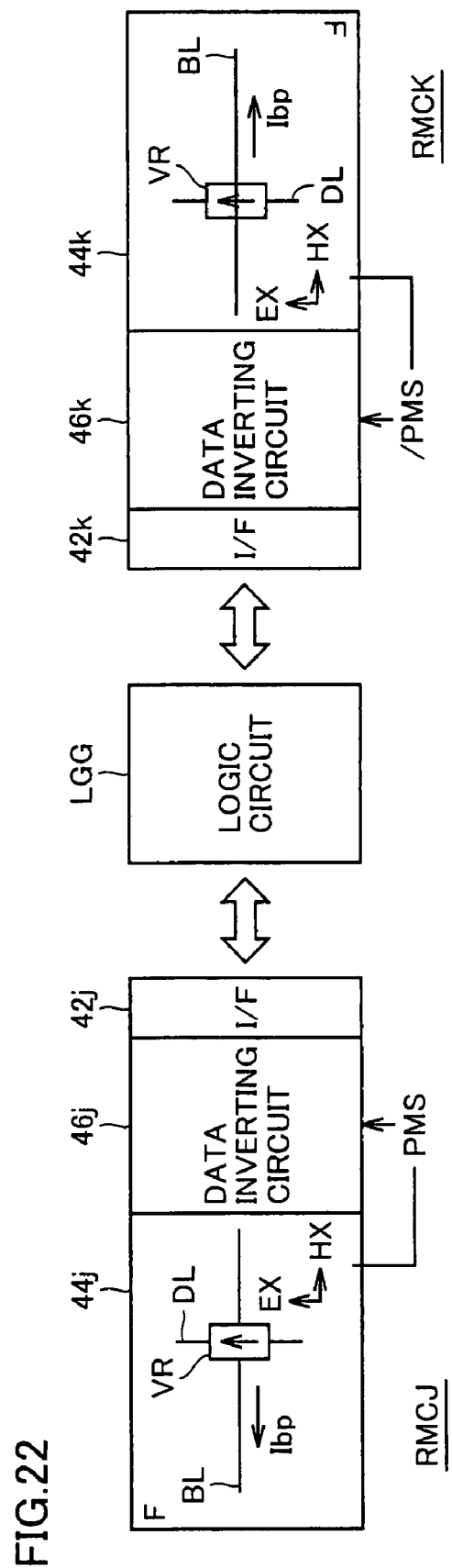
FIG. 22 schematically shows a structure of a semiconductor integrated circuit device according to a fifth embodiment of the invention.

FIG. 22 schematically shows a construction of a semiconductor integrated circuit device according to a fifth embodiment of the invention. Referring to FIG. 22, the semiconductor integrated circuit device includes a logic circuit LGG and MRAM macros RMCJ and RMCK arranged on the opposite sides of logic circuit LGG. These logic circuit LGG and MRAM macros RMCJ and RMCK are integrated on the same semiconductor chip.

MRAM macro RMCJ includes an interface circuit (I/F) 42*j* arranged at a side closer to logic circuit LGG, an internal memory circuit 44*j* and a data inverting circuit 46*j* selectively inverting the logical level of the write or read data for the memory cells included in internal memory circuit 44*j* according to a data inversion control signal PMS. Likewise, MRAM macro RMCK includes an interface circuit 42*k*, an internal memory circuit 44*k* and a data inverting circuit 46*k*. Data inverting circuit 46*k* receives a data inversion control signal /PMS. When one of MRAM macros RMCJ and RMCK performs a data inverting operation, the other does not perform the data inverting operation.

As indicated by the letters "F", MRAM macros RMCJ and RMCK have layouts point-symmetrical with respect to logic circuit LGG. Specifically, with MRAM macro RMCJ being a basic macro, the layout of MRAM macro RMCK is obtained by rotating the layout of MRAM macro RMCJ 180 degrees. In the memory cell array, bit line BL is arranged in a direction crossing interface circuit 42 (42*j* or 42*k*), and digit line DL is arranged perpendicularly to bit line BL. Magneto-resistance element VR has a long side along easy axis HX and a short side along hard axis HX. Bit line BL extends along hard axis HX.

According to the construction of the semiconductor integrated circuit device shown in FIG. 22, internal circuits in MRAM macro RMCJ are arranged in reversed positions to those in MRAM macro RMCK with respect to the row and column directions. Therefore, positions of bit line current drivers are in the interchanged relationship between MRAM macro RMCJ and MRAM macro RMCK. MRAM macros RMCJ and RMCK have the internal circuits of the same constructions. Consequently, when bit line BL is supplied with the bit line write current, if bit line write current Ibp flows in the direction away from interface circuit 42*j* in MRAM macro RMCJ, MRAM macro RMCK has bit line write current Ibp flowing away from interface circuit 42*k*. In magneto-resistance element VR, the magnetization direction of the fixed layer is set parallel to easy axis EX by application of the external magnetic field, and the fixed layers in MRAM macros RMCJ and RMCK have the same magnetization direction. This results in such a state that the correspondence relationship between the write data and storage data, i.e., between the logical data and physical data in MRAM macro RMCJ is different from that in MRAM macro RMCK.

Figure 23:
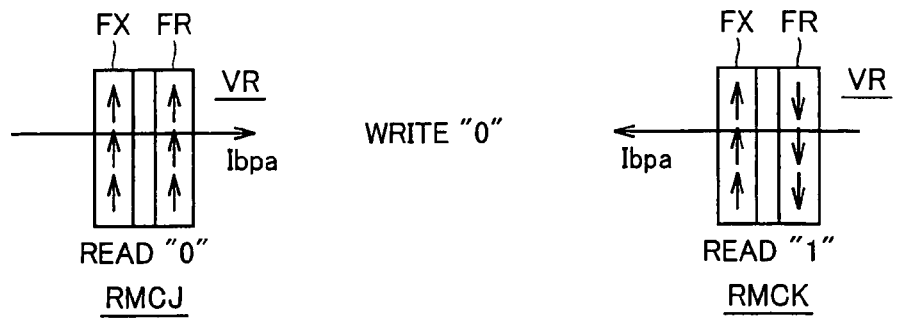
FIGS. 23 and 24 each schematically show a relationship between write data and storage data of a magnetic memory macro in the semiconductor integrated circuit device shown in FIG. 22.

Specifically, it is now assumed that data "0" is to be written as shown in FIG. 23. It is also assumed that a bit line write current Ibpa flows rightward in FIG. 23 in MRAM macro RMCJ. In this case, a magnetic field in an upward direction in FIG. 23 is applied to free layer FR, and the magnetization directions of fixed and free layers are parallel to each other. In MRAM macro RMCK, bit line write current Ibpa flows toward interface circuit 42*k*. In MRAM macro RMCK, a downward magnetic field is applied to magneto-resistance element VR, and the magnetization directions of fixed and free layers are anti-parallel to each other. In this case, both write and read data in MRAM macro RMCJ are at the logical level of "0". In MRAM macro RMCK, magneto-resistance element VR is in a high resistance state, and stores data "1", and data "1" is read out.

Figure 24:
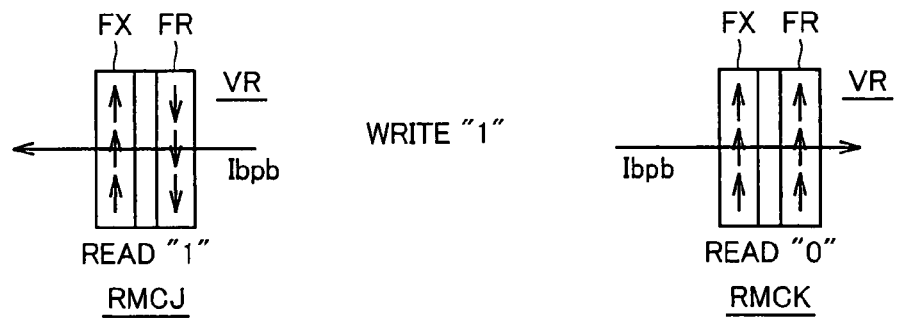

In writing data "1", as shown in FIG. 24, a bit line write current Ibpb in MRAM macro RMCJ flows away from interface circuit 42*j* (leftward in FIG. 24), and free layer FR is magnetized downward so that fixed and free layers FX and FR are magnetized in anti-parallel directions, and data "1" is stored. In MRAM macro RMCK, bit line write current Ibpb flows away from interface circuit 42*j*, and an upward magnetic field is applied to free layer FR so that fixed and free layers FX and FR are magnetized in the parallel direction, and data "0" is stored.

In MRAM macro RMCJ, therefore, the write data and the read data are always of the same logical level. In MRAM macro RMCK, the write data is always opposite in logical level to the read data. For overcoming the mismatching in logical level between the logical data and physical data in MRAM macro RMCK, data inverting circuit 46*k* inverts the logical level of either of the write data and the read data according to data inversion control signal /PMS. Thereby, the logical levels of the write and read data match with each other in an external region, and the integrity in logical level between the logical and physical data are maintained.

Conversely, if fixed layer FX is magnetized in the downward direction, mismatching in logical level between the write and read data occurs in MRAM macro RMCJ, and matching in logical level between the write and read data occurs in MRAM macro RMCK. In this case, data inverting circuit 46$j$ inverts the logical level of one of the write and read data according to data inversion control signal PMS.

Therefore, even if MRAM macros RMCJ ad RMCK are arranged without taking the magnetization direction of fixed layer FX into account, logic circuit LGG can always perform accurate writing/reading of the data. Thus, in the designing stage, it is not necessary to consider the magnetization direction of the fixed layer, so that the design efficiency can be improved. MRAM macros RMCJ and RMCK have the same layouts, and therefore can be produced by utilizing one MRAM macro registered as a library. Accordingly, it is not necessary to produce a macro having a mirror-symmetrical layout through the mirror-inverting operation, and the design efficiency is further improved.

Figure 25:
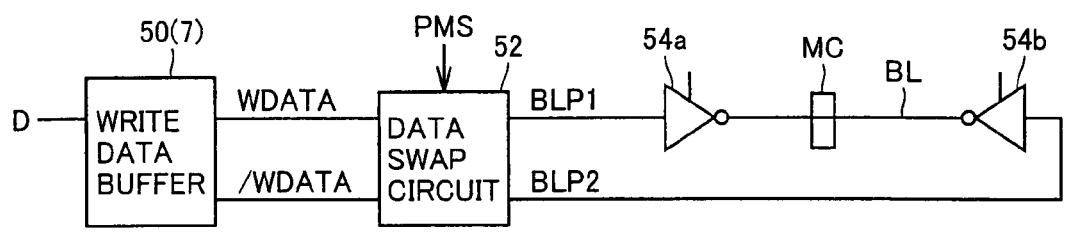
FIG. 25 shows, by way of example, a structure of a data inverting circuit shown in FIG. 24.

FIG. 25 schematically shows a construction of data inverting circuits 46$j$ and 46$k$ shown in FIG. 22. Since data inverting circuits 46$j$ and 46$k$ have the same construction, FIG. 25 shows data an inverting circuit 46 representing data inverting circuits 46$j$ and 46$k$.

In FIG. 25, data inverting circuit 46 includes a write data buffer 50 receiving externally applied write data D, and producing complementary write data WDATA and /WDATA, and a data swap circuit 52 for producing write control signals BLP1 and BLP2 by exchanging the transmission paths of internal write data WDATA and /WDATA according to data inversion control signal PMS.

Bit line write current control circuits 54$a$ and 54$b$ are arranged on the opposite sides of bit line BL. Bit line write current control circuits 54$a$ and 54$b$ include the bit line current drivers, and supply the write current to bit line BL according to the respective write control signals BLP1 and BLP2 as well as a column select signal (not shown). Write control signals BLP1 and BLP2 correspond to internal write data WDATA and /WDATA, and are complementary to each other. One of bit line write current control circuits 54$a$ and 54$b$ sources the current to bit line BL, and the other sinks the current from bit line BL. Therefore, the write current flows through bit line BL in the direction corresponding to the logical levels of write control signals BLP1 and BLP2.

Write data buffer 50 corresponds to write data buffer 7 shown in FIG. 7.

Figure 26:
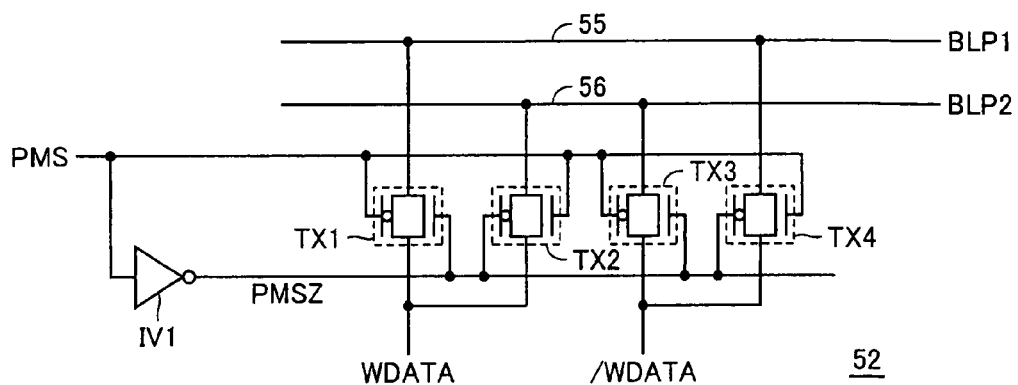
FIG. 26 shows, by way of example, a data swap circuit shown in FIG. 25.

FIG. 26 shows, by way of example, a configuration of data swap circuit 52 shown in FIG. 25. Data swap circuit 52 includes an inverter IV1 receiving data inversion control signal PMS to producing a complementary data inversion control signal PMSZ, and CMOS transmission gates TX1-TX4 for exchanging the transmission paths of internal write data WDATA and /WDATA according to complementary data inversion control signals PMS and PMSZ.

CMOS transmission gates TX1 and TX3 turn conductive when data inversion control signal PMS is at an L level (logical low level), to transmit internal write data WDATA and /WDATA to write control signal lines 55 and 56, respectively. Write control line 55 transmits write control signal BLP1, and write control line 56 transmits write control signal BLP2.

CMOS transmission gates TX2 and TX4 turn conductive when data inversion control signal PMS is at an H level (logical high level), to transmit internal write data WDATA and /WDATA to write control signal lines 56 and 55, respectively.

When data inversion control signal PMS is at the L level, therefore, write control signals BLP1 and BLP2 are correlated with internal write data WDATA and /WDATA, respectively. When data inversion control signal PMS is at the H level, write control signals BLP1 and BLP2 are correlated with internal write data /WDATA and WDATA, respectively. By fixedly performing inversion/non-inversion of the logical level of write data according to data inversion control signal PMS, it is possible to match externally applied write data D with the logical level of storage data of memory cell MC.

Figure 27:
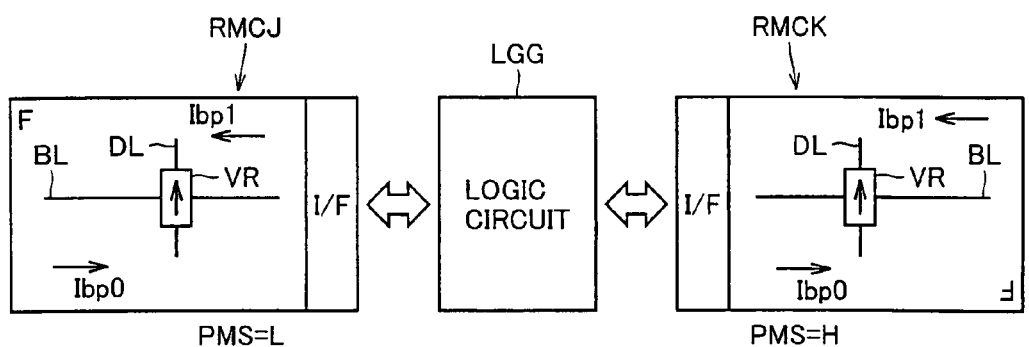
FIG. 27 shows a direction of the bit line write current flowing in a data write operation of a semiconductor integrated circuit device according to a fifth embodiment of the invention.

FIG. 27 illustrates a relationship between the bit line write current and the logical level of the data inversion control signal. It is assumed here that data inversion control signal PMS in the default state is at the L level, MRAM macro RMCJ is used as a basic macro, and MRAM macro RMCK is formed by rotating the layout of MRAM macro RMCJ 180 degrees for making the layout and the interconnections. It is now also assumed that the fixed layer in magneto-resistance element VR is magnetized upward as indicated by an arrow in FIG. 27. In MRAM macro RMCJ, bit line write currents Ibp1 and Ibp0 flow according to data "1" and "0", respectively. In MRAM macro RMCJ, bit line write current Ibp1 flows through bit line BL away from the interface circuit (I/F), and bit line write current Ibp0 flows through bit line BL toward the interface circuit (I/F). In this case, the free layer in magneto-resistance element VR is magnetized downward when data "1" is written, and is magnetized upward when data "0" is written. In MRAM macro RMCJ, the logical levels of the write data and the read data match with each other, and data inversion control signal PMS is maintained at the L level.

In this state, it is necessary in MRAM macro RMCK to reverse the direction of flow of the bit line write current, and therefore, data inversion control signal PMS is set to the H level. In this case, when data "1" is written, bit line BL is supplied with current Ibp1 flowing toward the interface circuit (I/F). When data "0" is written, bit line BL is supplied with bit line write current Ibp0 flowing away from the interface circuit (I/F). Thereby, it is possible in MRAM macro RMCK to match the logical levels of write and read data with each other, and the integrity can be maintained between the logical data and the physical data.

Conversely, if MRAM macro RMCJ is used as the basic macro and the external magnetic field is applied in the different direction to magnetize the fixed layer in magneto-resistance element VR downward in FIG. 27, data inversion control signal PMS is set to the H level in MRAM macro RMCJ, and is set to L level in MRAM macro RMCK. Therefore, with only the layout of a basic macro, the MRAM macros can be arranged on the opposite sides of logic circuit LGG to implement a system on chip without taking into account the magnetization direction of the fixed layer, i.e., the application direction of the external magnetic field in a wafer process.

Figure 28:
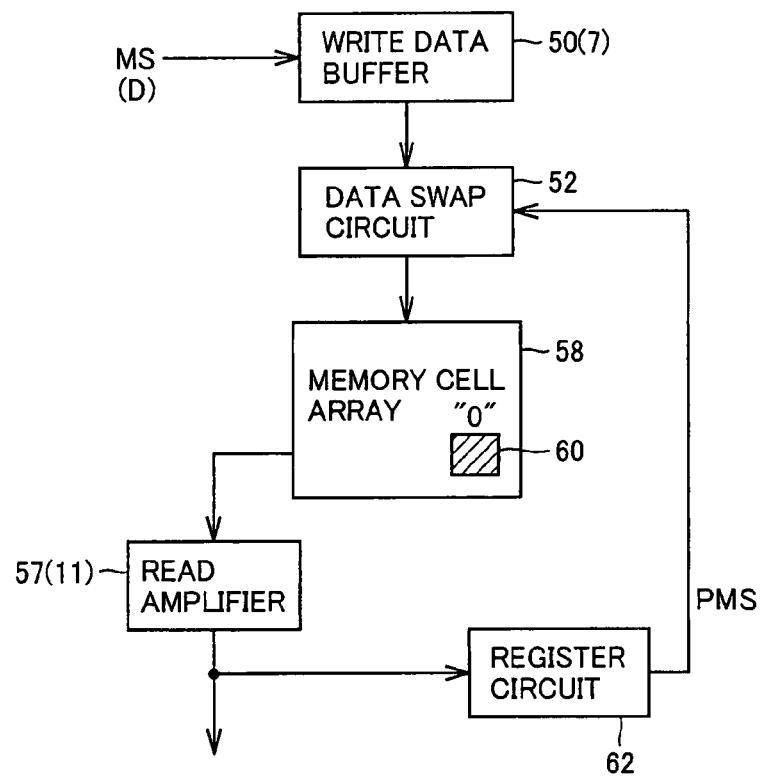
FIG. 28 schematically shows a modification of the fifth embodiment according to the invention.

FIG. 28 shows an example of a construction of a portion for generating data inversion control signal PMS. Referring to FIG. 28, data for generating data inversion control signal PMS is stored in a memory cell 60 located in a specific address region of a memory cell array 58. FIG. 28 shows, by way of example, a state in which data "0" of the default is stored in memory cell 60 at the specific address. The storage data of memory cell 60 is supplied to a register circuit 62 via a read amplifier 57 (corresponding to read amplifier 11 in FIG. 7) to be stored therein. Register circuit 62 produces data inversion control signal PMS to be applied to data swap circuit 52.

In a test step, identification data MS is externally supplied to write data buffer 50 (corresponding to write data buffer 7 in FIG. 7) as the storage data in memory cell 60. For test data MS, data ("0") of the default value is applied. Thereby, data "0" is stored as the identification data in memory cells 60 having characteristics the same as the magnetization characteristics of the magneto-resistance elements of the memory cells in memory cell array 58. If the logical level of logical data does not match with that of the physical data in memory cell array 58, data read from memory cell 60 via read amplifier 57 attains logic "1", and register circuit 62 stores data "1". Accordingly, data inversion control signal PMS is set to the H level, and data swap circuit 52 performs the swapping of complementary write data received from write data buffer 50.

If the logical level of logical data matches with that of the physical data in memory cell array 58, data "0" is read via read amplifier 57 from memory cell 60. Accordingly, data inversion control signal PMS applied from register circuit 62 is set to the L level, and data swap circuit 52 does not swap the write data.

All the fixed layers in the memory cells arranged in memory cell array 58 have the same magnetization direction. Memory cell 60 has the same magnetization characteristics as the other memory cells in memory cell array 58, and the logical level of data inversion control signal PMS can be reliably set in this MRAM macro depending on whether mismatching in logical level occurs between the logical and physical data.

The writing of data into memory cell 60 is performed first in the test step subsequent to the completion of the processes, and thereafter data writing into memory cell 60 is not performed. Therefore, by using an address in the address region that is not used in the practical use, for the address of memory cell 60, the write data can be internally inverted depending on the correspondence relationship in logical level between the physical and logical data. In this case, however, in order to set data inversion control signal PMS provided from register circuit 62, and it is always necessary in an initializing sequence upon setting up of the system to read the data in memory cell 60 for storage in register circuit 62.

Figure 29:
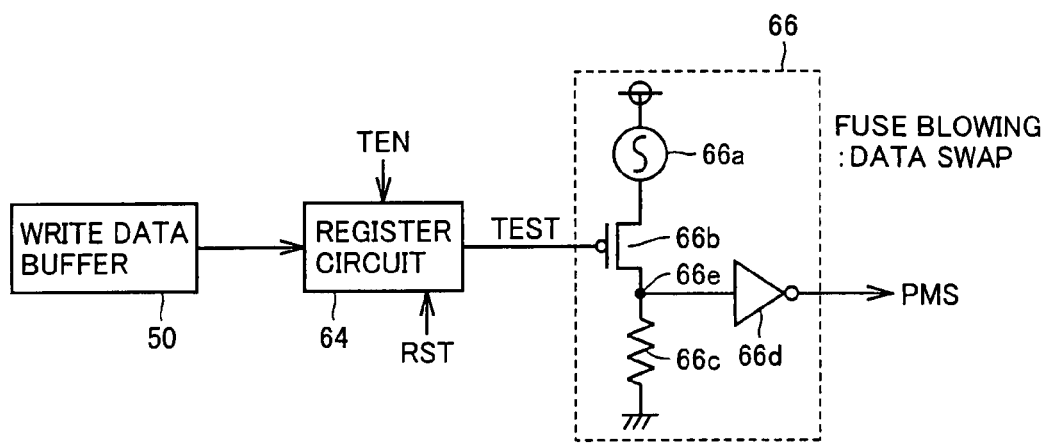
FIG. 29 shows, by way of example, a construction for generating a data inversion control signal shown in FIG. 22.

FIG. 29 shows another construction of a portion for generating data inversion control signal PMS. In FIG. 29, the data inversion control signal generator includes a register circuit 64 for storing the write data received from write data buffer 50 when a test mode activating signal TEN is active, and an inversion control data program circuit 66 for producing data inversion control signal PMS according to a mode control signal TEST applied from register circuit 64 in a test mode of operation, and for setting the logical level of data inversion control signal PMS according to the state of an internal fuse element in the normal operation mode.

Register circuit 64 has the mode control signal TEST set to the L level according to a reset signal RST.

Inversion control data program circuit 66 includes a fusible link element 66a coupled to a power supply node, a P-channel MOS transistor 66b connected between the link element 66a and an internal node 66e, and receiving mode control signal TEST on its gate, a resistance element 66c of a high resistance connected between internal node 66e and ground node, and an inverter 66d for producing data inversion control signal PMS according to a voltage level on internal node 66e.

Link element 66a is in a conductive state upon completion of the manufacturing process, and is selectively blown off according to the magnetization characteristics of the corresponding memory cells. Specifically, link element 66a is blown off when the logical level of externally applied write data does not match with the logical level of the internal read data.

Figure 30:
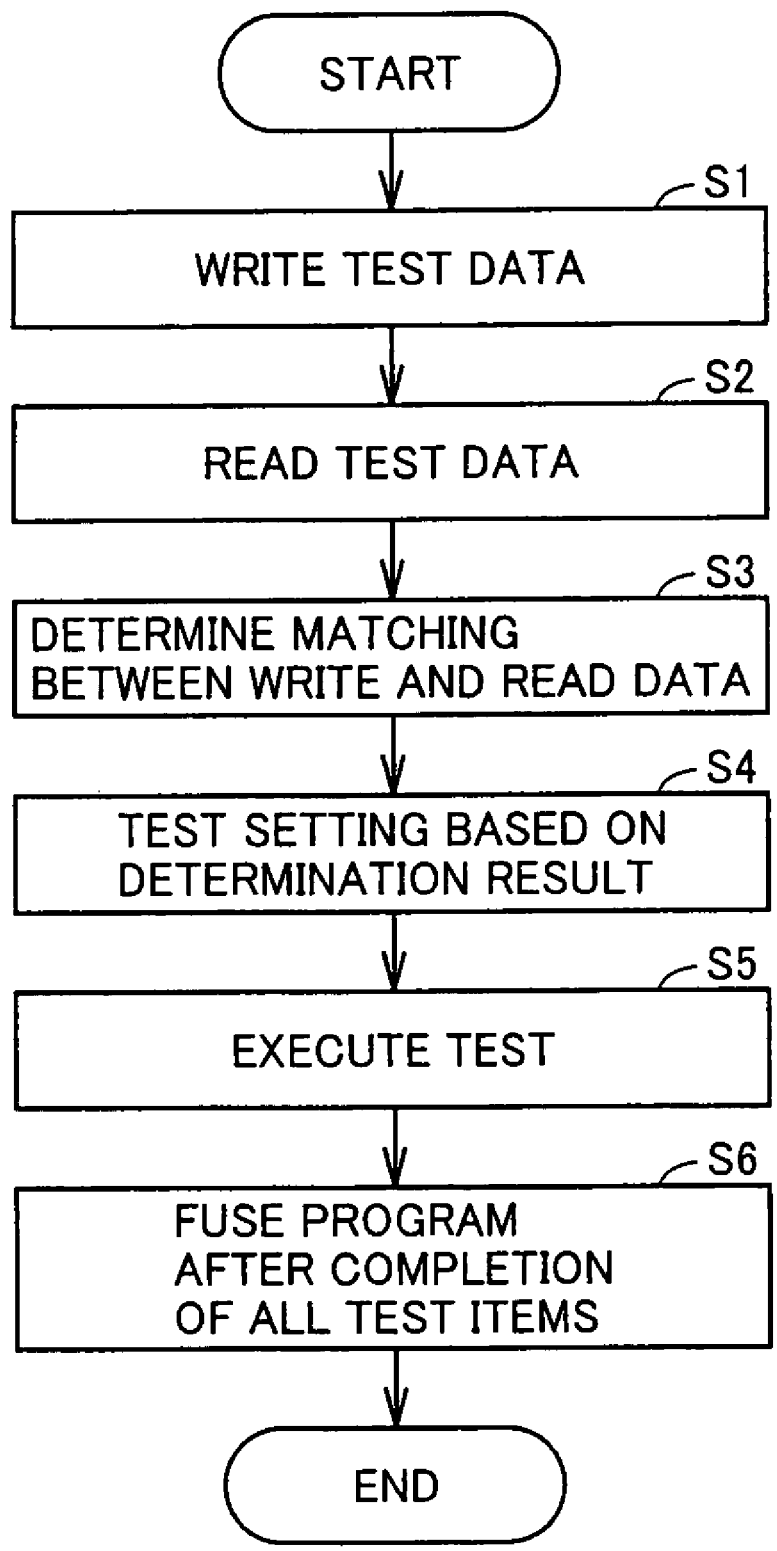
FIG. 30 is a flowchart representing an operation of a data inversion control signal generating section shown in FIG. 29.

FIG. 30 is a flowchart representing a program operation of the data inversion control signal generator shown in FIG. 29. Referring to FIG. 30, description will now be made on the data inversion control signal generator shown in FIG. 29.

In a test step, test data is first written at an arbitrary address in the memory cell array (step S1). The test data is read from the memory cell storing the written data (step S2). Determination is made on whether the logical level of the write data matches with that of the read data (step S3). In the test operations from step S1 to step S3, link element 66a is in a conductive state, mode control signal TEST is at the L level through initialization of register circuit 64, and data inversion control signal PMS is at the L level. Therefore, writing and reading of the test data are performed under the default state of not inverting the internal write data.

State setting data is written into register circuit 64 according to the determination result of match/mismatch in logical level between the write and read data. Specifically, test mode activating signal TEN is made active, and data of "1" is written when the logical levels do not match with each other, and data of "0" is written into register circuit 64 when the logical levels match with each other. Therefore, mode control signal TEST is set to the H level for the case of mismatch of the logical levels, and to the L level for the case of match of the logical levels (step S4). Thereby, when the logical levels do not match, link element 66a is equivalently set to the blown-off state, and data inversion control signal PMS is set to the H level. When the logical levels of the write and read data match with each other, MOS transistor 66b is kept non-conductive, and data inversion control signal PMS is kept at the L level.

Under the above state, various test items are performed to conduct required tests (step S5).

When all the test items are completed, link element 66a is programmed in programming a defective address as in redundant replacement of repairing a faulty cell in the memory cell array. More specifically, link element 66a is selectively blown (step S6) according to the result of match/mismatch determination in step S3. Thereby, all the required test steps are completed.

In a practical use, in response to reset signal RST generated in an initializing step, register circuit 64 sets mode control signal TEST to the L level. Internal node 66e is set to the H level or L level depending on blown/non-blown state of link element 66a, and thereby the logical level of data inversion control signal PMS is set.

According to the construction shown in FIG. 29, writing and reading of the test data can be performed at an arbitrary address in the memory cell array in the test step, and a particular address region for the data inversion control is not required. Also, by writing and reading the test data into and from a plurality of memory cells, it can be accurately determined whether the data inverting operation is required without an influence by a faulty cell. After the programming of link element 66a, the voltage level of data inversion control signal PMS is fixedly set in the practical use. Therefore, it is not necessary in the initializing sequence to read data for data inversion control from the memory cell so that the initializing sequence can be simple.

Figure 31:
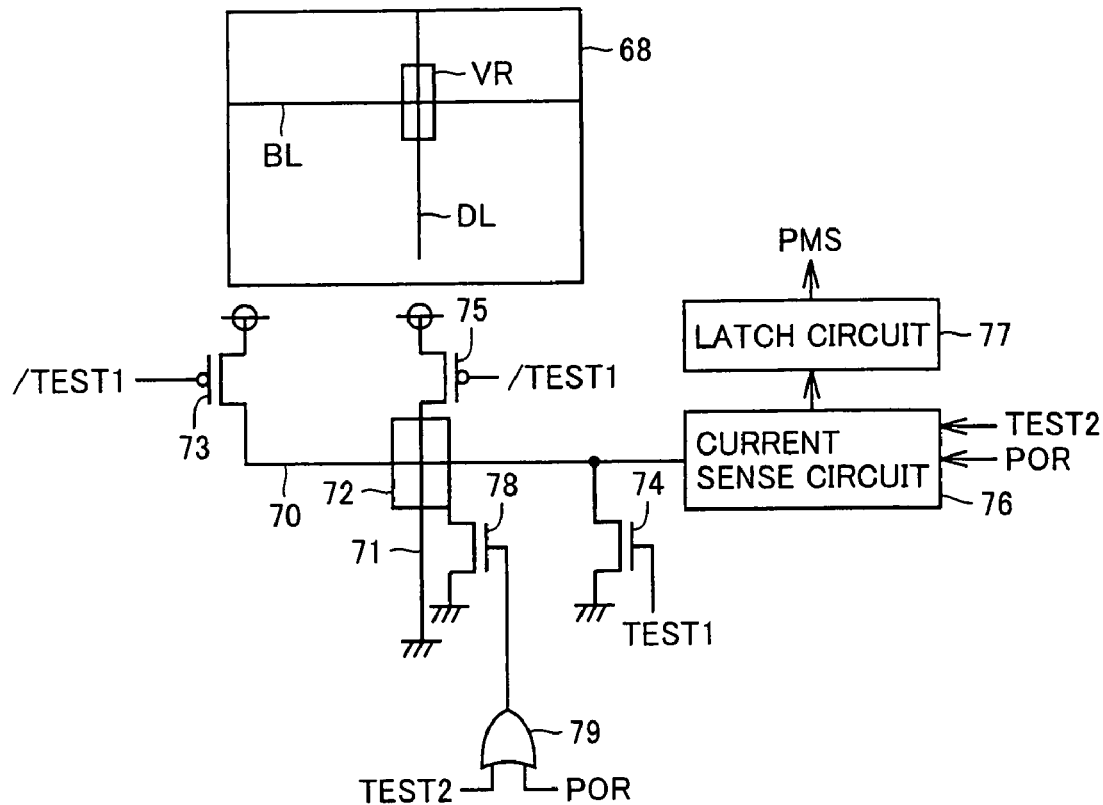
FIG. 31 shows a modification of the data inversion control signal generating section.

FIG. 31 shows still another construction of a portion for generating data inversion control signal PMS. In FIG. 31, the data inversion control signal generating portion is provided outside a memory cell array 68, and includes a signal line 70 arranged in parallel to bit line BL, a signal line 71 arranged in parallel to digit line DL, and a magneto-resistance element 72 arranged at a crossing between signal lines 70 and 71. Magneto-resistance element 72 is aligned in the same direction as magneto-resistance element VR placed in memory cell array 68, and has the same geometry (although the size may be different).

The data inversion control signal generating portion further includes a P-channel MOS transistor 73 arranged at one end of signal line 70, and made conductive to supply a current to signal line 70 when test mode instructing signal /TEST1 is active, an N-channel MOS transistor 74 arranged on the other end of signal line 70, and made conductive to drive the signal line 70 to the ground voltage level when test mode instructing signal TEST1 is active, an OR gate 79 receiving a power-on reset signal POR and a test mode instructing signal TEST2, and an N-channel MOS transistor 78 coupling the fixed layer of magneto-resistance element 72 to the ground node according to the output signal of OR gate 79.

MOS transistors 73 and 74 form replica circuits of bit line current drivers arranged on the opposite ends of bit line BL in memory cell array 68, respectively, and cause a current to flow through signal line 70 in the same direction as the current flowing through bit line BL when data "0" is written in memory cell array 68 in the default state. Signal line 71 has the other end coupled to the ground node, and signal line 71 is supplied via MOS transistor 75 with a current of the same magnitude as the digit line current flowing through digit line DL. Therefore, the free layer of magneto-resistance element 72 is magnetized in the same direction as that in the case where data "0" is written into magneto-resistance element VR in the default state. The fixed layers in magneto-resistance elements VR and 72 are magnetized in the same direction.

MOS transistor 78 is a replica transistor of an access transistor of the memory cell. Power-on reset signal POR is generated in a one-shot pulse form when the power supply voltage becomes stable after power up. More specifically, power-on reset signal POR is set at the H level for a predetermined period of time after the power supply voltage becomes stable.

The data inversion control signal generating portion further includes a current sense circuit 76 for sensing the magnitude of the current flowing through signal line 70 when power-on reset signal POR is active, and a latch circuit 77 for latching an output signal of current sense circuit 76, to producing data inversion control signal PMS. The fixed layer of magneto-resistance element 72 is coupled to the ground node via an N-channel MOS transistor 78 made conductive when test mode instructing signal TEST2 is active. Current sense circuit 76 has substantially the same construction as read amplifier 57 shown in FIG. 28. When current sense circuit 76 is active, it supplies a current to signal line 70 to determine via magneto-resistance element 72 whether the current flows signal line 70 to the ground node via MOS transistor 78, and produces the signal according to the result of this determination.

Figure 32:
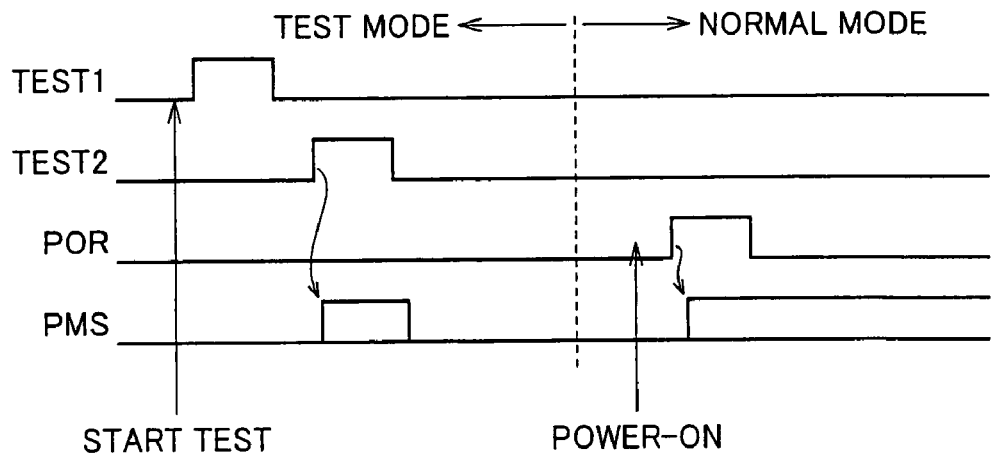
FIG. 32 is a signal waveform diagram representing an operation of the data inversion control signal generating unit shown in FIG. 31.

FIG. 32 is a signal waveform representing the operation of the inversion control signal generating portion shown in FIG. 31. Referring to FIG. 32, the operation of the data inversion control signal generating portion shown in FIG. 31 will now be described.

After the manufacturing process is completed, test mode instructing signals TEST1 and /TEST1 are set to the active state to supply the current to signal line 70 so that the free layer of magneto-resistance element 72 is set to a state of storing data "0" in the default state. In this state, test mode instructing signal TEST2 and power-on reset signal POR are inactive, and MOS transistor 78 is off.

Then, test mode instructing signal TEST2 is made active. Responsively, the fixed layer of variable magneto-resistance element 72 is coupled to the ground node via MOS transistor 78, and current sense circuit 76 is activated to supply the current to signal line 70, and senses the magnitude of the current flowing through signal line 70 corresponding to the bit line. When magneto-resistance element 72 is in the state of storing data "0", latch circuit 77 stores the signal of the L level, and data inversion control signal PMS from latch circuit 77 is set to the L level. When magneto-resistance element 72 is in the state of storing data "1", latch circuit 77 stores the signal of the H level according to the output signal of current sense circuit 76, and data inversion control signal PMS is set to the H level.

Signal lines 70 and 71 are utilized as replica signal lines of bit line BL and digit line DL, respectively. Also, magneto-resistance element 72 is utilized as a replica element of magneto-resistance element VR in memory cell array 68, and MOS transistors 73 and 74 are utilized as replica elements of the bit line current drivers. Thereby, it is possible to determine accurately whether the logical levels of the write and read data match with each other in memory cell array 68 when in the default state.

In the normal mode in a practical use, the output signal of OR gate 79 attains the H level according to power-on reset signal POR, and responsively, MOS transistor 78 is turned on to couple the fixed layer of magneto-resistance element 72 to the ground node. Therefore, when the power supply voltage becomes stable after the power-on, current sense circuit 76 becomes active, and the logical level of the latch signal of latch circuit 77 is set according to the storage data of magneto-resistance element 72 and accordingly, the logical level of data inversion control signal PMS is set.

In the case where magneto-resistance element 72 is utilized as the replica element of magneto-resistance element VR in memory cell array 68, signal lines 70 and 71, arranged extending parallel to bit line BL and digit line DL, respectively, may be arranged in an empty region outside memory cell array 68. Alternatively, the following construction may be utilized. Usually, geometry-dummy cells are arranged in a peripheral portion of memory cell array 68 for maintaining repeatability of the pattern of memory cells for ensuring accurate patterning of the memory cells. The geometry-dummy cells arranged in the peripheral portion of memory cell array 68 are utilized as the data inversion controlling cells, it is possible to provide easily the geometry-dummy bit line and the geometry-dummy digit line parallel to bit line BL and digit line DL, respectively.

In the default state, data inversion control signal PMS is at the L level, data "0" is written, and the logical level of data inversion control signal PMS is set according to the logical level of the read out data. However, data "1" may be written, and the logical level of data inversion control signal PMS may be set according to match/mismatch between the logical levels of the write and read data.

[Modification]

Figure 33:
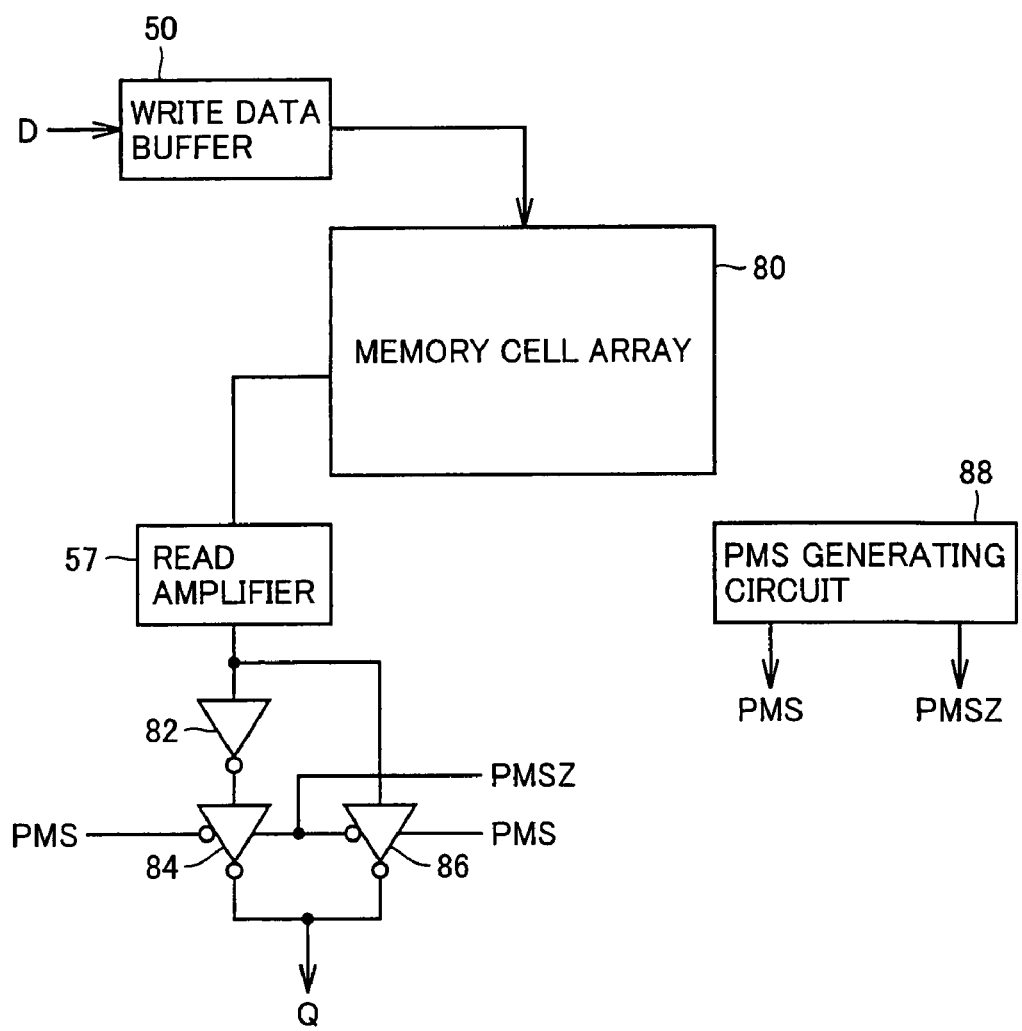
FIG. 33 schematically shows a structure of a modification of the fifth embodiment according to the invention.

FIG. 33 shows a construction of a modification of a magnetic memory device according to the fifth embodiment. In an MRAM macro shown in FIG. 33, write buffer 50 produces internal write data according to externally applied write data D, for writing into a memory cell array 80. An operation of logically inverting the write data is not performed.

Read amplifier 57 amplifies the data of a selected memory cell in memory cell array 80. In this MRAM macro, therefore, the output data of read amplifier 57 must be selectively inverted according to match/mismatch between the logical levels of the logical and physical data in memory cell array 80. Therefore, there is provided, at the output portion of read amplifier 57, an inverter 82 receiving the output signal of read amplifier 57, a tri-state inverter buffer 84 for selectively inverting the output signal of inverter 82 according to data inversion control signals PMS and PMSZ, and a tri-state inverter buffer 86 for producing read data Q by inverting the output signal of read amplifier 57 according to complementary data inversion control signals PMS and PMSZ. Tri-state inverter buffers 84 and 86 have outputs coupled together to generate internal read data.

When data inversion control signal PMS is at the L level, tri-state inverter buffer 84 is made active, and tri-state inverter buffer 86 is set to the output high-impedance state. When data inversion control signal PMS is at the H level, tri-state inverter buffer 84 is set to the output high-impedance state, and tri-state inverter buffer 86 is activated. Therefore, when data inversion control signal PMS is at the L level, output data Q is produced at the same logical level as the output signal of read amplifier 57. When data inversion control signal PMS is at the H level, output data Q is produced at an inverted logical level of the output signal of read amplifier 57

In the case where externally applied write data (logical data) D is inverted and stored as the physical data in memory cell array 80, the output data of read amplifier 57 is likewise inverted so that the logical levels of the read and write data match with each other in an external region, and the integrity between the logical and physical data can be equivalently maintained.

Data inversion control signals PMS and PMSZ are complementary to each other. Data inversion control signal PMS may be generated by utilizing any of the circuit configurations already described with reference to FIGS. 28 to 32.

According to the description in the above, a plurality of MRAM macros are used for implementing a system on chip. However, even in the case where one MRAM macro is solely used, inversion/non-inversion of data reflecting the magnetization direction of the fixed layer in the wafer process may be set in the wafer test performed after completion of magnetizing process on the fixed magnetization layer in the magneto-resistance element. In this procedure, the write and read data can be always matched in logical levels with each other independently of the magnetization direction of the fixed layer. It is not necessary in the process of designing circuitry to take inversion/non-inversion of the data polarity into account, and the MRAM macro including the circuit section for generating the data inversion control signal can be registered into a library, whereby different kinds of magnetic memory devices having different storage capacities and data bit widths can be easily developed based on the MRAM macro registered as the library, and the designing efficiency can be improved.

Sixth Embodiment

Figure 34:
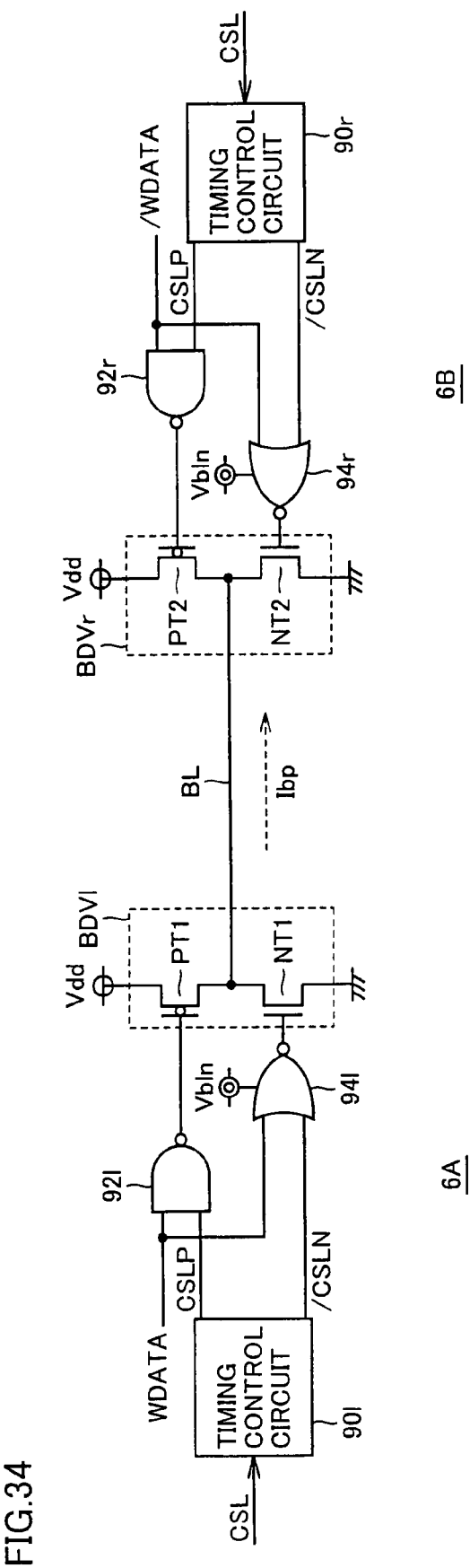
FIG. 34 shows, by way of example, structures of bit line write current control circuits according to a sixth embodiment of the invention.

FIG. 34 shows a construction of a main portion of a magnetic memory device according to a sixth embodiment of the invention. FIG. 34 shows a construction for one bit line BL in bit line write current control circuits 6A and 6B shown in FIG. 7. The construction of the bit line write current control portion shown in FIG. 34 is placed for each bit line BL. Bit line current drivers BDV1 and BDVr are arranged on the opposite sides of bit line BL, respectively. Bit line current driver BDV1 includes a P-channel MOS transistor PT1 connected between the power supply node and bit line BL, and an N-channel MOS transistor NT1 connected between bit line BL and the ground node. Bit line current driver BDVr includes a P-channel MOS transistor PT2 connected between the power supply node and bit line BL, and an N-channel MOS transistor NT2 connected between bit line BL and the ground node.

A bit line write current control circuit 6A includes a timing control circuit 90*l* for producing timing control signals CSLP and /CSLN according to a column select signal CSL applied from the column decoder, a NAND gate 92*l* receiving write data WDATA from a write data buffer and a timing control signal CSLP and driving the gate of P-channel MOS transistor PT1, and a NOR gate 94*l* receiving write data WDATA and timing control signal /CSLN, and driving a gate of a MOS transistor NT1. NOR gate 94*l* receives, as one-side operation supply voltage, a voltage Vbln at a voltage level intermediate between a power supply voltage Vdd and a ground voltage GND.

Bit line write current control circuit 6B includes a timing control circuit 90*r* for producing timing control signals CSLP and /CSLN according to a column select signal CSL, a NAND gate 92*r* receiving complementary write data /WDATA and timing control signal CSLP and driving the gate of MOS transistor PT2, and a NOR gate 94*r* receiving write data /WDATA and timing control signal /CSLN and driving a gate of a MOS transistor NT2. NOR gate 94*r* receives intermediate voltage Vbln as one-side operation supply voltage.

Figure 35:
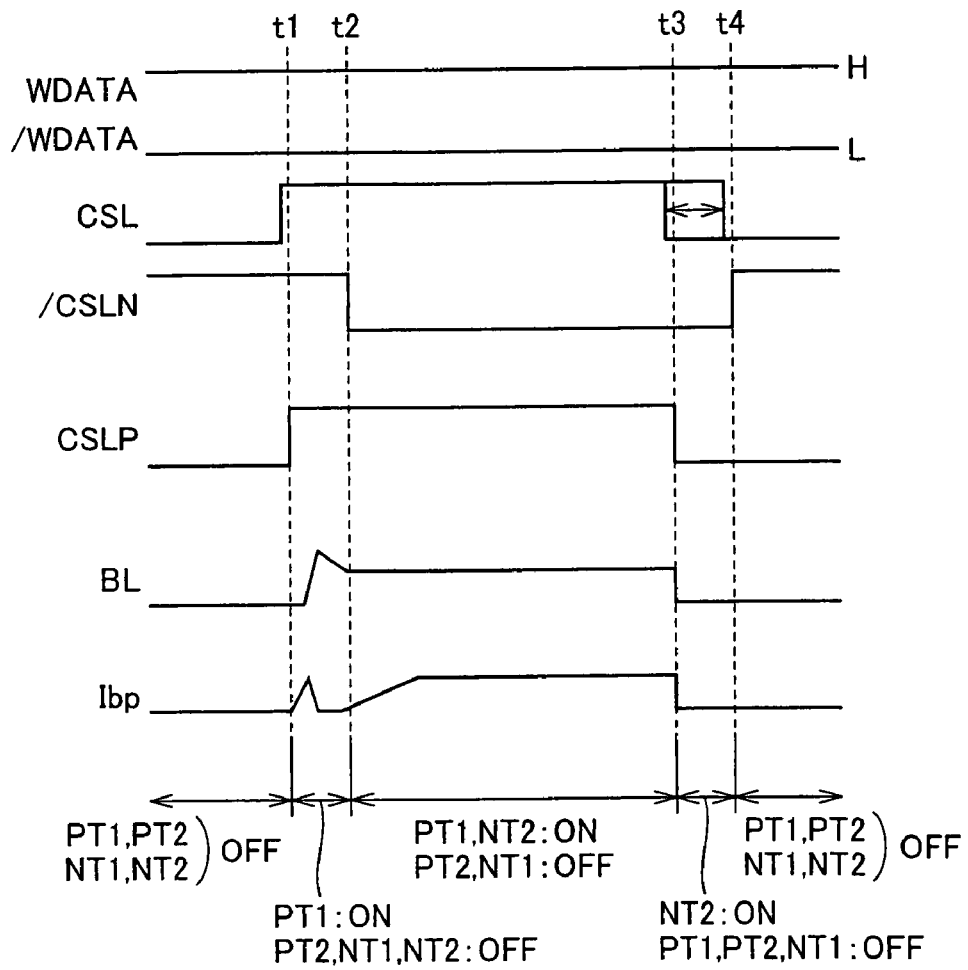
FIG. 35 is a signal waveform diagram representing an operation of the circuits shown in FIG. 34.

FIG. 35 is a signal waveform diagram representing an operation of the bit line write current control circuit shown in FIG. 34. Referring to FIG. 35, description will now be made of the operations of the bit line current driver and the bit line write current control circuit shown in FIG. 34.

It is assumed that in the data write operation, internal write data WDATA and /WDATA generated from the write data buffer are set to the H level and the L level, respectively.

Before a time t1, column select signal CSL is at the L level, and timing control signals CSLP and /CSLN applied from timing control circuits 90*l* and 90*r* are at the L and H levels, respectively. In this state, NAND gates 92*l* and 92*r* provide the output signals at the H level, and NOR gates 94*l* and 94*r* provide the output signals at the L level. Therefore, all MOS transistors PT1, PT2, NT1 and NT2 are off, and bit line current drivers BDV1 and BDVr are in the output high-impedance state.

At time t1, column select signal CSL is driven to the selected state, and responsively, timing control signals CSLP applied from timing control circuit 90*l* and 90*r* rise to the H level. Internal write data WDATA is at the H level, and NAND gate 92*l* generates the output signal at the L level so that MOS transistor PT1 is turned on, and bit line current driver BDV1 supplies the current to bit line BL. In bit line current driver BDVr, both MOS transistors PT2 and NT2 are off, and bit line BL is charged to the power supply voltage level. In charging the bit line BL, bit line write current Ibp of a large amount flows until the bit line BL attains the power supply voltage level. When the voltage level of bit line BL becomes stable at the power supply voltage level, bit line write current Ibp attains 0 V. The current in charging the bit line merely charges a parasitic capacitance of the bit line, and a peak current thereof is sufficiently suppressed.

Here, FIG. 35 represents a waveform of a voltage at an arbitrary point on bit line BL. The voltage on bit line BL lowers after rising above the level of power supply voltage Vdd due to ringing caused by the parasitic capacitance and the parasitic resistance of bit line BL.

At time t2, a timing control signals /CSLN outputted from timing control circuits 90*l* and 90*r* attain the L level. Accordingly, the output signal of NOR gate 94*r* attains the H level to turn on MOS transistor NT2 in bit line current driver BDVr so that a current Ibp flows through bit line BL via MOS transistors PT1 and NT2. In this state, the operation supply voltage of NOR gate 90*r* is at the level of intermediate voltage Vbln, and the current driving power of MOS transistor NT2 is controlled by its gate-source voltage (=Vbln) so that the current flowing through bit line BL is controlled by the current driving power of MOS transistor NT2, and does not exceed the controlled level. The data is written into the memory cell under such a state that bit line write current Ibp is stably kept at the level controlled by MOS transistor NT2.

At time t3, timing control signals CSLP outputted from timing control circuits 90*l* and 90*r* attain the L level, and the output signal of NAND gate 92*l* attains the H level. Responsively, MOS transistor PT1 in bit line current driver BDV1 is turned off. In this state, therefore, current supply to bit line BL stops, and bit line write current Ibp does not flow. Further, MOS transistor NT2 in bit line current driver BDVr discharges bit line BL to the ground voltage level. Accordingly, bit line BL is precharged to the ground voltage level.

At time t4, timing control signal /CSLN attains the H level, and MOS transistor NT2 in bit line current driver BDVr is turned off so that the operation of precharging bit line BL is completed.

By driving the MOS transistors PT1 and NT2 to the conductive state (on state) at different timings, it is possible to suppress a large peak current flow through the bit line. In particular, by decreasing the changing rate of the output signal of NAND gate 92*l* or 92*r*, it is possible to decrease the changing rate of the current supplied by charging MOS transistors PT1 and PT2, and the peak current in the bit line charging can be suppressed. In the bit line discharging, the bit line is discharged by MOS transistor NT1 or NT2 having the current driving power reduced by the intermediate voltage Vbln, and MOS transistor NT1 or NT2 functions as a constant current source. Therefore, it is possible to inhibit bit line write current Ibp of a predetermined value or more from flowing.

Figure 36:
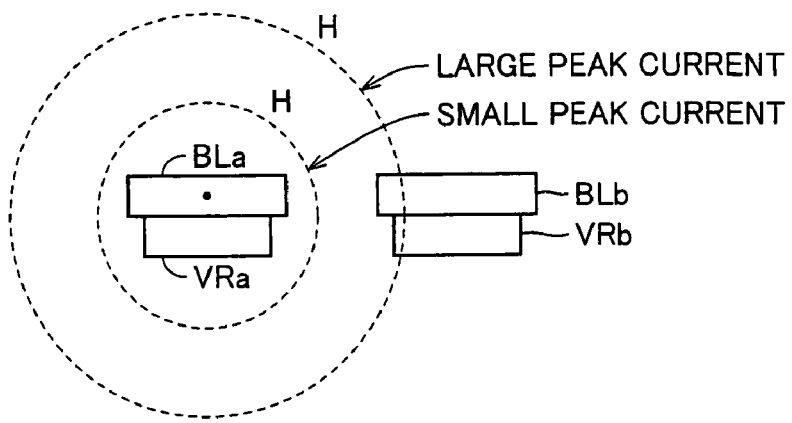
FIG. 36 schematically shows magnetic fields induced by a bit line in the data writing in the magnetic memory device according to the sixth embodiment of the invention.

Therefore, as shown in FIG. 36, if a bit line peak current on a bit line BLa is large when the data is written into a magneto-resistance element VRa, a magnetic field may possibly leak on an adjacent bit line BLb, to change the magnetization direction of a magneto-resistance element VRb on adjacent bit line BLb. By reducing the bit line peak current as described above, it is possible to prevent a magnetic field H larger than a threshold of magneto-resistance element VRb from being applied on adjacent bit line BLb. Accordingly, magnetic disturbance that the data in an unselected adjacent memory cell is inverted, can be prevented in writing data into the selected memory cell.

In bit line current drivers BDV1 and BDVr, discharging MOS transistor NT1 or NT2 transitions into a turned off state after charging MOS transistor PT2 or PT1 transitions into a turned off state. Thus, bit line BL can be reliably precharged to the ground voltage level. Accordingly, a circuit for precharging bit line BL to the ground voltage level is not required, and it is possible to reduce an area of the bit line current driver band in which the bit line current drivers are arranged.

Timing control circuits 90*l* and 90*r* have internal circuit configurations appropriately determined depending on deactivation timing of column select signal CSL. For example, in the case where column select signal CSL is deactivated at time t3, timing control signal CSLP is produced by the buffer circuit receiving column select signal CSL, and timing control signal /CSLN is produced by an inversion delay circuit receiving the column select signal CSL. In the case where column select signal CSL is deactivated at time t4, timing control signal CSLP is produced, for example, by a one-shot pulse generating circuit, the one-shot pulse attaining the H level in response to the activation of column select signal CSL, and timing control signal /CSLN is produced by a circuit formed of a rise delay circuit for delaying the activation of column select signal CSL by a predetermined period of time, and an inverter for inverting the output signal of this rise delay circuit.

A configuration for decreasing the rate of driving the gates of charging MOS transistors PT1 and PT2 to the L level in bit line current drivers BDV1 and BDVr, is implemented by reducing the current driving powers of the discharging transistors in NAND gates 92*l* and 92*r*.

According to the sixth embodiment of the invention, as described above, the charging MOS transistor in the bit line current driver is turned on at the timing different from that of turning on the discharging MOS transistor, and the bit line write current can be separated from the charging current supplied from the parasitic capacitances of the bit line and power supply node so that the peak current flowing through the bit line can be suppressed to or below a predetermined value. Consequently, it is possible to prevent the magnetic disturbance of erroneously inverting the data of the adjacent memory cell from occurring. Also, by turning off the discharging MOS transistor at a late timing, the selected bit line can be reliably precharged to the ground voltage level when it is deselected. Thus, a precharge circuit is not required, and the area of the bit line current driver band can be reduced.

Seventh Embodiment

Figure 37:
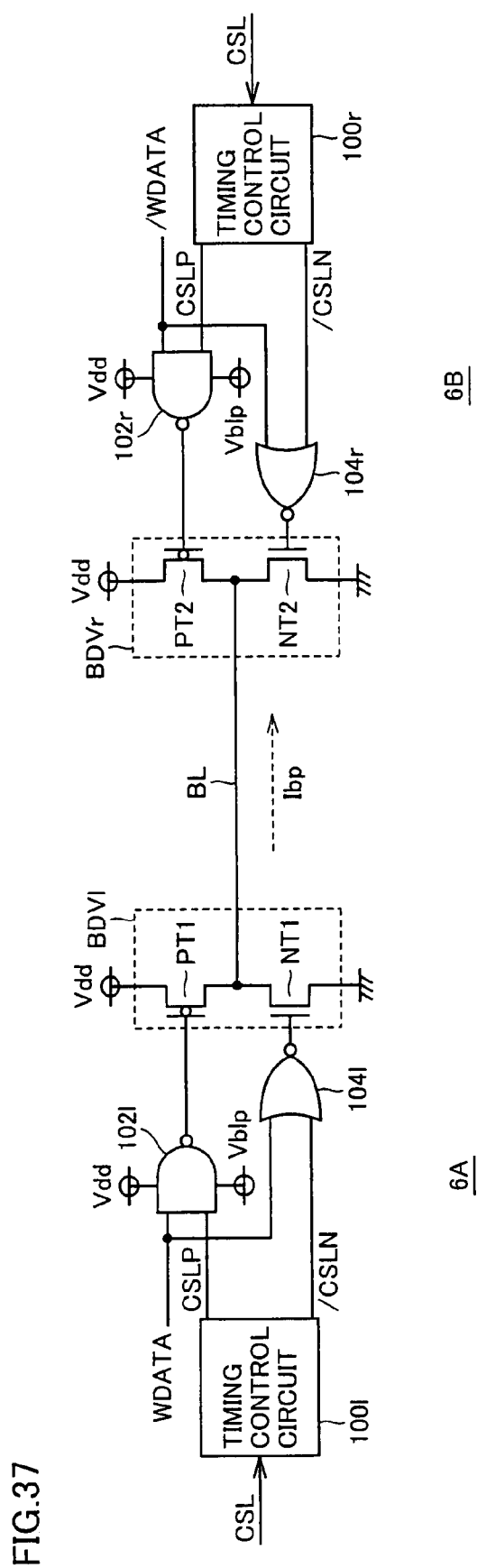
FIG. 37 schematically shows a construction of a bit line write current control circuit of a magnetic memory device according to a seventh embodiment of the invention.

FIG. 37 shows a construction of a bit line write current control circuit according to a seventh embodiment of the invention. In FIG. 37, bit line write current control circuit 6A includes a timing control circuit 100*l* producing timing control signals CSLP and /CSLN according to column select signal CSL, a NAND gate 102*l* receiving internal write data WDATA and timing control signal CSLP, and a NOR gate 104*l* receiving internal write data WDATA and timing control signal /CSLN. NAND gate 102*l* operates using power supply voltage Vdd and an intermediate voltage Vblp as the operation power supply voltages. Therefore, when P-channel MOS transistor PT1 in bit line current driver BDV1 has the source-gate voltage made smaller than power supply voltage Vdd when made conductive, so that the degree of conduction is small, and the current driving power is restricted. NOR gate 104*l* receives the power supply voltage and the ground voltage as the operation power supply voltages.

Bit line write current control circuit 6B likewise includes a timing control circuit 100*r* producing timing control signals CSLP and /CSLN according to column select signal CSL, a NAND gate 102*r* receiving complementary internal write data /WDATA and timing control signal CSLP, and a NOR gate 104*r* receiving complementary internal write data /WDATA and timing control signal /CSLN. NAND gate 102*r* receives power supply voltage Vdd and intermediate voltage Vblp as the operation power supply voltages, and NOR gate 104*r* receives the power supply voltage and the ground voltage as the operation power supply voltages. In bit line current driver BDVr, therefore, MOS transistor PT2 in the turned on state has the degree of conduction made small to have the amount of the driving current restricted.

Bit line current drivers BDV1 and BDVr have the same constructions as bit line current drivers BDV1 and BDVr shown in FIG. 34. The corresponding portions are allotted with the same reference numerals, and detailed description thereof is not repeated.

Figure 38:
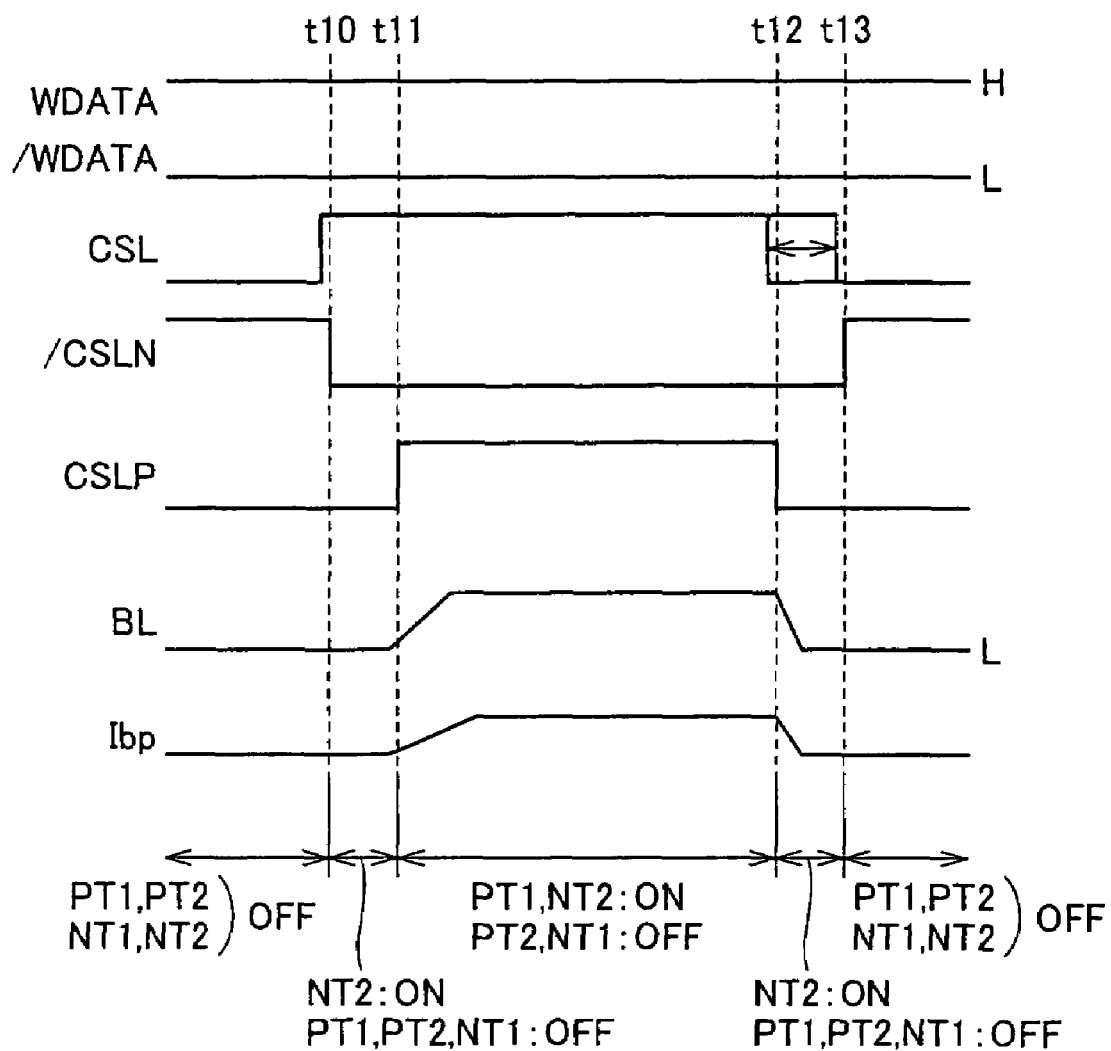
FIG. 38 is a signal waveform diagram representing an operation of the circuit shown in FIG. 37.

FIG. 38 is a signal waveform diagram representing an operation of the bit line write current control circuit shown in FIG. 37. Referring to FIG. 38, description will now be made of on the operations of bit line write current control circuits 6A and 6B shown in FIG. 37.

It is assumed that write data WDATA is at the H level, and complementary internal write data /WDATA is at the L level. When column select signal CSL is inactive, timing control signal /CSLN is at the H level, timing control signal CSLP is at the L level, and bit line current drivers BDV1 and BDVr are in the output high-impedance state.

At time t10, timing control signals /CSLN outputted from timing control circuits 100*l* and 100*r* lower to the L level. Accordingly, the output signal of NOR gate 104*r* attains the H level, and MOS transistor NT2 in bit line current driver BDVr is turned on to couple bit line BL to the ground node. Other MOS transistors PT1, NT1 and PT2 are kept off, and a current does not flow through bit line BL. In this state, only the discharging of the parasitic capacitance of bit line BL to the ground voltage level is performed, and the bit line current does not flow.

At time t11, timing control signal CSLP attains the H level, and the output signal of NAND gate 102*l* falls from the H level to the low level. The low level potential by NAND gate 102*l* is equal to the level of intermediate voltage Vblp so that MOS transistor PT1 in bit line current driver BDV1 is turned on with the degree of the conduction being low. Accordingly, MOS transistor PT1 supplies the current with a restricted current driving power from the power supply node to the bit line. Even if the charging and discharging of the parasitic capacitance of bit line BL are performed when MOS transistor PT1 supplies write current Ibp to bit line BL, and even in the case where there is a parasitic capacitance on the power supply node, and the charges charged on the parasitic capacitance are already discharged, the driving current amount of MOS transistor PT1 is restricted, and thus, bit line write current Ibp slowly rises to the current amount defined by MOS transistor PT1. Accordingly, the potential of bit line BL slowly rises.

When a predetermined period of time elapses since bit line write current Ibp attains a constant value, timing control signal CSLP attains the L level, and the output signal of NAND gate 102*l* attains the level of power supply voltage Vdd so that MOS transistor PT1 is turned off. In bit line current driver BDVr, MOS transistor NT2 is in a conductive state so that bit line BL is discharged to the ground voltage level.

At time t13, timing control signal /CSLN attains the H level so that MOS transistor NT2 is turned on, and bit line current drivers BDV1 and BDV2 each attain the output high-impedance state.

For example, column select signal CSL is made inactive at a timing between time t12 to time t13, or at time t12 or t13, as an example.

As in the construction shown in FIG. 37, by controlling the current driving power of the charging MOS transistors in the bit line current driver, it is possible to prevent a large peak current from flowing through charging/discharging of the parasitic capacitances present distributedly over bit line BL, and erroneous writing in an unselected adjacent memory cell can be prevented.

In the construction shown in FIG. 37, timing control circuits 100*l* and 100*r* have the circuit configurations determined depending on the timing of activation/deactivation of column select signal CSL. For example, for the case where column select signal CSL is made inactive at time t12, timing control signal CSLP is produced by a rise delay circuit, and timing control signal /CSLN is produced by a fall delay circuit delaying the falling of column select signal CSL, and an inverter for inverting an output signal of the fall delay circuit. For the case where column select signal CSL is made inactive at time t13, timing control signal CSLP is produced by the one-shot pulse signal generating circuit for generating the one-shot pulse signal set at the H level for a predetermined period with a delay of a predetermined period of time relative to activation of column select signal CSL. The inverter receives this column select signal CSL and produces timing control signal /CSLN.

According to a seventh embodiment of the invention, as described above, the discharging transistor in the bit line current driver is driven to the on state, and then the charging transistor is driven to the on state with the driving current amount thereof controlled, so that it is possible to suppress inrush of charges charged on the parasitic capacitance of the power supply node, to suppress a peak current due to the parasitic capacitance and parasitic inductance of the bit line, and accordingly to suppress occurrence of the magnetic disturbance. The bit line discharging transistor is kept conductive at the large driving power even after the completion of the charging operation, and bit line BL can be reliably precharged to the ground voltage level so that the next column selecting cycle can start at a faster timing.

Eighth Embodiment

Figure 39:
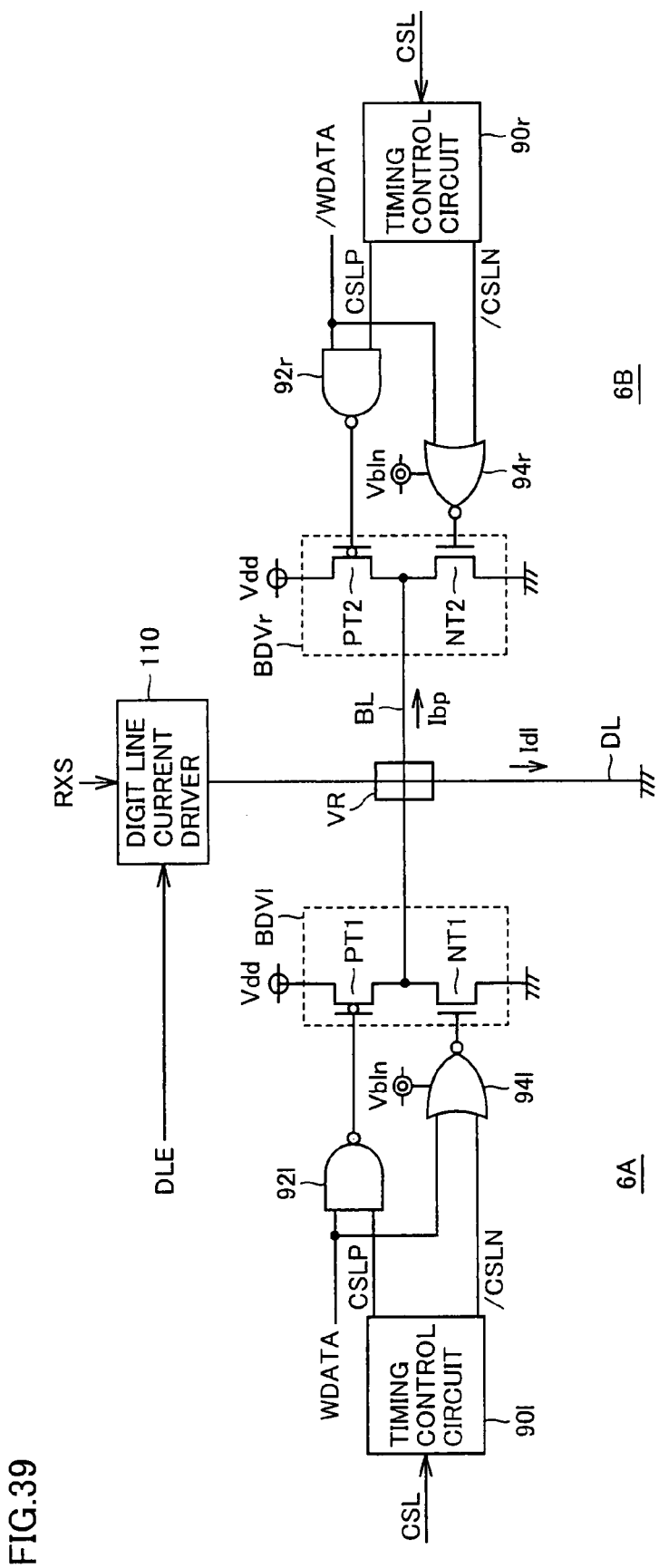
FIG. 39 schematically shows a construction of a main portion of a magnetic memory device according to an eighth embodiment of the invention.

FIG. 39 shows a construction of a main portion of a magnetic memory device according to an eighth embodiment of the invention. FIG. 39 additionally shows a digit line current driver 110 provided for digit line DL. Digit line current driver 110 is made active according to the activation of digit line enable signal DLE, to supply a current to digit line DL.

Bit line current drivers BDV1 and BDVr as well as bit line write current control circuits 6A and 6B provided for bit line BL have the same constructions as those shown in FIG. 34. Corresponding portions are allotted with the same reference numerals, and detailed description thereof is not repeated.

Magneto-resistance element VR of a memory cell is arranged at the crossing between digit line DL and bit line BL.

Figure 40:
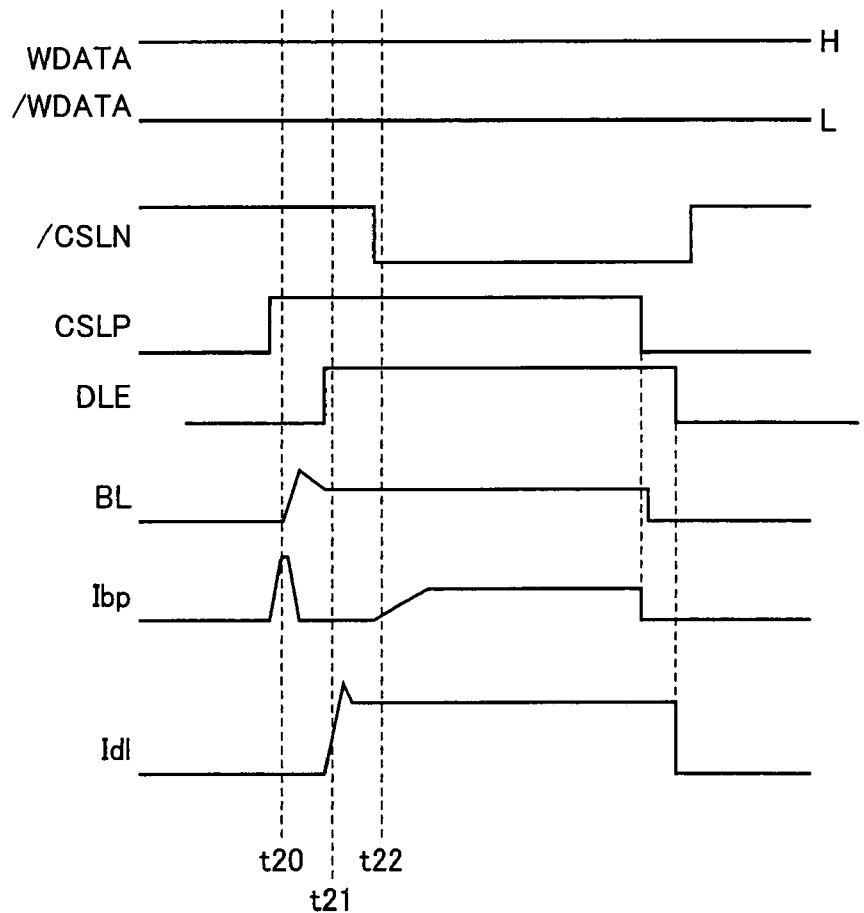
FIG. 40 is a signal waveform diagram representing an operation of the magnetic memory device shown in FIG. 39.

FIG. 40 is a signal waveform diagram representing an operation of the circuitry shown in FIG. 39. Referring to FIG. 40, a data write operation of the circuitry shown in FIG. 39 will now be described.

It is assumed that internal write data WDATA is at the H level, and complementary internal write data /WDATA is at the L level.

In the unselected state, both bit line current drivers BDV1 and BDVr are in the output high-impedance state, and digit line current driver 110 is inactive, and maintains digit line DL at the ground voltage level.

At time t20, timing control signal CSLP applied from each of timing control circuits 90*l* and 90*r* rises to the H level according to the activation of column select signal CSL, and accordingly, the output signal of NAND gate 92*l* lowers to the L level. Consequently, MOS transistor PT1 is turned on in bit line current driver BDV1, to supply current Ibp to bit line BL. In this case, when the parasitic capacitance of bit line BL is charged, the parasitic capacitance of the power supply node supplies the charged charges so that a relatively large bit line write current Ibp flows. In this bit line charging operation, the bit line peak current is suppressed similarly to the construction shown in FIG. 34. However, this bit line peak current is exaggerated in FIG. 40 for the purpose of illustrating an influence of the digit line current.

When bit line BL is stably kept at the voltage level of the power supply voltage after rising to the power supply voltage level, bit line write current Ibp attains 0. After bit line write current Ibp attains 0, a digit line enable signal DLE is made active at a time t21. Thereby, digit line current driver 110 is made active according to a row select signal RXS outputted from the row decoder (not shown), and supplies a current to digit line DL. After a digit line current Idl attains a constant current level, timing control signal /CSLN is made active at a time t22, and bit line current driver BDVr turns on MOS transistor NT2 to supply bit line write current Ibp to bit line BL.

In bit line write current Ibp and digit line current Idl, the peak currents occur at different timings, and do not occur concurrently. Therefore, such a situation is prevented that the magnetic field induced by the peak current of bit line write current Ibp is combined with the magnetic field induced by the peak current of digit line current Idl and a large combined magnetic field is applied to an unselected adjacent memory cell connected to the same digit line DL. Therefore, erroneous writing in the adjacent memory cell can be prevented.

Likewise, deactivation of timing control signals CSLP and /CSLN and deactivation of digit line enable signal DLE are performed at different timings. In FIG. 40, digit line enable signal DLE becomes inactive after timing control signal CSLP becomes inactive, and then timing control signal /CSLN becomes inactive. In this case, when digit line DL changes to the unselected state, the discharging transistor maintains bit line BL at the ground voltage level, and prevents the change in potential of bit line BL due the capacitive coupling. After digit line DL changes to the unselected state, bit line BL is set to the floating state.

Figure 41:
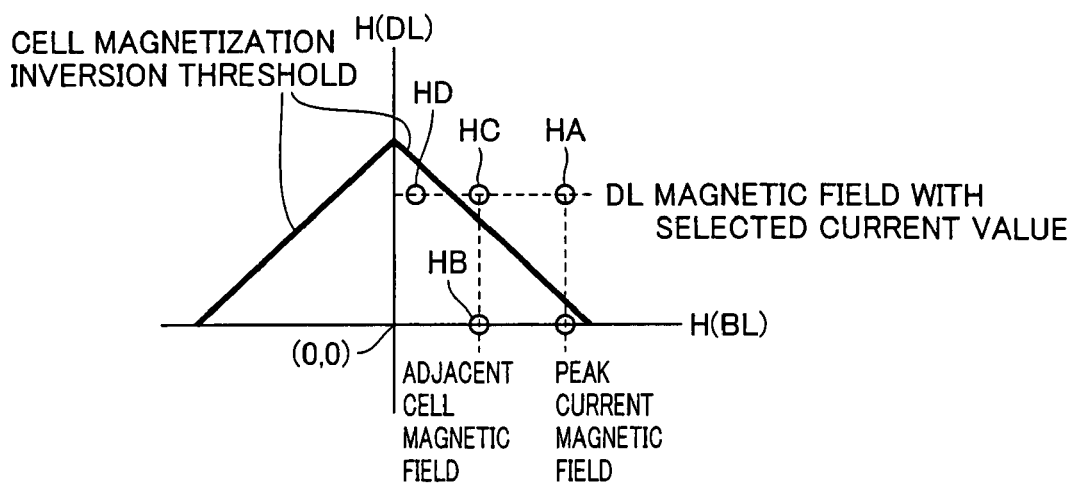
FIG. 41 illustrates, by way of example, a magnetic field applied to the magnetic memory cell of the magnetic memory device shown in FIG. 39 as well as magnetization characteristics of the memory cell.

FIG. 41 illustrates a magnetic field applied to the memory cell in data writing by the construction shown in FIG. 39. In FIG. 41 representing the asteroid characteristic curve, the abscissa measures magnetic field H(BL) induced by bit line write current Ibp flowing through bit line BL, and the ordinate measures magnetic field H(DL) induced by digit line current Idl flowing through digit line DL.

The curve of the asteroid characteristic curve represents a threshold intensity of the magnetic field causing the magnetic inversion of the memory cell. When the peak current of bit line write current Ibl is combined with the current of digit line DL, magnetic field HA shown in FIG. 41 is produced, and the magnetic field of the selected memory cell is inverted. In this state, bit line write current Ibp induces magnetic field HB to the adjacent memory cell, and a combined magnetic field HC is applied to the adjacent cell when digit line current Idl generates the magnetic field. In this case, the magnetized state is inverted in the adjacent cell to result in erroneous writing of the data. By supplying digit line current Idl when bit line write current Ibp is zero, only magnetic field HB is applied to the adjacent memory cell when the peak current of bit line write current Ibp occurs, and the erroneous inversion of the data is prevented in the adjacent cell.

When bit line current Ibp and digit line current Idl both flow in data writing, the selected memory cell is subjected to a magnetic field of an intensity in a range between those of magnetic fields HC and HA. Meanwhile, the adjacent memory cell is subjected to magnetic field HD, and inversion of the magnetization of the magneto-resistance element does not occur in the adjacent memory cell.

After digit line current Idl becomes stable, bit line write current Ibp is supplied to bit line BL to prevent erroneous inversion of the magnetization in the adjacent cell, which may otherwise be caused by the peak current of digit line current Idl.

Figure 42:
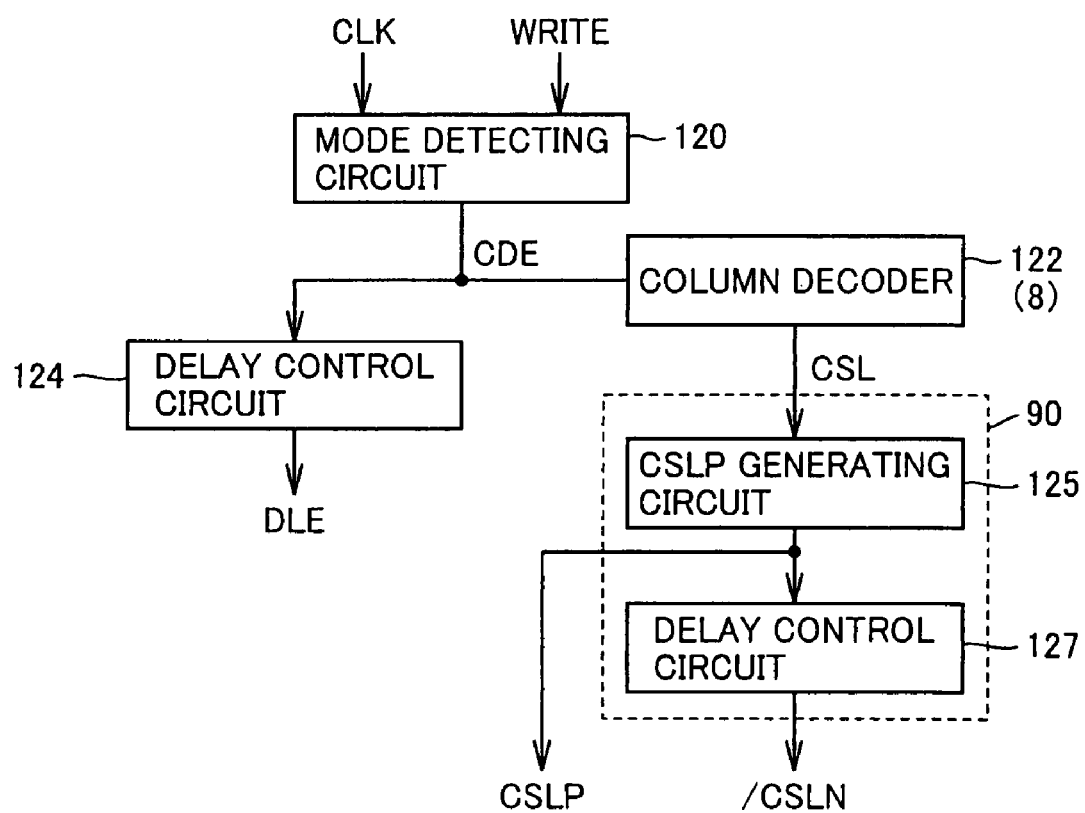
FIG. 42 schematically shows, by way of example, a construction of a timing control circuit shown in FIG. 39.

FIG. 42 schematically shows an example of a construction of a portion for generating digit line enable signal DLE and timing control signals CSLP and /CSLN. FIG. 42 shows a timing control signal generating circuit 90 as a representative of timing control circuits 90*l* and 90*r*. In FIG. 42, the control signal generating portion includes a mode detecting circuit 120 for producing column decoder enable signal CDE according to an externally applied clock signal CLK and a write command WRITE instructing the data writing, and a delay control circuit 124 for producing digit line enable signal DLE by adjusting the activation/deactivation timing of column decoder enable signal CDE. Column decoder enable signal CDE is applied to a column decoder 122. This column decoder 122 corresponds to column decoder 8 shown in FIG. 7.

Timing control circuit 90 includes a CSLP generating circuit 125 for producing timing control signal CSLP according to column select signal CSL received from column decoder 122, and a delay control circuit 127 for adjusting the timing of activation/deactivation of timing control signal CSLP to produce timing control signal /CSLN. CSLP generating circuit 125 may be formed of a buffer circuit, a one-shot pulse generating circuit or a delay circuit.

Delay control circuit 124 sets delay time periods for activation and deactivation of column decoder enable signal CDE such that digit line enable signal DLE becomes active at a timing between activation timings of timing control signals CSLP and /CSLN, and digit line enable signal DLE becomes inactive at a timing between deactivations of timing control signals CSLP and /CSLN. Thereby, timing control signal CSLP, digit line enable signal DLE and timing control signal /CSLN are sequentially activated and deactivated in this order.

According to the eighth embodiment of the invention, the gate potential of the discharging transistor of the bit line current driver is adjusted to restrict the bit line current, and the charging transistor is activated prior to the discharging transistor. Accordingly, the charging current of the parasitic capacitance (on the bit line and power supply node) can be separated from the bit line write current, and the peak current of the bit line write current can be suppressed. The timing for supplying a current to a digit line is set at a timing later than the completion of charging operation on the bit line, so that the combined magnetic field of the magnetic fields induced by the bit line peak current and the digit line peak current can be prevented from being applied onto an adjacent memory cell and inverting the storage data of the unselected adjacent cell.

The construction of CSLP generating circuit 125 is appropriately determined in view of the relationship in active period between column select signal CSL and timing control signal CSLP.

Ninth Embodiment

Figure 43:
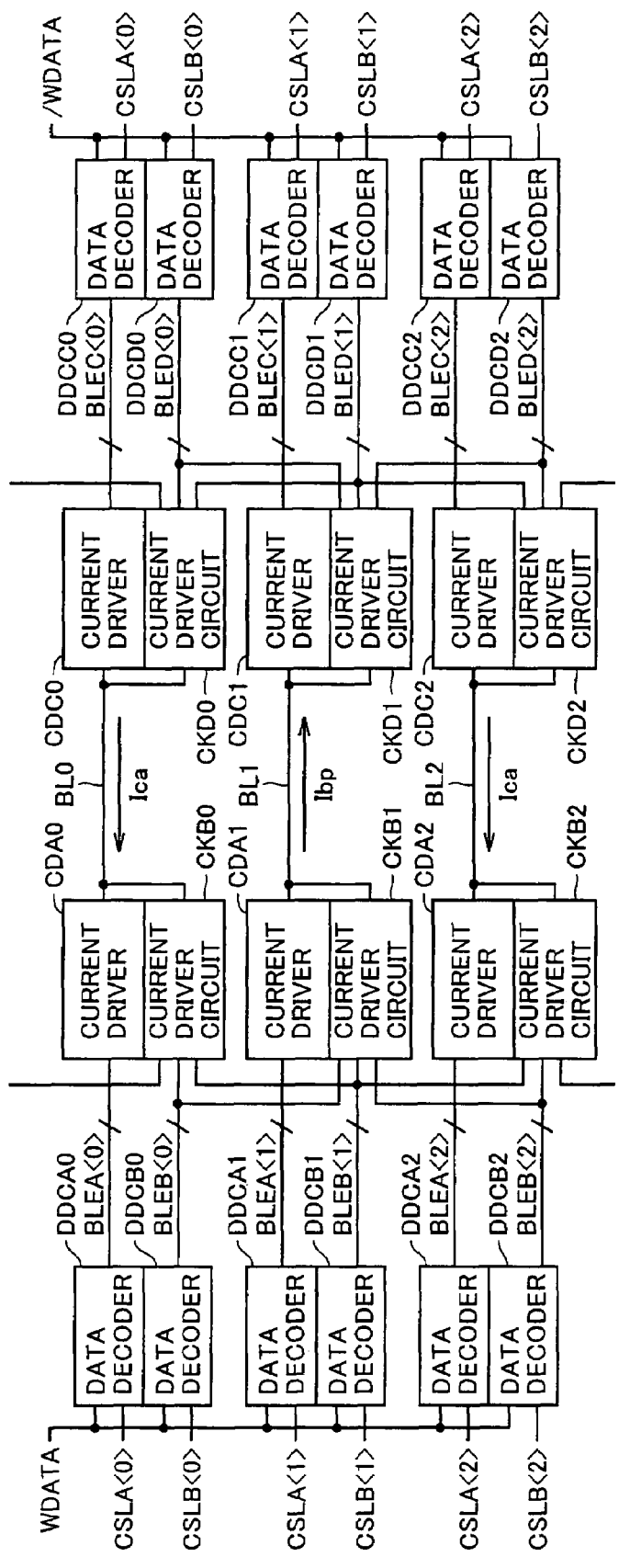
FIG. 43 schematically shows a construction of a bit line write current control circuit according to a ninth embodiment of the invention.

FIG. 43 schematically shows a construction of a bit line current control circuit portion according to a ninth embodiment of the invention. FIG. 43 representatively shows a construction of a circuit portion provided for three bit lines BL0-BL2. Bit line write current control circuit 6A includes current drivers CDA0-CDA2 provided corresponding to respective bit lines BL0-BL2, and current driver circuits CKB0-CKB2, provided corresponding, respectively, to bit lines BL0-BL2, each for driving the current in the direction depending on the write data when the corresponding bit line is selected, and for driving the current in the direction opposite to that of an adjacent bit line when this adjacent bit line is selected. Bit line write current control circuit 6A further includes data decoders DDCA0-DDCA2 provided corresponding to current drivers CDA0-CDA2, respectively, and data decoders DDCB0-DDCB2 provided corresponding to current driver circuits CKB0-CKB2, respectively.

Data decoder DDCAi (i=0-2) produces a bit line activating signal BLEA<i> according to write data WDATA and corresponding column select signal CSLA<i>, and transmits it to corresponding current driver CDAi. Data decoder DDCBi (i=0-2) produces a bit line activating signal BLEB<i> according to internal write data WDATA and second column select signal CSLB<i>, and supplies it to corresponding current driver CDKi and adjacent current driver circuits CKB(i−1) and CKB(i+1).

Current driver circuits CKB0-CKB2 supply currents to corresponding bit lines BL0-BL2 according to corresponding bit line enable signals BLEB<0>-BLEB<2> when corresponding bit lines BL0-BL2 are selected, respectively. When an adjacent bit line is selected, current driver circuits CKB0-CKB2 each drive the current in the direction opposite to that of the current driven by the current driver circuit and the current driver of the adjacent bit line.

Likewise, bit line write current control circuit 6B includes current drivers CDC0-CDC2 provided corresponding to respective bit lines BL0-BL2, current driver circuits CKD0-CKD2 provided corresponding to respective bit lines BL0-BL2, data decoders DDCC0-DDCC2 provided corresponding to respective current drivers CDC0-CDC2, and data decoders DDCD0-DDCD2 provided corresponding to respective current drivers CDC0-CDC2.

Data decoder DDCCi (i=0-2) produces bit line enable signal BLEC<i> according to complementary internal write data /WDATA and corresponding column select signal CSLA<i>. Data decoder DDCDi (i=0-2) produces second bit line enable signal BLED<i> according to complementary internal write data /WDATA and second column select timing signal CSLB<i>. Bit line enable signal BLEC<i> sets activation/deactivation of current driver CDCi.

Current driver circuit CKDi drives the bit line current in the direction determined by complementary internal write data /WDATA when corresponding bit line enable signal BLED<i> is selected. When bit line enable signal BLED<i−1> or BLED<i+1> for the adjacent bit line is selected, current driver circuit CKDi drives the bit line current in the direction opposite to the direction determined by complementary internal write data /WDATA.

Thus, according to the ninth embodiment, when the bit line is selected, a canceling current flows through the unselected bit line adjacent to the selected bit line in the direction opposite to that of the bit line write current, and thereby produces a canceling magnetic field that cancels an influence of the leak magnetic field applied from the selected bit line.

Figure 44:
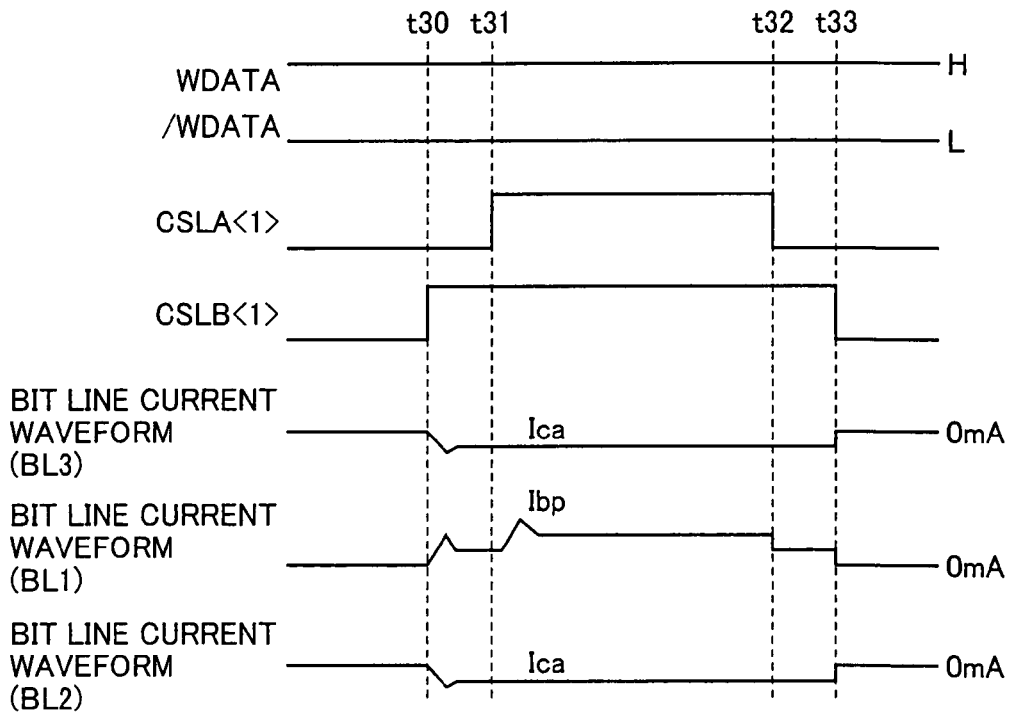
FIG. 44 is a signal waveform diagram representing an operation of the circuitry shown in FIG. 43.

FIG. 44 is a signal waveform diagram representing an operation of bit line write current control circuits 6A and 6B shown in FIG. 43. Referring to FIG. 44, description will now be made of the operations of bit line write current control circuits 6A and 6B shown in FIG. 43.

It is now assumed that internal write data WDATA is at the H level, complementary internal write data /WDATA is at the L level and bit line BL1 is selected.

Figure 45:
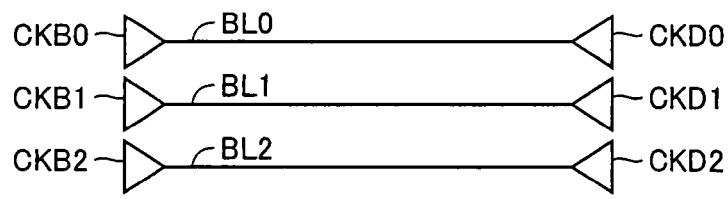
FIG. 45 diagrammatically shows a state of a current driver during a standby state of the bit line write current control circuit shown in FIG. 43.

Before start of writing at time t30, both column select signals CSLB<1> and CSLA<1> are at the L level. In this state, current driver circuits CKB0-CKB2 are in the output high-impedance state as shown in FIG. 45, and bit lines BL0-BL2 are kept in the precharged state.

Figure 46:
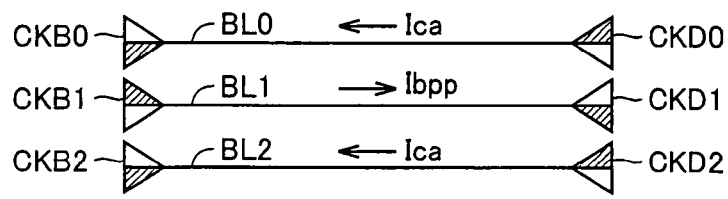
FIG. 46 diagrammatically shows a state at the start of the data writing of a current driver in the bit line write current control circuit shown in FIG. 43.

When column select signal CSLB<1> rises to the H level at time t30, bit line enable signal BLEB<1> outputted from data decoder DDCB1 is driven to the selected state, and current driver circuit CKB1 drives the current to bit line BL1 in the direction corresponding to internal write data WDATA. Current driver circuits CKB0 and CKB2, which are provided corresponding to adjacent bit lines BL0 and BL2, respectively, each cause the current flow in the direction opposite to the current flow direction of selected bit line BL1. As shown in FIG. 46, when current driver circuits CKB1 and CKD1 drive a bit line current Ibpp so as to flow rightward through bit line BL1, a canceling current Ica flows in the opposite direction through bit lines BL0 and BL2. In FIG. 46, bit line current driver circuits CKB0-CKB2 and CKD0-CKD2 is each formed of a CMOS inverter, in which P- and N-channel MOS transistors for upper and lower sides of the drive circuit, respectively, and the hatched transistors shown in FIG. 46 are made conductive.

As represented in FIG. 44, therefore, when a peak current of bit line precharge current Ibpp flows through bit line BL1 at time t30, canceling current Ica flows in the opposite direction so that magnetic fields are cancelled in the memory cells connected to bit lines BL0 and BL2.

Figure 47:
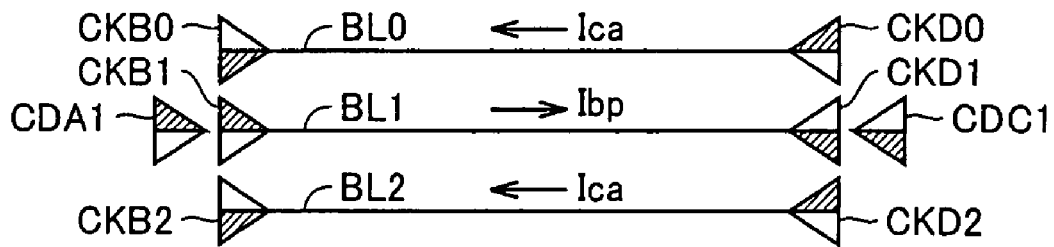
FIG. 47 diagrammatically shows a state at the data writing of the current driver in the bit line write current control circuit shown in FIG. 43.

After the current level of bit line BL1 becomes stable, column select signal CSLA<1> attains the H level at a time t31 so that current driver CDA1 turns active to supply the current to bit line BL1 in the same direction as current driver circuit CKB1, and bit line write current Ibp flows. Current drivers CDA0 and CDA2 provided corresponding to bit lines BL0 and BL2, respectively, maintain the output high-impedance state, because column select signals CSLA<0> and CSLA<2> are unselected. Likewise, current drivers CDC0 and CDC2 maintain the output high-impedance state. As shown in FIG. 47, therefore, when bit line write current Ibp flows through bit line BL1 in writing data into the selected memory cell, canceling current Ica flows in the opposite direction through adjacent bit lines BL0 and BL2.

Bit line BL1 is supplied with a current from current driver CDA1 and current driver circuit CKB1 so that a sufficiently large write magnetic field is formed, and the data is written into the selected memory cell. Meanwhile, canceling current Ica merely induces a magnetic field, which cancels the influence exerted on bit lines BL0 and BL2 by the leak magnetic field generated from bit line BL1, and which is weaker than the threshold magnetic field of the magnetic field inversion, and does not invert the data in the memory cells connected to unselected bit lines BL0 and BL2.

Figure 48:
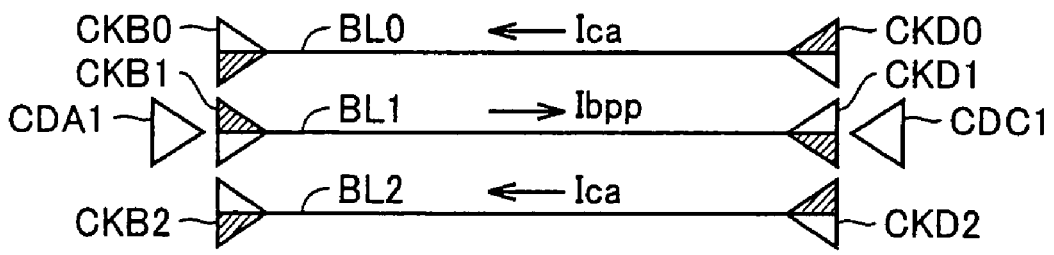
FIG. 48 diagrammatically shows a state at the end of the data writing of the current driver in the bit line write current control circuit shown in FIG. 43.

At a time t32, column select signal CSL<1> is first driven to the unselected state. At this time, column select signal CSLB<1> maintains the selected state. As shown in FIG. 48, therefore, current drivers CDA1 and CDC1 turn inactive, and the current flowing through bit line BL1 decreases. Canceling currents Ica driven by current driver circuits CKB0, CKD0, CKB2 and CKD2 flow through bit lines BL0 and BL2, to prevent canceling current Ica from stopping while bit line write current Ibp is flowing through bit line BL1. Accordingly, erroneous inversion of the storage data of the unselected adjacent memory cell is prevented. At the same time, current driver circuits CKB1 and CKD1 drive precharge current Ibpp to flow through bit line BL1. These currents Ica and Ibpp merely induce the magnetic fields inside the asteroid characteristic curve, and do not change the magnetization state of the associated memory cell.

At a time t33, column select signal CSLB<1> is driven to the unselected state so that all current driver circuits CKB0-CKB2 and CKD0-CKD2 enter the output high-impedance state, to return to the state shown in FIG. 45.

For selected bit line BL1, the current is driven in two steps through the use of the current driver and the current driver circuit. Therefore, the current driving power of the transistor in each circuit when in the active state is small so that it is possible to suppress the peak current on the bit line and the influence on the unselected adjacent cell. In this operation, the canceling current flows through the adjacent bit line, by setting the generation of the bit line peak current and generation of the peak current of the canceling current to the same timing, it is possible to reliably suppress the influence of the peak current of the selected bit line on the unselected adjacent memory cell.

Figure 49:
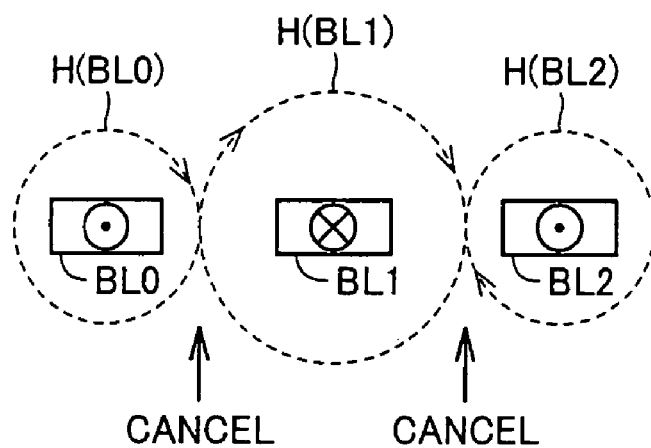
FIG. 49 diagrammatically shows magnetic fields induced by the bit lines in the data writing of the magnetic memory device shown in FIG. 43.

FIG. 49 schematically shows magnetic fields induced by the respective bit lines when bit line BL1 is selected. In FIG. 49, it is assumed that the current flows through bit line BL1 from front side of the drawing sheet of FIG. 49 to the rear side thereof, and the currents flow through bit lines BL0 and BL2 from the rear side of the drawing sheet of FIG. 49 toward the front side. In this case, the bit line write current flowing through bit line BL1 induces magnetic field H(BL1) in the direction opposite to that of magnetic field H(BL0) induced by the current (canceling current) flowing through bit line BL0, and magnetic fields H(BL0) and H(BL1) induced by bit lines BL0 and BL1, respectively cancel each other so that the influence exerted by bit line write magnetic field H(BL1) on the memory cell of bit line BL0 can be suppressed. Likewise, the direction of magnetic field H(BL1) of bit line BL1 is opposite to that of magnetic field H(BL2) induced by the current flowing through bit line BL2, and canceling magnetic field H(BL2) can cancel bit line write magnetic field H(BL1) so that the influence exerted by bit line write magnetic field H(BL1) on the memory cell connected to bit line BL2 can be suppressed.

Figure 50:
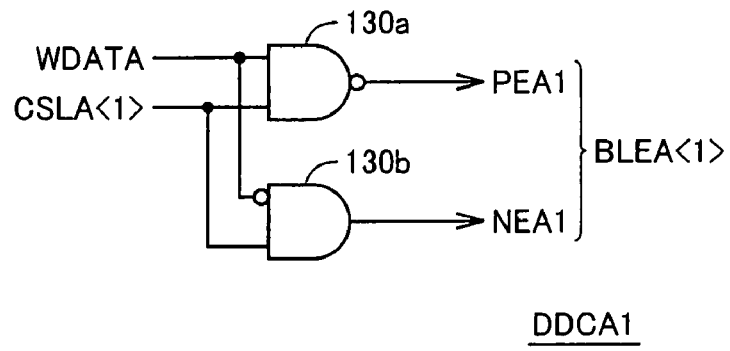
FIG. 50 shows, by way of example, a construction of a data decoder shown in FIG. 43.

FIG. 50 shows an example of a construction of data decoders DDCA0-DDCA2 and DDCC0-DDCC2 shown in FIG. 43. FIG. 50 representatively shows a construction of data decoder DDCA1. In FIG. 50, data decoder DDCA1 includes a NAND gate 130a receiving internal write data WDATA and column select signal CSLA<1> and producing a P-activation control signal PEA1, and a gate circuit NOR gate 130b for producing an N-activation control signal NEA1 according to internal write data WDATA and column select signal CSLA<1>. A set of these activation control signals PEA1 and NEA1 corresponds to bit line enable signal BLEA<1>. Gate circuit 30b drives N-activation control signal NEA1 to the H level when write data WDATA is at the L level and column select signal CSL<1> is at the H level, and otherwise, maintains N-activation control signal NEA1 at the L level.

Figure 51:
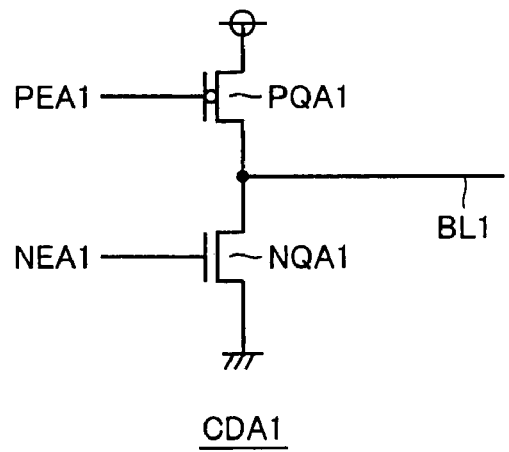
FIG. 51 shows, by way of example, a construction of a current driver shown in FIG. 43.

FIG. 51 shows an example of a construction of current drivers CDA0-CDA2 and CDC0-CDC2. Since these current drivers have the same structure, FIG. 51 representatively shows a construction of current driver CDA1. In FIG. 51, current driver CDA1 includes a P-channel MOS transistor PQA1 made conductive to supply a current to bit line BL1 when P-activation control signal PEA1 is at the L level, and an N-channel MOS transistor NQA1 made conductive to couple bit line BL1 to the ground node when N-activation control signal NEA1 is at the H level.

As shown in FIGS. 50 and 51, when internal write data WDATA and column select signal CSLA<1> are both at the H level, NAND gate 130a outputs P-activation control signal PEA1 at the L level, and gate circuit 130b outputs N-activation control signal NEA1 at the L level. Responsively, MOS transistor PQA1 is turned on to supply the current to bit line BL1.

When internal write data WDATA is at the L level and column select signal CSLA<1> is at the H level, NAND gate 130a outputs P-activation control signal PEA1 at the H level, and gate circuit 130b outputs N-activation control signal NEA1 at the H level. Responsively, MOS transistor NQA1 shown in FIG. 51 is turned on so that bit line BL1 is coupled to the ground node, and the current driver arranged on the other end side discharges the current to the ground node.

When column select signal CSLA<1> is at the L level, NAND gate 130a outputs P-activation control signal PEA1 at the H level, and gate circuit 130b outputs N-activation control signal NEA1 at the L level. Responsively, both MOS transistors PQA1 and NQA1 shown in FIG. 51 are kept off. Therefore, current drivers CDA0-CDA1 and CDC0-CDC2 enter the output high-impedance state when in the unselected state.

Figure 52:
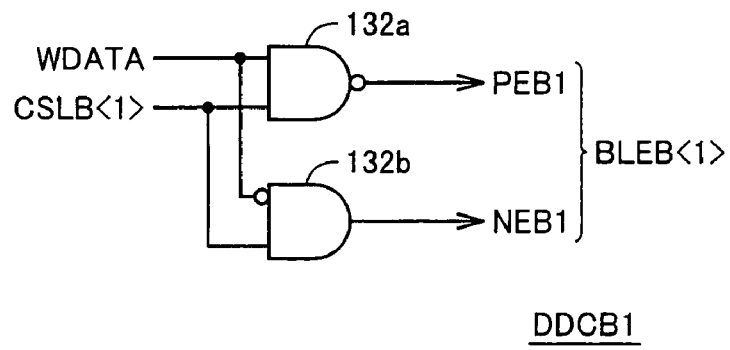
FIG. 52 shows, by way of example, a construction of the data decoder shown in FIG. 43.

FIG. 52 shows an example of a construction of data decoders DDCB0-DDCB2 and DDCD0-DDCD2. Since these data decoders have the same construction, FIG. 52 representatively shows the construction of data decoder DDCB1.

In FIG. 52, data decoder DDCB1 includes a NAND gate 132a receiving write data WDATA and column select signal CSLB<1> and producing a second P-activation control signal PEB1, and a gate circuit 132b receiving internal write data WDATA and column select signal CSLB<1> and producing a second N-activation control signal NEB1. Gate circuit 132b drives N-activation control signal NEB1 to the active state of H level when internal write data WDATA is at the L level and column select signal CSLB<1> is at the H level.

Data decoder DDCB1 has the same construction as data decoder DDCA1 shown in FIG. 50 except for the column select signals being applied.

Figure 53:
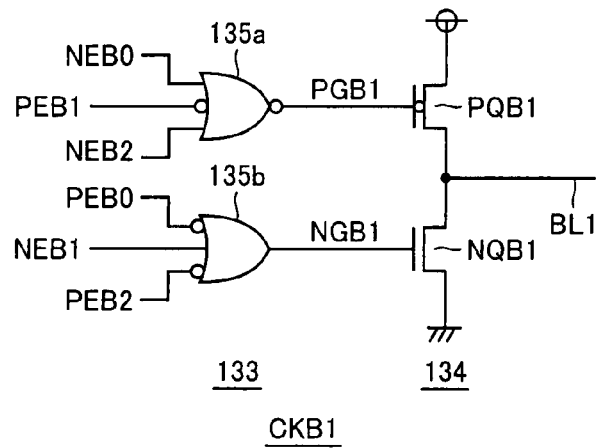
FIG. 53 shows, by way of example, a construction of the current driver circuit shown in FIG. 43.

FIG. 53 shows an example of construction of current driver circuits CKB0-CKB2 and CKD0-CKD2 shown in FIG. 43. Since these current driver circuits have the same construction, FIG. 53 representatively shows the construction of current driver circuit CKB1. In FIG. 53, current driver circuit CKB1 includes a drive control circuit 133 receiving the bit line enable signal (activation control signal) for an adjacent column and the bit line enable signal (activation control signal) outputted from the corresponding data decoder and producing the drive control signal, and a bit line current driver 134 for driving bit line BL1 according to drive control signals PGB1 and NGB1 provided from drive control circuit 133.

Drive control circuit 133 includes a gate circuit 135a receiving a P-activation control signal PEB1 outputted from the corresponding data decoder and N-activation control signals NEB0 and NEB2 outputted from the data decoders in the adjacent columns and producing drive control signal PGB1, and a gate circuit 135b receiving N-activation control signal NEB1 outputted from the corresponding data decoder and P-activation control signals PEB0 and PEB2 outputted from the data decoders in the adjacent columns and producing drive control signal NGB1.

Gate circuit 135a drives drive control signal PGB1 to the L level when P-activation control signal PEB1 is at the L level or N-activation control signal NEB0 or NEB2 outputted from the adjacent column is at the H level. Gate circuit 135b drives N-drive control signal NGB1 to the H level when corresponding N-activation control signal NEB1 is at the H level or P-activation control signal PEB0 or PEB2 outputted from the adjacent column is at the L level.

Bit line current driver 134 includes a P-channel MOS transistor PQB1 supplying a current to bit line BL1 according to drive control signal PGB1, and an N-channel MOS transistor NQB1 discharging the current from bit line BL1 according to drive control signal NGB1.

Figure 54:
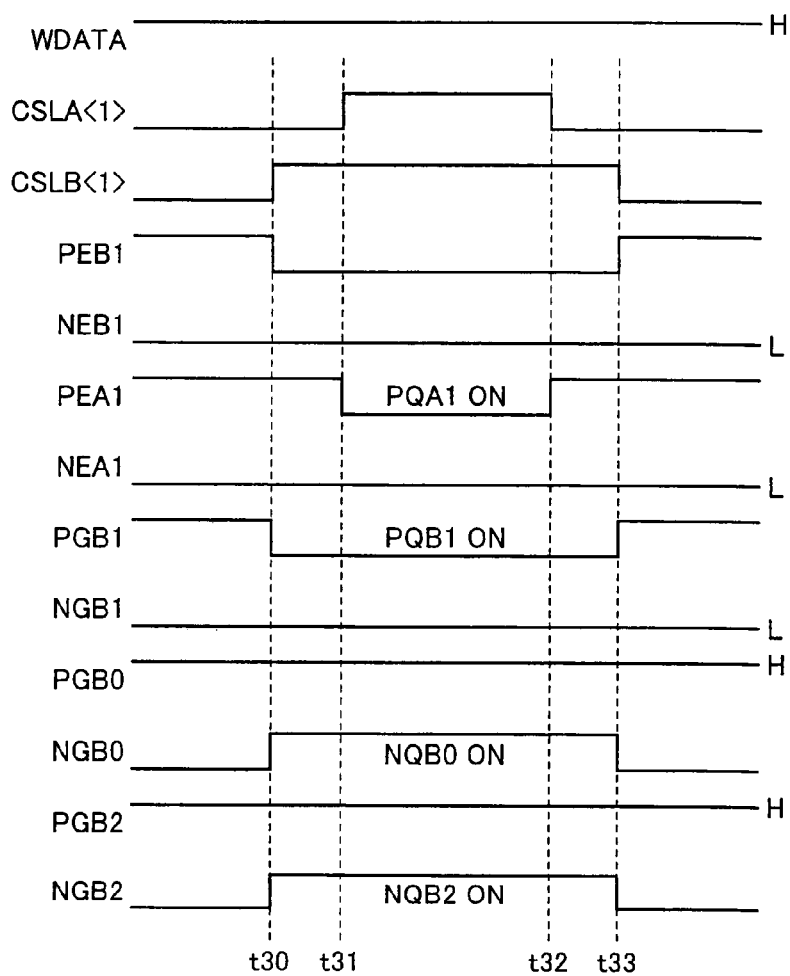
FIG. 54 is a signal waveform diagram representing an operation of the circuits shown in FIGS. 50-53.

FIG. 54 is a signal waveform diagram representing an operation of circuits shown in FIGS. 50-53. FIG. 54 represents operation waveforms in the case when write data WDATA is at the H level, and bit line BL1 is selected. Referring to FIG. 54, description will now be made of the operations of the circuits shown in FIGS. 50-53.

Before time t30, all column select signals CSLA<0>-CSLA<2> and CSLB<0>-CSLB<2> are at the L level, and all activation control signals PEA0-PEA2 and NEA0-NEA2 as well as all drive control signals PGB0-PGB2 and NGB0-NGB2 are inactive.

At time t30, column select signal CSLB<1> for the selected column is driven to the selected state of H level. Responsively, in data decoder DDCB1 shown in FIG. 52, N-activation control signal NEB1 maintains the L level, and P-activation control signal PEB1 changes from the H level to the L level. In response to the falling of P-activation control signal PEB1, drive control signal PGB1 outputted from gate circuit 135a in current driver circuit CKB1 shown in FIG. 53 attains the active state of L level so that MOS transistor PQB1 is turned on to supply the current to bit line BL1. In response to the falling of P-activation control signal PEB1, drive control circuits NGB0 and NGB2 outputted from gate circuits 135b in current driver circuits CKB0 and CKB2 in the adjacent columns attain the H level to turn on MOS transistors NQB1 of the current drivers. Accordingly, the current flows through bit lines BL0 and BL2 in an opposite direction to the current flowing through bit line BL1.

At time t31, first column select signal CSLA<1> is driven to the selected state so that P-activation control signal PEA1 applied from data decoder DDCA1 shown in FIG. 50 attains the L level, and responsively, MOS transistor PQA1 in current driver CDA1 shown in FIG. 51 is turned on. In current drivers CDA0 and CDA2 of the adjacent columns, since column select signals CSLA<0> and CSLA<2> are at the L level, P-activation control signals PEA0 and PEA2 are at the H level and the output high-impedance state is maintained.

At a time t32, column select signal CSLA<1> attains the L level. Accordingly, P-activation control signal PEA1 outputted from NAND gate 130a attains the H level, and P-channel MOS transistor PQA1 of current driver CDA1 is turned off. At this time point, column select signal CSLB<1> is still in the selected state, and current driver circuits CKB0-CKB2 drive bit lines BL0-BL2, respectively.

At a time t33, column select signal CSLB<1> attains the L level, and P-activation control signal PEB1 outputted from data decoder DDCB1 shown in FIG. 52 attains the H level. Responsively, drive control signal PGB1 outputted from gate circuit 135a of drive control circuit 133 shown in FIG. 53 attains the H level, and P-channel MOS transistor PQB1 in current driver circuit CKB1 is turned off. When P-activation control signal PEB1 rises to the H level, the drive control signals NGB0 and NGB2 attain the L level, and current driver circuit CKB0 and CKB2 have N-channel MOS transistors NQB1 turned off.

Figure 55:
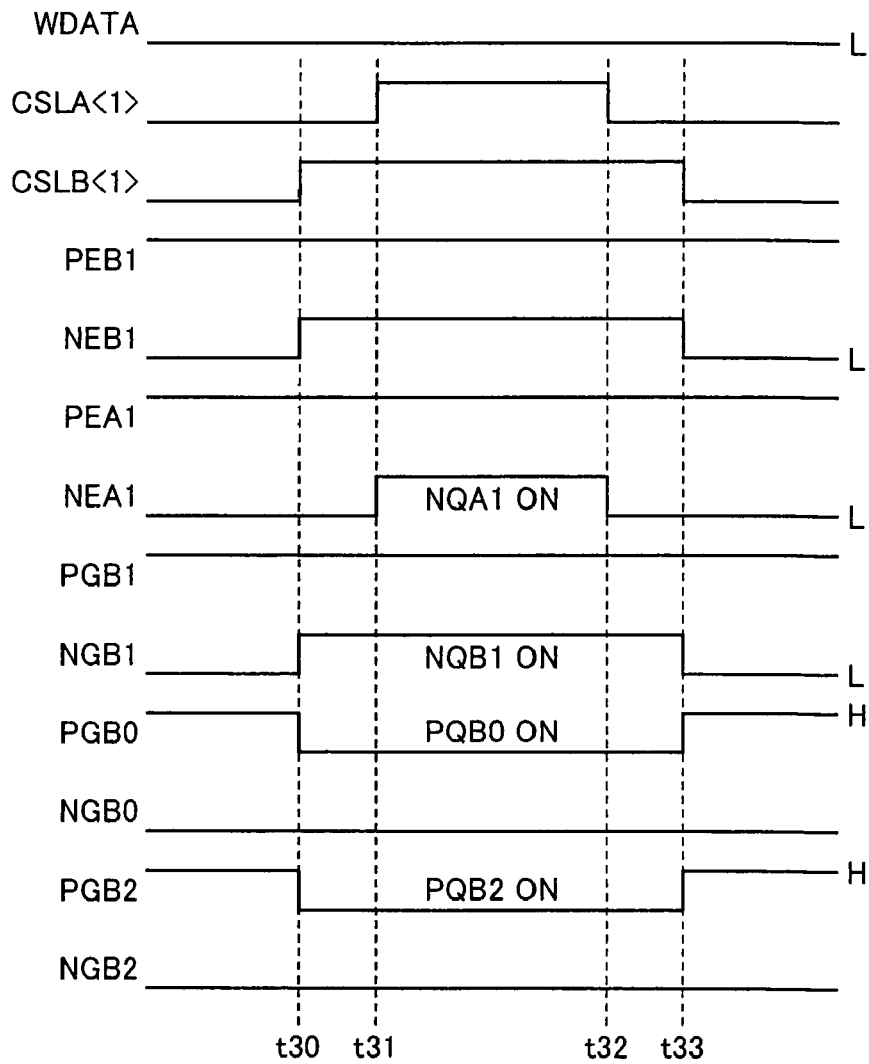
FIG. 55 is a signal waveform diagram representing an operation in data writing of the circuits shown in FIGS. 50-53.

FIG. 55 is a signal waveform diagram representing an operation of writing data "0" by the bit line write current control circuit shown in FIGS. 50 to 53. In the operation of writing data "0", write data WDATA is at the L level.

A state before time t30 is the same as that represented in the signal waveform diagram of FIG. 54, and bit lines BL0-BL2 are in the floating state.

At time t30, column select signal CSLB<1> rises to the H level. Responsively, N-activation control signal NEB1 outputted from gate circuit 132b attains the H level in data decoder DDCD1 shown in FIG. 52. P-activation control signal PEB1 maintains the H level. Accordingly, in current driver circuit CKB1 shown in FIG. 53, gate drive control signal NGB1 outputted from gate circuit 135b attains the H level, and N-channel MOS transistor NQB1 of current driver 134 is turned on.

In current driver circuits CKB0 and CKB2 of the adjacent columns, P-gate control signals PGB0 and PGB2 outputted from gate circuits 135a of the drive control circuits attain the L level in accordance with the rising of N-activation control signal NEB1, and P-channel MOS transistors PQB0 and PQB2 in current driver circuits 134 are turned on.

At time t31, column select signal CSLA<1> rises to the H level. Accordingly, N-activation control signal NEA1 applied from data decoder DDCA1 shown in FIG. 50 attains the H level, and N-channel MOS transistor NQA1 of current driver CDA1 shown in FIG. 51 is turned on.

At time t32, column select signal CSLA<1> falls to the L level. Accordingly, N-activation control signal NEA1 applied from data decoder DDCA1 shown in FIG. 50 attains the L level, so that N-channel MOS transistor NQA1 of current driver CDA1 shown in FIG. 51 is turned off.

At time t33, column select signal CSLB<1> falls to the L level. Accordingly, N-activation control signal NEB1 outputted from data decoder DDCB1 shown in FIG. 52 attains the L level so that drive control signal NGB1 in current driver circuit CKB1 shown in FIG. 53 attains the L level, and N-channel MOS transistor NQB1 is turned off. Likewise, in response to the falling of N-activation control signal NEB1 to the L level, gate drive control signals PGB0 and PGB2 applied from gate circuits 135a in current driver circuits CKB0 and CKB2 attain the H level, and P-channel MOS transistors PQB0 and PQB2 are turned off.

By using the constructions shown in FIGS. 50 to 53, the currents in the direction opposite to that flowing through a selected bit line are supplied to unselected bit lines adjacent to the selected bit line so that the leak magnetic field applied from the selected bit line can be cancelled.

Figure 56:
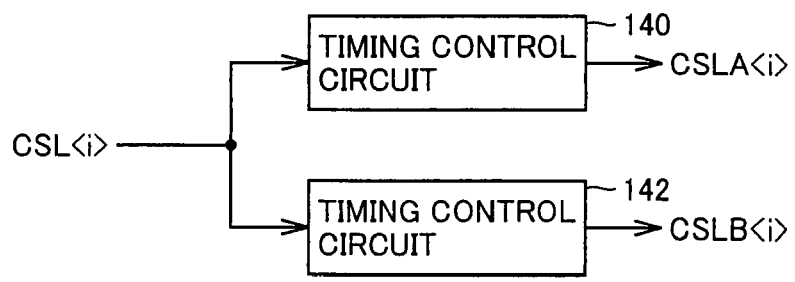
FIG. 56 shows an example of a construction of a section for generating a column select timing signal shown in FIG. 43.

FIG. 56 schematically shows a construction of a portion for generating column select signals CSLA<i> and CSLB<i>. In FIG. 56, the column select signal generating unit includes a timing control circuit 140 for producing column select signal CSLA<i> according to basic column select signal CSL<i> applied from the column decoder (not shown), and a timing control circuit 142 for producing column select signal CSLB<i> according to basic column select signal CSL<i>. Timing control circuits 140 and 142 have the constructions determined appropriately depending on a phase relationships between basic column select signal CSL<i> and column select signals CSLA<i> and CSLB<i>. For example, timing control circuit 140 is formed of a rise delay circuit, and timing control circuit 142 is formed of a fall delay circuit. For such construction, column select signal CSL<i> is maintained at the H level for a time period between times t30 and t32 shown in FIG. 54.

[Modification]

Figure 57:
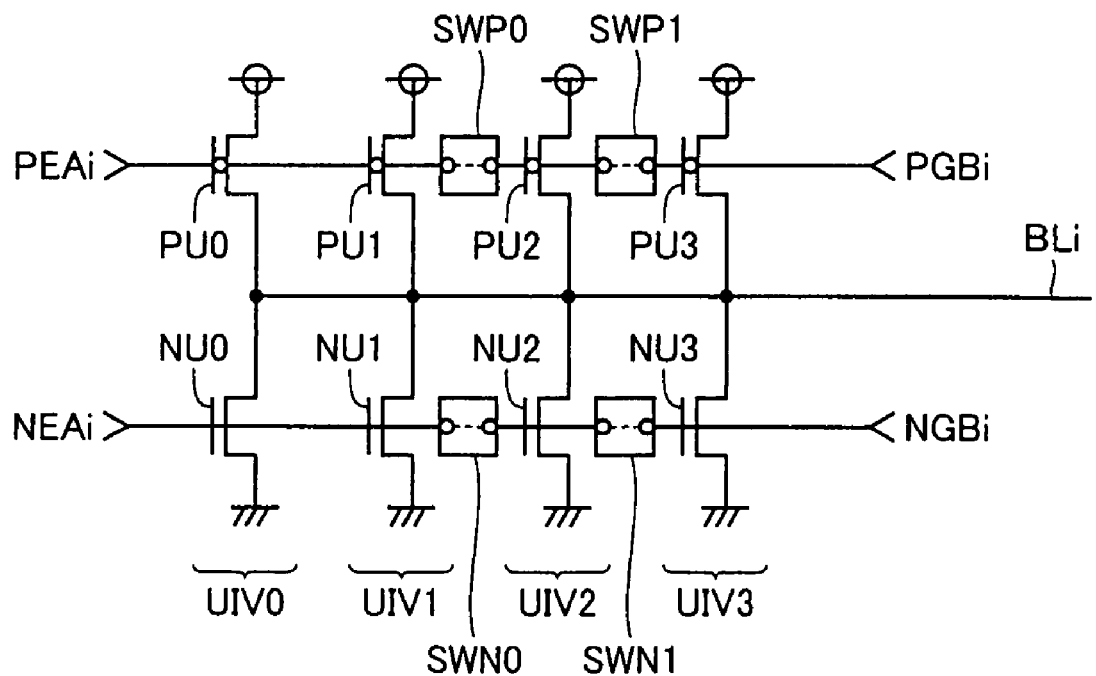
FIG. 57 shows, by way of example, a construction of a bit line current driver section according to a modification of a ninth embodiment of the invention.

FIG. 57 shows a modification of the ninth embodiment according to the invention. FIG. 57 shows a configuration of a current driver circuit provided for bit line BLi. In FIG. 57, four unit inverter circuits UIV0-UIV3 are arranged in parallel to bit line BLi. These unit inverter circuits UIVj (j=0-3) each have a configuration of a CMOS inverter formed of P- and N-channel MOS transistors PUj and NUj.

A switching element SWP0 is connected between gates of P-channel MOS transistors PU1 and PU2, and a switching element SWP1 is connected between gates of P-channel MOS transistors PU2 and PU3. A switching element SWN0 is connected between gates of N-channel MOS transistors NU1 and NU2, and switching element SWN1 is connected between gates of N-channel MOS transistors NU2 and NU3.

Drive control signal PGB1 is transmitted to switching element SWP1 via the gate of P-channel MOS transistor PU3, and is further transmitted via switching elements SWP1 and SWP3. Drive control signal NGBi is transmitted via the gate of N-channel MOS transistor NU3 as well as switching elements SWN1 and SWN0.

P-activation control signal PEAi is transmitted to switching element SWP0 via gates of MOS transistors PU0 and PU1. N-activation control signal NEAi is transmitted to switching element SWN0 via the gates of MOS transistors NU0 and NU1.

These switching elements SWP0, SWN0, SWP1 and SWN1 are selectively turned on or off. When switching elements SWP0 and SWN0 are set into a non-conductive state, and switching elements SWP1 and SWN1 are set into a conductive state, unit inverter circuits UIV0-UIV2 drive bit line BLi according to activation control signals PEAi and NEAi, and unit inverter circuit UIV3 drives bit line BLi according to drive control signals PGBi and NGBi. In driving the bit line BLi over the two stages, therefore, the ratio of the first drive current in the two-stage driving to the subsequent drive current for the bit line write current can be set to 1:3 (unit inverter circuits UIV0-UIV3 have the same size and the same current driving power). In supplying the canceling current, the ratio of bit line write current to the canceling current can be set to 4:1.

When switching elements SWP0 and SWN0 are set in a non-conductive state, and switching elements SWP1 and SWN1 are set into a conductive state, unit inverter circuits UIV0 and UIV1 drive bit line BLi according to activation control signals PEAi and NEAi, and unit inverter circuits UIV2 and UIV3 are driven according to drive control signals PGBi and NGBi. In selecting bit line BLi in this case, therefore, the bit line can be driven while dispersing peak currents of the same magnitude in two stages during the two-stage driving of the peak currents. Also, the ratio of the bit line write current to the canceling current can be set to 4:2.

The unit inverter circuits operating according to activation control signals PEAi and NEAi correspond to current drivers CDA0-CDA2 and CDC0-CDC2 shown in FIG. 43, and the unit inverter circuits operating according to drive control signals PGBi and NGBi, correspond to the current drive stage of current driver circuits CKB0-CKB2 and CKD0-CKD2 shown in FIG. 43. The set of switching elements SWP0 and SWN0 are turned on/off complementarily to the set of switching elements SWP1 and SWN1 so that the drive current amount in the two-stage driving by the bit line driver can be controlled without an additional transistor, and the canceling current for generating the cancel magnetic field can be set to an optimum value according to the disturb rate.

Figure 58:
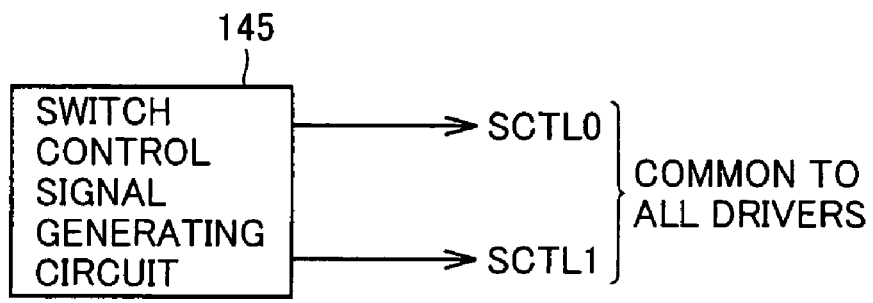
FIG. 58 shows, by way of example, a construction of a switch element control signal generating section shown in FIG. 57.

FIG. 58 shows an example of a construction of a portion for generating the signals for turning on/off switching elements SWP0, SWP1, SWN0 and SWN1 shown in FIG. 57. In FIG. 58, switch control signal generating circuit 145 produces switch control signals SCTL0 and SCTL1. Switch control signal SCTL0 is applied commonly to switching elements SWP0 and SWN0 of the current driver included in the bit line write current control circuit, and turns on/off them. Likewise, switch control signal SCTL1 is applied commonly to switching elements SWP1 and SWN1 of the current driver and current drive circuit included in the bit line write current control circuit.

Switch control signal generating circuit 145 may be formed of, e.g., a fuse program circuit, or may be configured to have a voltage level of the activating signal set through a mask interconnection line. Further, switch control signal generating circuit 145 may be formed of a latch circuit utilizing an RAM cell.

As an alternative to the construction utilizing this switch control signal generating circuit 145, switching elements SWP0, SWP1, SWN0 and SWN1 have the conduction/non-conduction state set through mask interconnection.

According to the ninth embodiment of the invention, as described above, the bit line current driver is divided into two drivers, which are sequentially activated with the activation timings staggered, so that the peak current at the time of supply of the bit line write current can be suppressed. Further, one of the bit line current drivers is utilized for generating the canceling current. Thus, the magnetic disturbance in the memory cell of the bit line adjacent to the selected bit line can be suppressed without an additional circuit.

Further, the canceling current flows for a time period longer than that of the flow of the bit line write current. Thus, the cancel magnetic field can be reliably produced while the bit line write current is flowing, and the leak magnetic field from the selected bit line can be cancelled more accurately.

By adjusting the number of stages each formed of the single-inverter set by providing the switching elements, it is possible to set the canceling current to the optimum value depending on the intensity of the leak magnetic field while suppressing the peak current in the bit line write operation.

Tenth Embodiment

Figure 59:
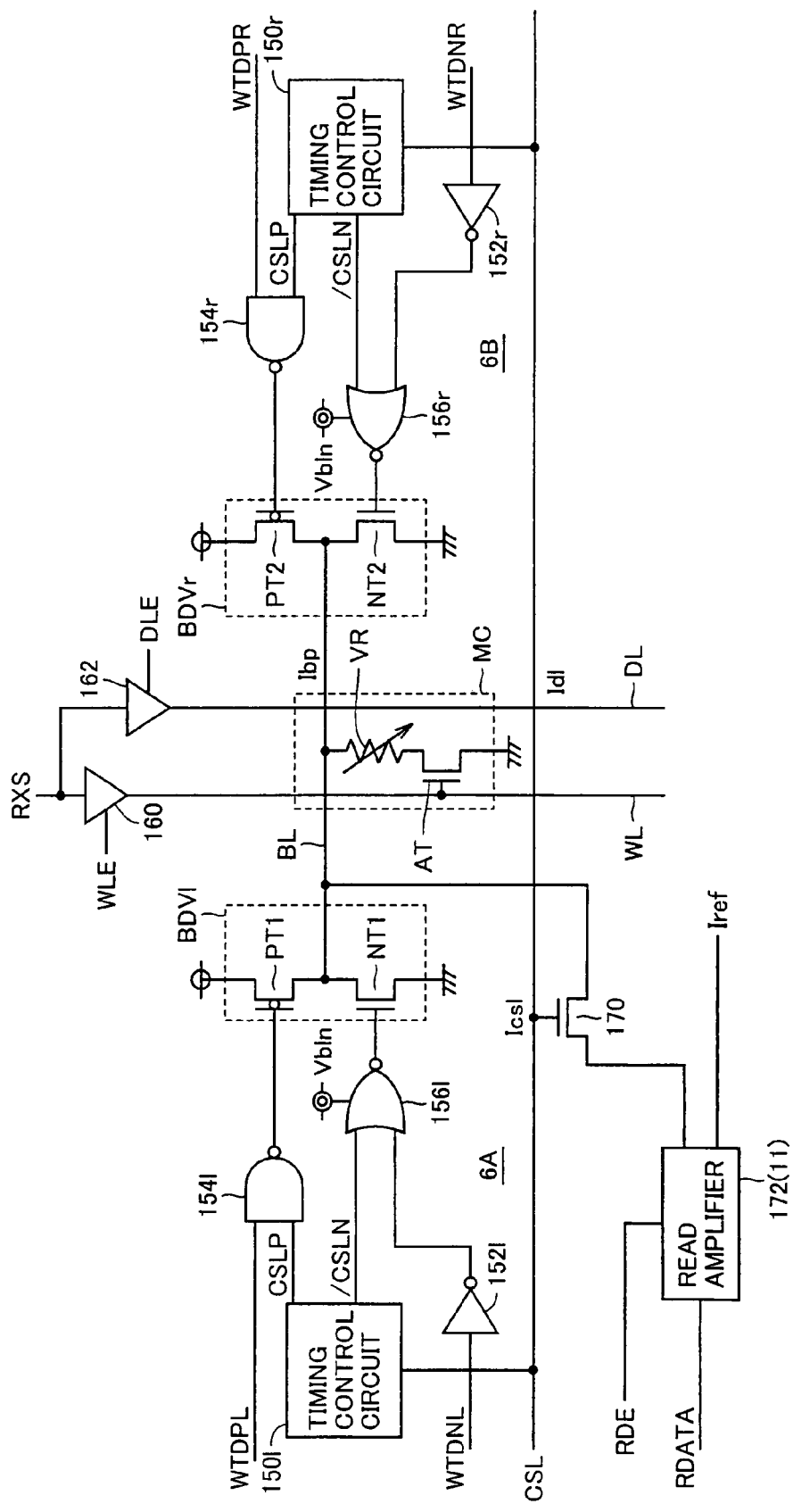
FIG. 59 conceptually shows a construction of a main portion of a magnetic memory device according to a tenth embodiment of the invention.

FIG. 59 schematically shows a construction of a main portion of a magnetic memory device according to a tenth embodiment of the invention. FIG. 59 shows a construction of a portion for writing and reading data with bit line BL.

In FIG. 59, bit line write current control circuits 6A and 6B for writing data are provided for bit line BL. Bit line write current control circuit 6A includes a timing control circuit 150*l* activating/deactivating timing control signals CSLP and /CSLN at substantially the same timing in accordance with the column select signal on a column select line CSL, an inverter 152*l* receiving a write timing signal WTDNL, a NAND gate 154*l* receiving a write timing signal WTDPL and timing control signal CSLP, a NOR gate 156*l* receiving timing control signal /CSLN and an output signal of inverter 152*l*, and bit line current driver BDV1 for driving bit line BL according to output signals of NAND gate 154*l* and NOR gate 156*l*. Column select line CSL extends in the column direction over the memory cell array, and transmits the column select signal outputted from the column decoder. Write timing signals WTDPL and WTDNL are produced based on the write data. NOR gate 156*l* receives, as a high-side power supply voltage, a voltage Vbln intermediate between power supply voltage VDD and the ground voltage.

Similarly to the construction shown in FIG. 39, bit line current driver BDV1 includes P-channel MOS transistor PT1 connected between the power supply node and bit line BL and receiving on their gates the output signal of NAND gate 154*l*, and N-channel MOS transistor NT1 connected between bit line BL and the ground node and receiving on its gate the output signal of NOR gate 156*l*.

Likewise, bit line write current control circuit 6B includes a timing control circuit 150*r* producing timing control signals CSLP and /CSLN according to the column select signal on column select line CSL, an inverter 152*r* receiving write timing signal WTDNR, a NAND gate 154*r* receiving timing control signal CSLP and write timing signal WTDPL, a NOR gate 156*r* receiving timing control signal /CSLN and an output signal of inverter 152*r*, and a bit line current driver BDVr for driving a current to bit line BL according to output signals of NAND gate 154*r* and NOR gate 156*r*. Write timing signals WTDPR and WTDNR are produced based on the write data. Similarly to NOR gate 156*l*, NOR gate 156*r* receives, as a high-side power supply voltage, the intermediate voltage Vbln.

Bit line current driver BDVr includes P-channel MOS transistor PT2 for supplying the current to bit line BL when the output signal of NAND gate 154r is at the L level, and an N-channel MOS transistor NT2 turning conductive to discharge the current from bit line BL to the ground node when the output signal of NOR gate 156r is at the high level (i.e., the level of the intermediate voltage).

Word line WL and digit line DL are arranged crossing bit line BL, and a memory cell MC is arranged at a crossing between bit line BL, and word line WL and digit line DL. Memory cell MC includes magneto-resistance element VR electrically coupled to bit line BL and magnetically coupled to digit line DL. Memory cell MC further includes an access transistor AT for coupling magneto-resistance element VR to the ground node (source line) according to the signal potential on word line WL. Word line WL and digit line DLA are driven by word line driver 160 and a digit line driver 162, respectively. Word line driver 160 drives word line WL to the selected state according to row select signal RXS when a word line enable signal WLE is active. Digit line driver 162 supplies a current to digit line DL according to a row select signal RXS when digit line enable signal DLE is active. Digit line DL has an end coupled to the ground node, although not shown. Row select signal RXS is produced by the row decoder (not shown).

For column select line CSL, there is further arranged a read column select gate 170 that selectively turns conductive according to the column select signal on column select line CSL, to couple bit line BL to a read amplifier 172 when made conductive. Read amplifier 172 corresponds to read amplifier 11 shown in FIG. 7, and produces internal read data RDATA based on a reference current Iref and the current flowing through bit line BL when a read enable signal RDE is active. Therefore, read amplifier 172 includes a read current supply section for supplying a memory cell read current to bit line BL when made active, and a current sense circuit for comparing the current flowing through bit line BL with reference current Iref.

In the construction shown in FIG. 59, column select line CSL transmits the column select signal in both the data write operation and the data read operation. Therefore, the column decoder driving column select line CSL is commonly used for the data writing and for the data reading.

Figure 60:
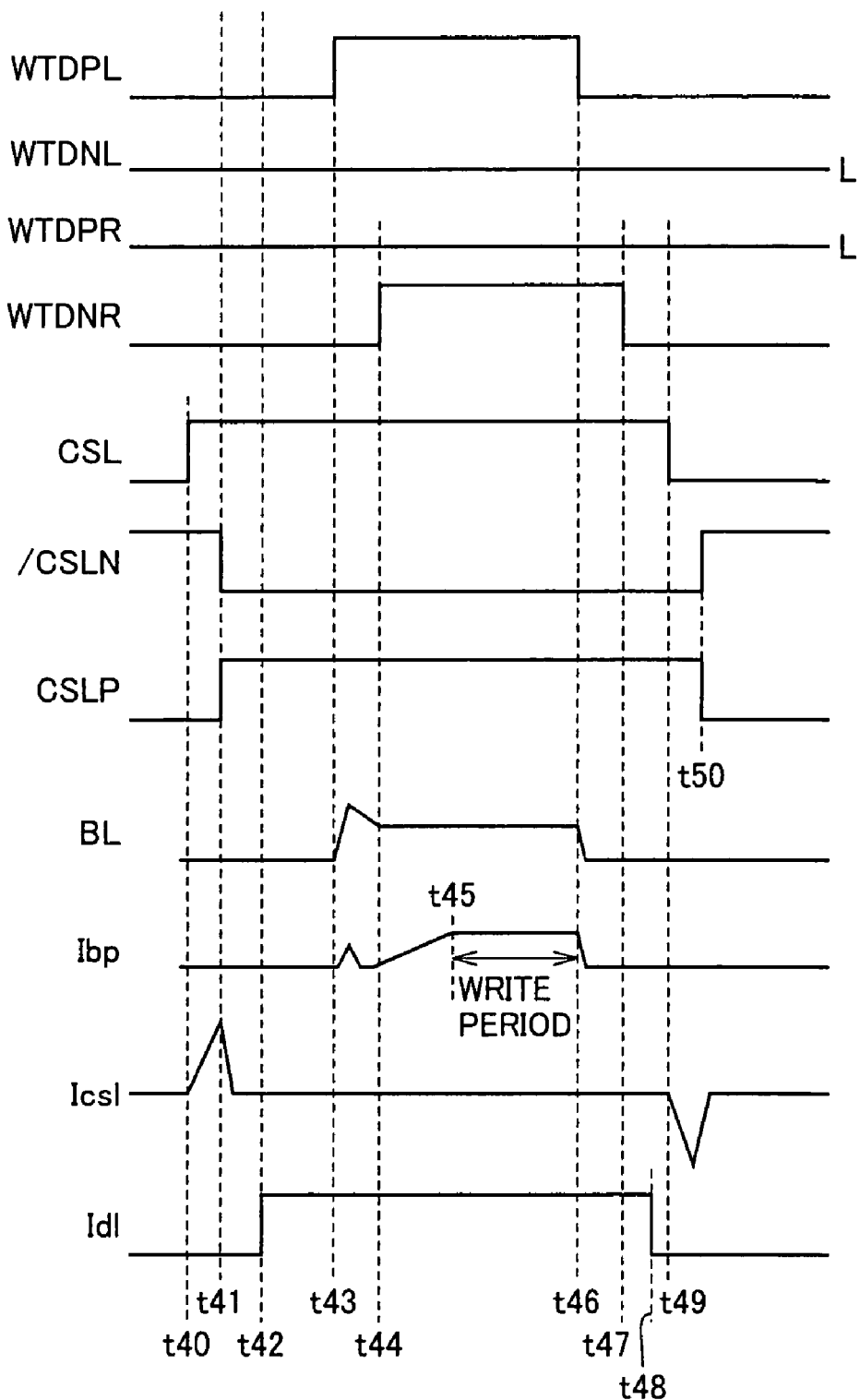
FIG. 60 is a signal waveform diagram representing an operation of the magnetic memory device shown in FIG. 59.

FIG. 60 is a signal waveform diagram representing an operation in data writing of the magnetic memory device shown in FIG. 59. Referring to FIG. 60, description will now be made of the data write operation of the magnetic memory device shown in FIG. 59.

Before a time t40, all write timing signals WTDPL, WTDNL, WTDPR and WTDNR are at the L level. The column select signal on column select line CSL is in an unselected state. Therefore, current drivers BDV1 and BDVr are in the output high-impedance state, and bit line BL is in the floating state. Digit line DL and word line WL are also in the unselected state.

When the data write cycle starts at time t40, column select line CSL is driven to the selected state according to an applied address signal (not shown), and a large peak current flows due to a distribution of parasitic capacitance over column select line CSL. In FIG. 60, a current Icsl represents the current on the column select line.

At a time t41, the voltage on column select line CSL attains the H level. Thereby, timing control circuits 150l and 150r drive timing control signal CSLP to the H level, and drive timing control signal /CSLN to the L level according to the column select signal on column select line CSL. Accordingly, NAND gates 154l and 154r as well as NOR gates 156l and 156r operate as inverters. In this state, all write timing signals WTDPL, WTDNL, WTDPR and WTDNR are at the L level, and bit line current drivers BDV1 and BDVr maintain the output high-impedance state.

When column select line CSL is driven to the power supply voltage level at its farthest end, column select line current Icsl attains 0. When column select line current Icsl attains 0, digit line enable signal DLE is made active at a time t42, to supply the current to digit line DL from digit line driver 162 so that digit line current Idl flows. Since digit line DL is coupled only magnetically to the magneto-resistance element, the parasitic capacitance is small so that digit line Idl does not cause a large ringing (due to small parasitic capacitance), and rapidly reaches a predetermined current level.

After digit line current Idl becomes stable, write timing signal WTDPL is first driven to the H level according to the write data of "1" at time t43. Responsively, NAND gate 154l shown in FIG. 59 generates the output signal at the L level, and MOS transistor PT1 in current driver BDV1 is turned on to supply the current to bit line BL. At this time point, write timing signal WTDNR is still at the L level, and N-channel MOS transistors NT1 and NT2 in respective current drivers BDV1 and BDVr are in a non-conductive state. Therefore, the peak current on bit line BL can be suppressed, and such a situation is prevented that the magnetic field produced by digit line current Idl and bit line current Ibp adversely affect an unselected adjacent memory cell.

When bit line current Ibp attains 0 and bit line BL attains a stable voltage level, write timing signal WTDNR is driven to the H level at a time t44. Responsively, the output signal of NOR gate 156r attains the level of intermediate voltage Vbln, and MOS transistor NT2 in current driver BDVr turns conductive to discharge the current from bit line BL. In this operation, the current driving power of MOS transistor NT2 is controlled, and bit line current Ibp increases to the bit line current value determined by the current driving power of MOS transistor NT2.

When bit line write current Ibp attains a constant value at a time t45, writing of data into the memory cell starts.

At a time t46, write timing signal WTDPL attains the L level, and responsively, NAND gate 154l outputs the output signal at the H level so that MOS transistor PT1 in bit line current driver BDV1 is turned off to stop supply of bit line write current Ibp. In this state, MOS transistor NT2 in bit line current driver BDVr discharges bit line BL to the ground voltage level.

After bit line BL is precharged to the ground voltage level, write timing signal WTDNR is driven to the L level at a time t47. Responsively, the output signal of NOR gate 156r attains the L level, and MOS transistor NT2 in bit line current driver BDVr is turned off so that bit line BL enters the floating state.

Then, digit line enable signal DLE is made inactive to stop supply of digit line current Idl at a time t48. Since the supply of digit line current Idl stops after bit line BL is already precharged to the ground voltage level, such a situation is prevented from occurring that the voltage drop of digit line DL is transmitted to the bit line through capacitive coupling, and responsively, the bit line voltage attains the level different from the ground voltage.

After digit line DL is driven to the unselected state, column select line CSL is driven to the unselected state at a time t49, and then timing control signals CSLP and /CSLN are driven to the L and H levels at a time t50, respectively. Such a situation is prevented that the signal change on the column select line is transmitted to the bit line to set the bit line at a voltage level different from the ground voltage level.

According to such a sequence of driving to the unselected state, even if a peak current of column select line current Icsl flows in a reverse direction, this peak current flow occurs after the row selection operation is completed, and such a situation can be prevented that the magnetic field induced by the peak current on column select line current Icsl affects the selected memory cell.

As described above, when column select line CSL is driven to the selected state to cause a peak current to flow through the column select line, a digit line is selected, and subsequently the current is supplied to bit line BL. In this sequence, therefore, digit line DL as well as bit line BL are in the unselected state when column select line CSL is driven to the selected state. Therefore, column select line current Icsl does not cause erroneous writing in the selected memory cell. Similarly to the previous embodiment, the bit line peak current can be suppressed by driving bit line BL in two stages, and accordingly the erroneous writing in the unselected adjacent memory cell can be prevented. When column select line CSL transitions to the unselected state, digit line DL is already in the unselected state, so that peak current on this column select line does not cause the erroneous writing in the selected memory cell.

In this data writing operation, read column select gate 170 is turned on according to the column select signal on column select line CSL. However, read enable signal RDE is inactive, and maintains read amplifier 172 in the inactive state to supply no read current to bit line BL.

Figure 61:
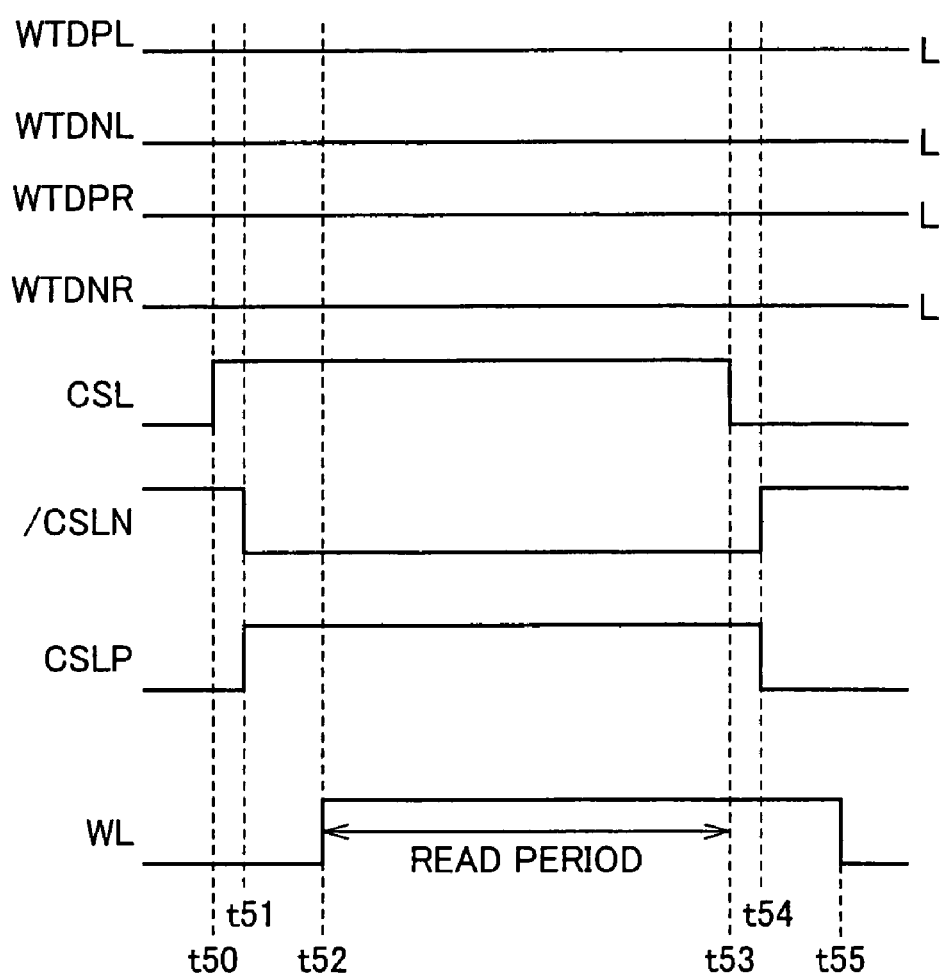
FIG. 61 is a signal waveform diagram representing an operation in data reading of the magnetic memory device shown in FIG. 59.

FIG. 61 is a signal waveform diagram representing an operation in data reading of the magnetic memory device shown in FIG. 59. Referring to FIG. 61, description will now be made of the data read operation of the magnetic memory device shown in FIG. 59.

In the data read operation, all write timing signals WTDPL, WTDNL, WTDPR and WTDNR are at the L level. In this state, therefore, bit line current drivers BDV1 and BDVr are kept in the output high-impedance state regardless of the state of the column select signal.

At a time t50, column select line CSL is driven to the selected state so that read column select gate 170 is turned on to couple bit line BL to read amplifier 172.

In response to the driving of column select line CSL to the selected state, timing control signals CSLP and /CSLN are driven to the H- and L levels at a time t51, respectively. In this state, all write timing signals WTDPL, WTDNL, WTDPR and WTDNR are at the L level, and bit line current drivers BDV1 and BDVr maintain the output high-impedance state.

At a time t52, word line driver 160 is activated according to word line enable signal WLE, and drives a word line WL designated by row select signal RXS to the selected state. When word line WL is driven to the selected state, access transistor AT in memory cell MC is turned on to couple magneto-resistance element VR to the ground node. Read amplifier 172 supplies the read current to bit line BL according to the activation of read amplifier enable signal RDE, and internal read data RDATA is produced based on comparison between the current flowing from bit line BL through memory cell MC to the ground node and reference current Iref.

At a time t53, column select line CSL is driven to the unselected state to turn off read column select gate 170, so that the data read period is completed. In response to the deactivation of column select line CSL, signals CSLP and /CSLN are driven to the H and L levels at a time t54, respectively.

At a time t55, word line enable signal WLE is made inactive, and word line driver 160 drives the word line WL to the unselected state.

In the data read operation, the timing of driving word line WL to the selected state and the timing of activating read amplifier 172 are set according to the following relationship, for example: after selection of column select line CSL, read amplifier 172 becomes active to supply the read current to bit line BL, to precharge the bit line BL to the read voltage level; thereafter, word line WL is driven to the selected state. The peak current of the read current on bit line BL is suppressed, and the data is accurately read based on the difference between the bit line current and reference current Iref.

Figure 62:
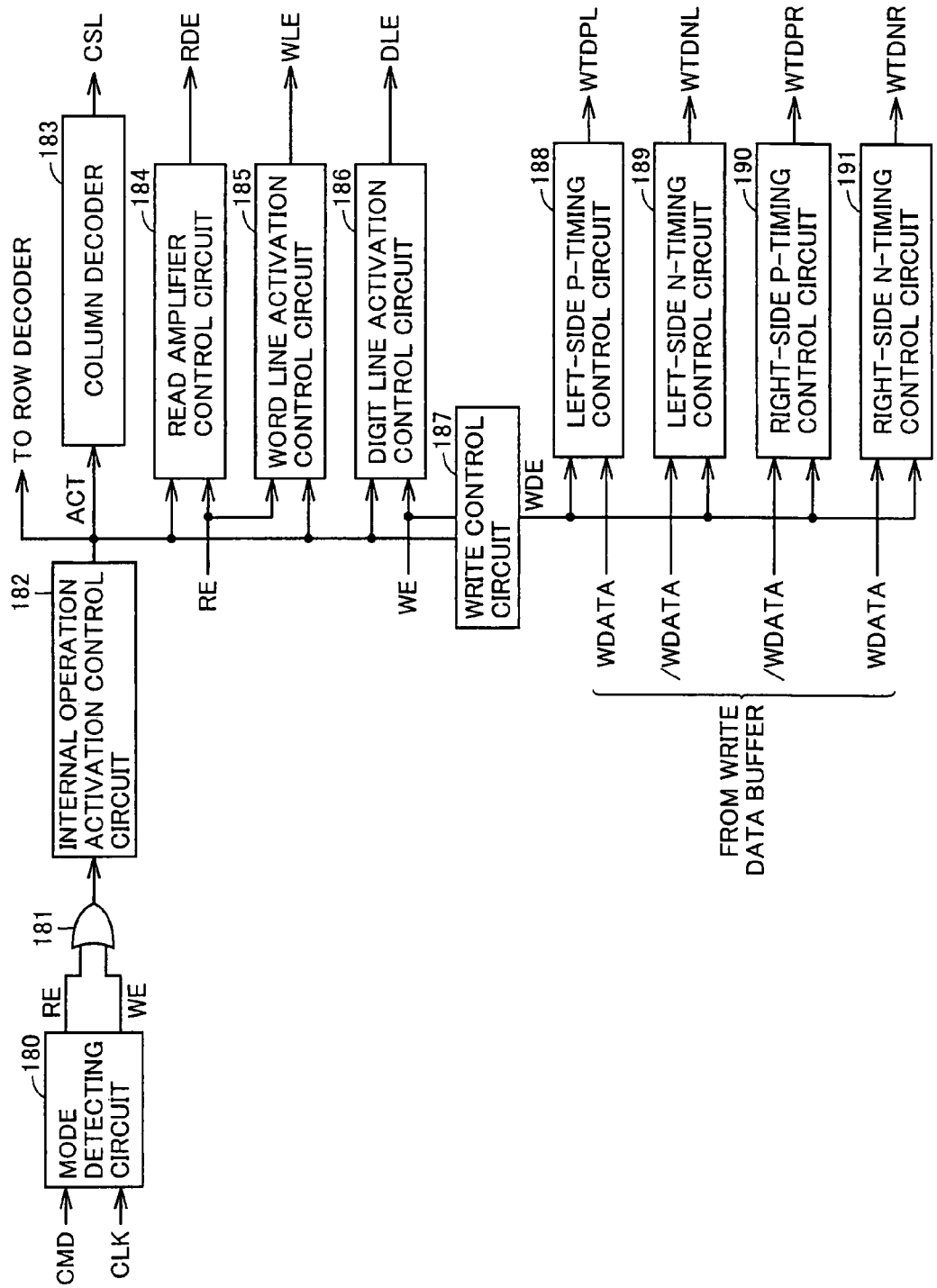
FIG. 62 shows by way of example a construction of a section for generating control signals in the magnetic memory device shown in FIG. 59.

FIG. 62 schematically shows a construction of a section for generating the various control signals shown in FIG. 59. In FIG. 62, the control signal generating section includes a mode detecting circuit 180 receiving a command CMD externally instructing an operation mode and clock signal CLK and activating a read mode instructing signal RE and a write mode instructing signal WE, an OR gate 181 receiving the read mode instructing signal RE and write mode instructing signal WE, and an internal operation activation control circuit 182 producing internal operation activating signal ACT according to an output signal of OR gate 181. Mode detecting circuit 180 takes in externally applied command CMD in synchronization with clock signal CLK. When command CMD taken at the edge of the clock signal instructs the data read mode, read mode instructing signal RE becomes active. When command CMD instructs the data write mode, write mode instructing signal WE becomes active. These read and write mode instructing signals RE and WE become active during the read and write cycle periods, respectively.

Internal operation activation control circuit 182 drives internal operation activating signal ACT to the active state at a predetermined timing when OR gate 181 generates the output signal at the H level (active state), and holds the output signal in the active state for a predetermined period. Internal operation activating signal ACT determines the internal operation active period. Internal operation activating signal ACT is applied to a column decoder 183 that decodes a column address signal (not shown) according to the activation of internal operation activating signal ACT, and drives a column select line CSL corresponding to a selected column to the selected state. This internal operation activating signal ACT is also applied to the row decoder so that the row select operation is performed, and row select signal RXS shown in FIG. 59 is produced.

The control signal generating section further includes a read amplifier control circuit 184 for producing read amplifier enable signal RDE according to read mode instructing signal RE and internal operation activating signal ACT, a word line activation control circuit 185 for activating word line enable signal WLE according to read mode instructing signal RE and internal operation activating signal ACT, a digit line activation control circuit 186 for producing digit line enable signal DLE according to write mode instructing signal WE and internal operation activating signal ACT, and a write control circuit 187 for producing write enable signal WDE according to predetermined timing in accordance with write mode instructing signal WE and internal operation activating signal ACT.

Read amplifier control circuit 184 sets read amplifier enable signal RDE to the active state for a predetermined period when read mode instructing signal RE and internal operation activating signal ACT are active. Word line activation control circuit 185 activates word line enable signal WLE when read mode instructing signal RE and internal operation activating signal ACT are active. Word line enable signal WLE is activated with a delay from activation of read amplifier enable signal RDE. After the supply of the read current to the bit line becomes stable, the word line to be selected is driven to the selected state.

Digit line activation control circuit 186 drives digit line enable signal DLE to the active state according to the activation of write mode instructing signal WE and the activation of internal operation activating signal ACT. After internal operation activating signal ACT becomes active and column decoder 183 performs the decode operation, digit line enable signal DLE becomes active.

Signals RDE, WLE and DLE, which are provided from read amplifier control circuit 184, word line activation control circuit 185 and digit line activation control circuit 186, respectively, are activated and deactivated at appropriate timings internally determined through the use of delay circuits, for example.

The control signal generating section further includes a left-side P-timing control circuit 188 for producing write timing signal WTDPL according to write enable signal WDE and internal write data WDATA, a left-side N-timing control circuit 189 for producing write timing signal WTDNL according to complementary internal write data /WDATA and write enable signal WDE, a right-side P-timing control circuit 190 for producing write timing signal WTDPR according to complementary internal write data /WDATA and write enable signal WDE, a right-side N-timing control circuit 191 for producing write timing signal WTDNR according to write enable signal WDE and internal write data WDATA.

P-timing control circuits 188 and 190 have the same construction, and N-timing control circuits 189 and 191 have the same construction. P-timing control circuits 188 and 190 are each formed of, e.g., an AND gate, and N-timing control circuits 189 and 191 are each formed of an AND gate and a delay circuit delaying the output signal of this AND gate. Specifically, after column select signal CSL is driven to the selected state, write control circuit 189 activates write enable signal WDE at an appropriate timing, and responsively, one of write timing signal WTDPL and WTDPR is driven to the H level. When a predetermined period elapses after write timing signal WTDPL and WTDPR becomes active, write timing control signal WTDNL or WTDNR for the bit line discharging N-channel MOS transistor is driven to the active state of H level. After write timing signal WTDPL or WTDPR becomes inactive, write timing signal WTDNL or WTDNR is driven to the inactive state. Delay times for activation/deactivation of these write timing signals WTDPL and WTDPR as well as write timing signals WTDNL and WTDNR are appropriately determined by delay circuits.

By using the control signal generating section shown in FIG. 62, the row and column selection as well as write and read of data in and from memory cells can be performed by using column decoder 183 and the row decoder in both the data write operation and the data read operation.

According to the tenth embodiment of the invention, as described above, the column select line, digit line and bit line are driven in this order for the data writing, and then are driven to the inactive state in the order of the bit line, digit line and column select line. Therefore, superimposing of the peak current on each line can be prevented, and such a situation can be prevented from occurring that a magnetic field induced by a peak current changes the data stored in a selected cell and an unselected memory cell.

The write timing signal determines the write timing in data writing, and the word line determines the read timing in data reading. Thus, the column select line can be driven to the selected state at the same timing both in the data write operation and in the data read operation, and the column select line can be shared between the read and write operations so that the circuit layout area can be reduced.

Eleventh Embodiment

Figure 63:
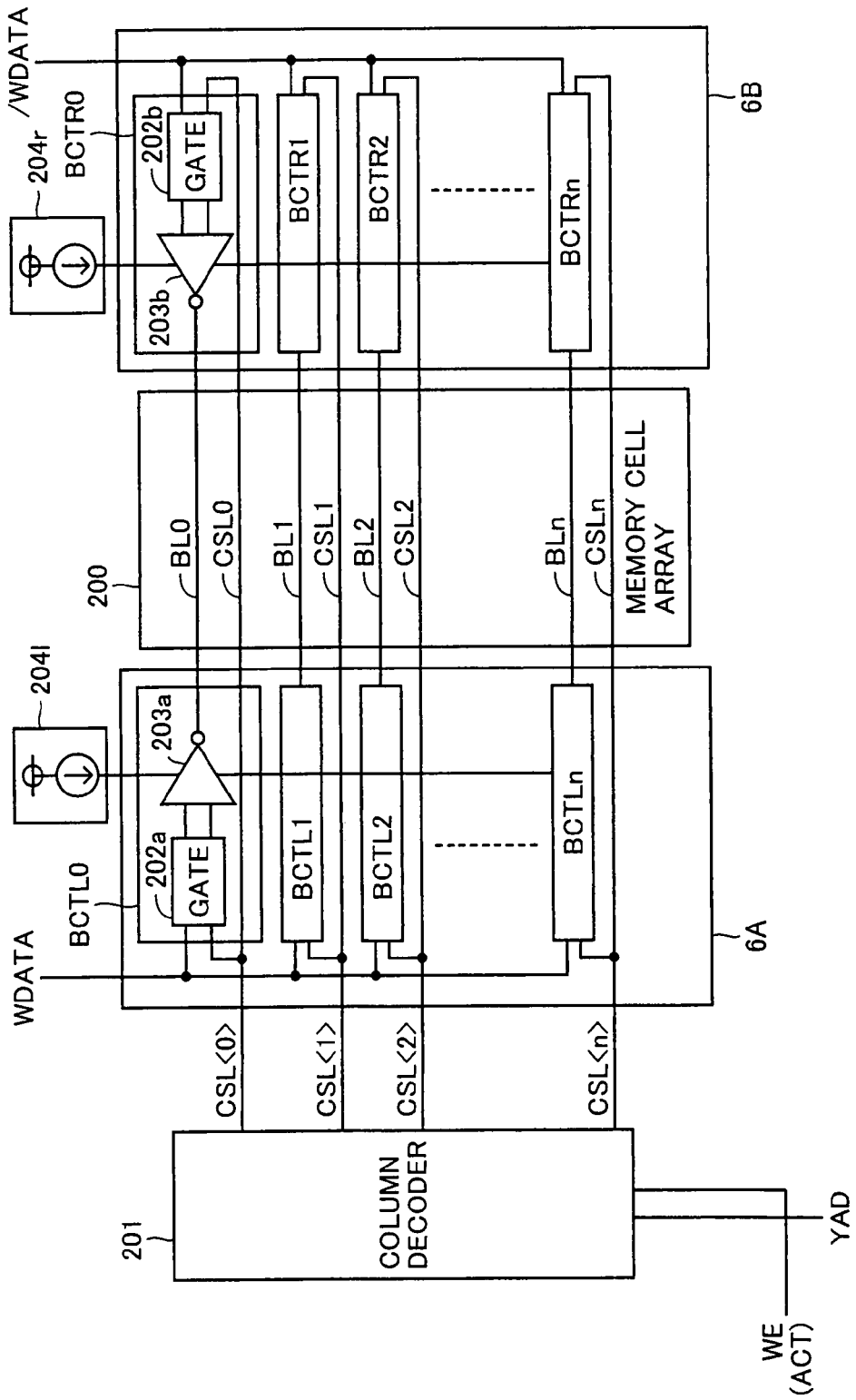
FIG. 63 schematically shows a whole structure of a magnetic memory device according to an eleventh embodiment of the invention.

FIG. 63 schematically shows a construction of a main portion of a magnetic memory device according to an eleventh embodiment of the invention. Referring to FIG. 63, bit line write current control circuits 6A and 6B are arranged on opposite sides of a memory cell array 200, respectively. Column select lines CSL0-CSLn are arranged extending in a column direction over memory cell array 200. Column select lines CSL0-CSLn receive column select signals CSL<0>-CSL<n> from a column decoder 201, respectively. Column decoder 201 drives one of column select signals CSL<0>-CSL<n> to the selected state according to write mode instructing signal WE (internal operation activating signal ACT: refer to FIG. 62) and a column address signal YAD.

Bit line write current control circuit 6A includes current control drive circuits BCTL0-BCTLn provided corresponding to bit lines BL0-BLn, respectively. Since control drive circuits BCTL0-BCTLn have the same construction, FIG. 63 representatively shows a construction of control drive circuit BCTL0. Control drive circuit BCTL0 includes a gate circuit 202a receiving internal write data WDATA and column select signal CSL<0>, and a current driver 203a for driving bit line BL0 according to an output signal of gate circuit 202a. Other control drive circuits BCTL1-BCTLn commonly receive internal write data WDATA, and each drives a corresponding bit line in the direction determined by internal write data WDATA when a corresponding one of column select signals CSL<1>-CSL<n> is selected.

Current drivers 203a in control drive circuits BCTL0-BCTLn are commonly supplied with a constant current from a current supply 204l. Gate circuit 202a may have any one of the constructions in the first to tenth embodiments already described, and alternatively may have a conventional construction. Current driver 203a has a construction of a tri-state inverter buffer, and is set to the output high-impedance state when it is not selected.

Likewise, bit line write current control circuit 6B includes control drive circuits BCTR0-BCTRn provided corresponding to bit lines BL0-BLn, respectively. These control drive circuits BCTR0-BCTRn are commonly supplied with complementary internal write data /WDATA, and are also supplied with column select signals CSL<0>-CSL<n>, respectively. Since control drive circuits BCTR0-BCTRn have the same construction, FIG. 63 representatively shows a construction of control drive circuit BCTR0. Control drive circuit BCTR0 includes a gate circuit 202b receiving complementary internal write data /WDATA and column select signal CSL<0>, and a current driver 203b for supplying a current to bit line BL0 according to the output signal of gate circuit 202b. Gate circuit 202b has the same construction as gate circuit 202a, and may have the construction of any of the first to tenth embodiment, or a construction similar to a conventional construction. Current drivers 203b included in control drive circuits BCTR0-BCTRn are commonly supplied with a constant current from a current supply 204r. Control drive circuits BCTR0-BCTRn drive the currents to the corresponding bit lines in the direction determined by complementary internal write data /WDATA when corresponding column select signals CSL<0>-CSL<n> are selected, respectively.

Figure 64:
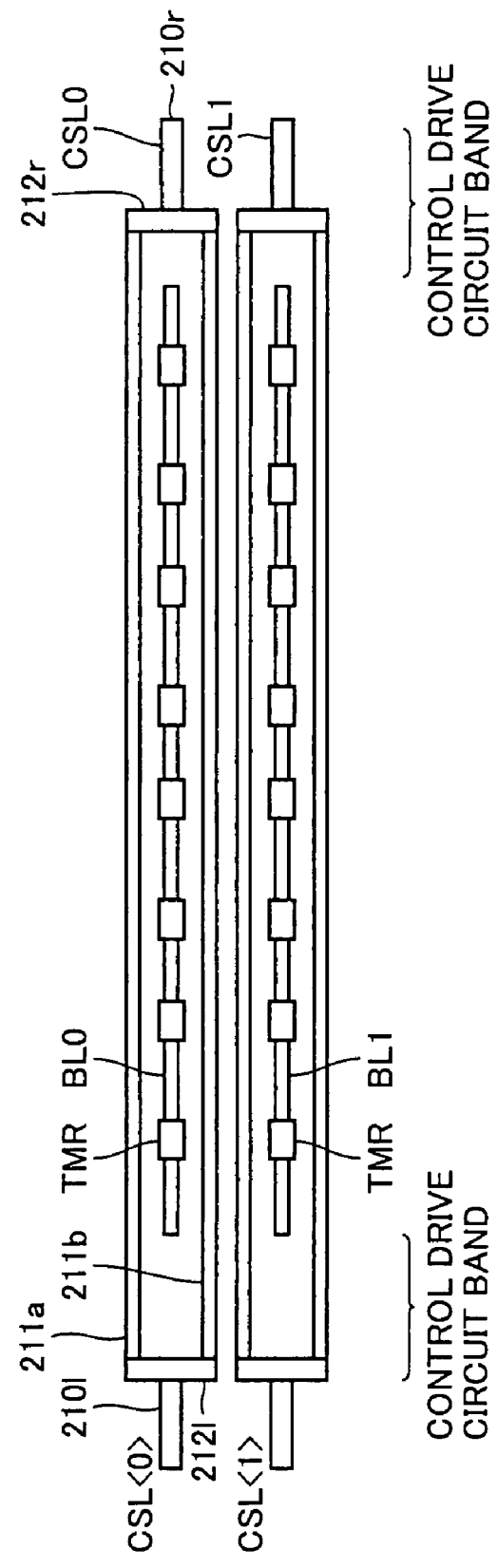
FIG. 64 schematically shows structures of column select lines shown in FIG. 63.

FIG. 64 schematically shows an arrangement of column select lines CSL0-CSLn shown in FIG. 63. FIG. 64 schematically shows a planar layout of column select lines CSL0 and CSL1. Since column select lines CSL0 and CSL1 are arranged in the same manner, only components of column select line CSL0 are allotted with the reference numerals in FIG. 64.

Column select line CSL0 includes a main interconnection line 210*l* receiving column select signal CSL<0> from column decoder 201, divided interconnection lines 211*a* and 211*b* arranged in parallel to and on the opposite sides of bit line BL0 in a plan view, a lead-out interconnection line 212*l* connecting divided interconnection lines 211*a* and 211*b* to main interconnection line 210*l*, and a lead-out interconnection line 212*r* connecting the other end of each of divided interconnection lines 211*a* and 211*b* to main interconnection line 210*r*.

To each of bit lines BL0 and BL1, magneto-resistance elements TMR are arranged in alignment. Column select lines CSL0 and CSL1 are arranged at a layer upper than a layer of bit lines BL0 and BL1. Each of divided interconnection lines 211*a* and 211*b* conducts half times a current flowing through main interconnection lines 210*l* and 210*r*, and thus causes a magnetic field reduced to half times. Divided BL1 in a plan view so that each of divided interconnection lines 211*a* and 211*b* can be spaced from magneto-resistance element TMR on bit line BL0 further than in the structure having bit line BL0 and column select line CSL0 aligned in the plan view. This arrangement suppresses an influence exerted on bit line BL0 by an inducing magnetic field of column select line CSL0.

Figure 65:
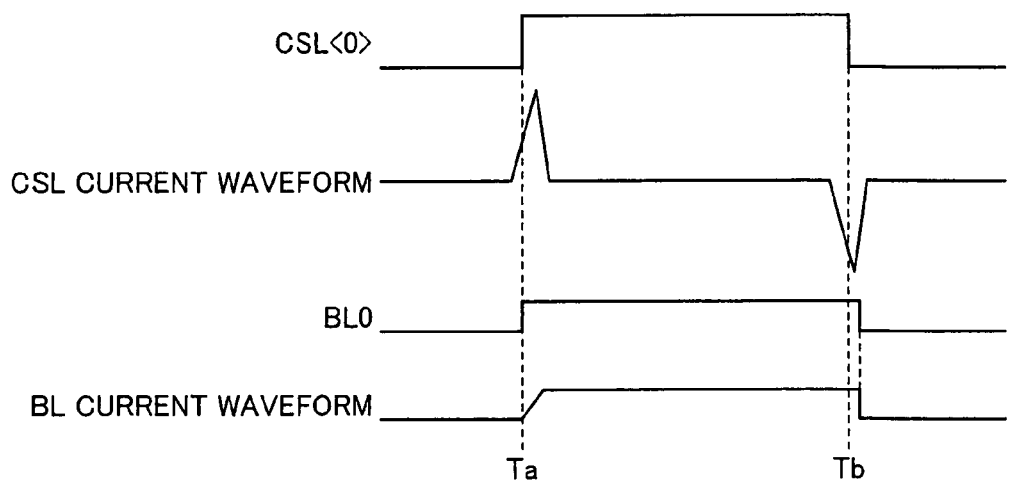
FIG. 65 is a signal waveform diagram representing an operation of data writing of the magnetic memory device shown in FIG. 63.

FIG. 65 schematically represents waveforms of currents flowing through the bit line and the column select line when data writing is performed in the arrangement of the bit lines and column select lines shown in FIGS. 63 and 64. Specifically, FIG. 65 depicts waveforms of the currents flowing through the column select line and bit line when bit line BL0 is selected.

At a time Ta, column select signal CSL<0> is driven to the selected state so that column select line CSL0 is supplied with the current, and a peak current flows. According to the transition of column select signal CSL<0> to the selected state, current driver 203*a* or 203*b* (refer to FIG. 63) supplies a current to bit line BL0 so that the current flows through the bit line (BL), and then the current and the voltage level of bit line BL become stable.

After completion of the data writing, column select signal CSL<0> is driven to the unselected state at a time Tb. Responsively, a discharging current flows through column select line CSL0 in the direction opposite to the current flow direction in the selected state. FIG. 65 illustrates a negative current flowing through the column select line for the current in the opposite direction. In response to the change of column select signal CSL<0> to the unselected state, the current supply to bit line BL0 stops, and the supply of the bit line current stops.

When column select signal CSL<0> changes to the selected and unselected state at times Ta and Tb, respectively, a large column select line peak current occurs on column select line CSL0.

Figure 66A:
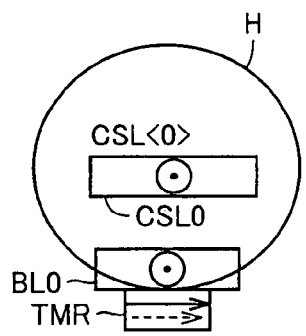
FIGS. 66A and 66B illustrate magnetic fields induced by the column select lines.
Figure 66B:
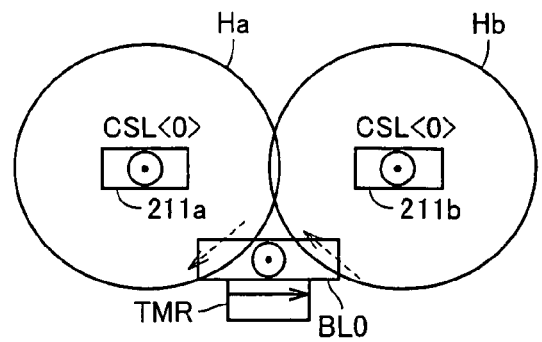

FIGS. 66A and 66B schematically shows induced magnetic fields of the column select line at time Ta in FIG. 65. FIG. 66A shows the induced magnetic field of the column select line in a conventional arrangement, and FIG. 66B shows the induced magnetic fields of the column select lines in the arrangement according to the eleventh embodiment.

In the case where column select line CSL0 and bit line BL0 are aligned to each other as shown in FIG. 66A, the peak current flows through the column select line in the same direction (from the rear side of the drawing sheet of FIG. 66A to the front side) as the current on bit line BL0 at time Ta. In this case, the induced magnetic fields of bit lines BL0 and column select line CSL0 are applied in the same direction to magneto-resistance element TMR of the memory cell, and an unnecessarily large magnetic field is applied thereto. However, in the case where the column select line is formed of divided interconnection lines 211*a* and 211*b* that are arranged at symmetrical positions displaced from bit line BL0 as shown in FIG. 66B, the magnetic fields induced by these divided interconnection lines 211*a* and 211*b* are applied to magneto-resistance element TMR in the opposite directions, and thus cancel each other. Therefore, the magnetic field induced by the current flowing through bit line BL0 is applied to magneto-resistance element TMR, and accordingly, data can be accurately written into the memory cell. The current driven by each of divided interconnection lines 211*a* and 211*b* is reduced by a factor of two as compared with that in the undivided structure, and thus induces a smaller magnetic field. Such small magnetic field exerts only a significantly small influence on the memory cells in an adjacent column.

Figure 67A:
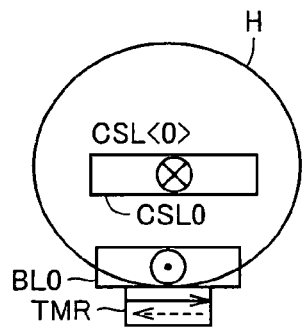
FIGS. 67A and 67B illustrate magnetic fields induced by the column select lines in the data write operation.
Figure 67B:
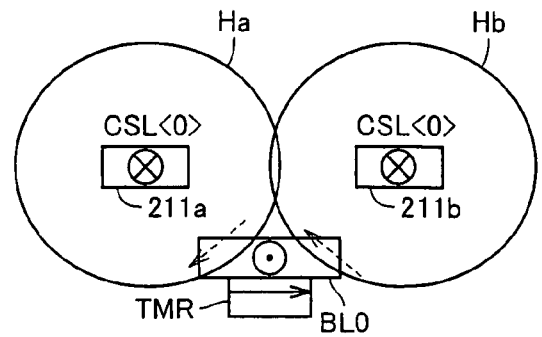

FIGS. 67A and 67B schematically show the magnetic fields induced by the column select line and the bit line at time Tb in FIG. 65. FIG. 67A shows an arrangement in a conventional manner, and FIG. 67B shows an arrangement according to the eleventh embodiment. In the case where bit line BL0 and column select line CSL0 are arranged in alignment with each other in a plan view as shown in FIG. 67A, since column select line CSL0 is driven to the unselected state while a peak current is flowing through bit line BL0, currents flow through column select line CSL0 and bit line BL0 in the opposite directions. Therefore, the induced magnetic fields of bit line BL0 and column select line CSL0 are applied to magneto-resistance element TMR in the opposite directions, and magneto-resistance element TMR enters the state of having the magnetization direction deviated from the direction parallel or anti-parallel to the magnetization direction of the fixed layer. In this case, the resistance of magneto-resistance element TMR takes a value intermediate between the resistance values in the parallel state of and the anti-parallel state of the magnetization directions of the free and fixed layers. Therefore, the data cannot be stored accurately, and thus the data cannot be read accurately.

In FIG. 67B, however, divided interconnection lines 211*a* and 211*b* transmit column select signal CSL<0>, and are arranged in the positions symmetrical with respect to an axis perpendicular to bit line BL0. Thus, divided interconnection lines 211*a* and 211*b* cancel the induced magnetic fields by column select line CSL0 on the region of bit line BL0, and only the induced magnetic field by bit line BL0 is applied to magneto-resistance element TMR, so that the data writing can be performed accurately. In this case, divided interconnection lines 211*a* and 211*b* may possibly apply the induced magnetic fields to the adjacent cells. As already described, however, the amount of current flowing through each of divided interconnection lines 211*a* and 211*b* is reduced by a factor of two, and the induced magnetic field is small so that the direction of the magnetic field in the unselected adjacent memory cell can not be inverted.

Figure 68:
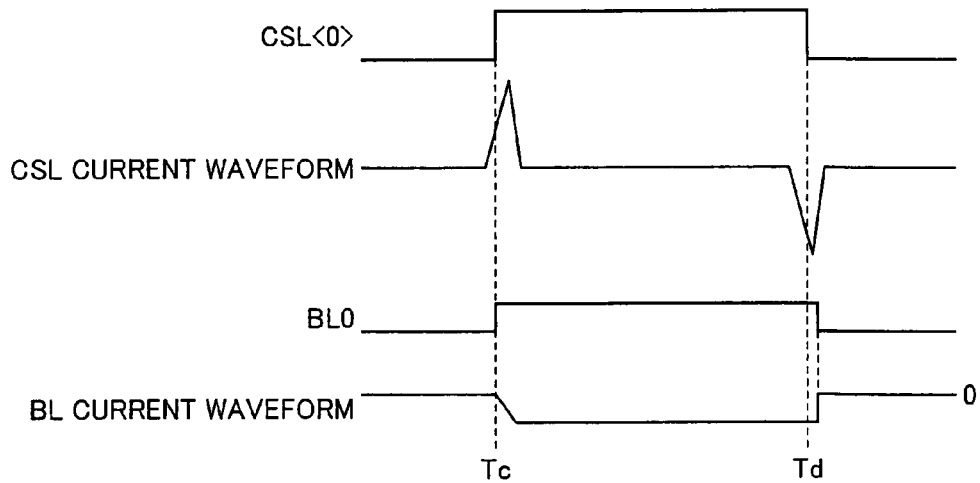
FIG. 68 is a signal waveform diagram representing an operation of data writing of the magnetic memory device shown in FIG. 63.

FIG. 68 represents current waveforms of column select line CSL0 and bit line BL0. In FIG. 68, column select line CSL<0> is driven to the selected state at a time Tc, and a large peak current flows through column select line CSL. Thereafter, column select line CSL stably attains a predetermined voltage (the power supply voltage). In response to driving of column select line CSL<0> to the selected state, bit line BL0 is supplied with the current from the bit line current driver. At time Tc, the current flows through bit line BL0 in the direction opposite to the current flowing through column select line CSL. FIG. 68 depicts the current flowing in the negative direction as the opposite current.

At a time Td, the column select operation completes, and column select signal CSL<0> is driven to the unselected state so that a large peak current flows in the opposite direction. In response to this change of column select signal CSL<0> to the unselected state, bit line BL0 is driven to the unselected state. When column select signal CSL<0> transitions to the unselected state, the bit line write current is flowing through bit line BL0.

According to the current waveforms depicted in FIG. 68, the currents flow through the bit line and the column select line in the opposite directions when a column is selected, and flow through the bit line and the column select line in the same direction when the column select signal turns inactive.

Figure 69A:
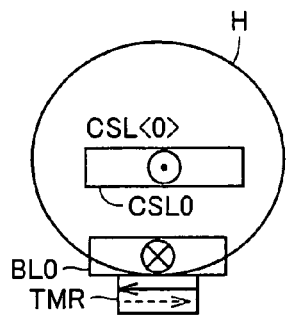
FIGS. 69A and 69B diagrammatically show the magnetic fields induced by the column select lines at a time Tc shown in FIG. 68.
Figure 69B:
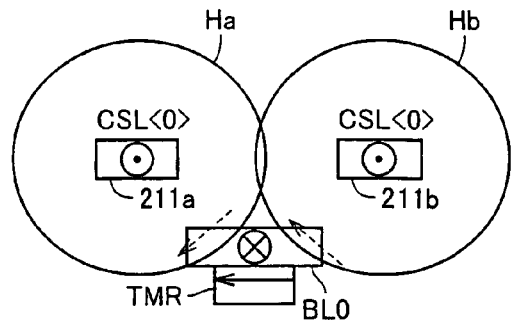

FIGS. 69A and 69B schematically show the induced magnetic fields of the column select lines and bit lines applied to magneto-resistance element TMR at time Tc in FIG. 68. FIG. 69A shows the magnetic fields in the case where bit line BL0 and column select line CSL0 are aligned to each other, and FIG. 69B schematically illustrates the magnetic fields in the arrangement according to the eleventh embodiment.

In the structure in which the column select line is arranged in alignment with the bit line aligned as shown in FIG. 69A, the currents flow through bit line BL0 and column select line CSL0 in the opposite directions at time Tc, to induce the magnetic fields applied to magneto-resistance element TMR in the opposite directions. Therefore, when the data writing is subsequently performed with the write current on bit line BL0, this data writing may possibly be inadequate. However, in the case where column select line CSL0 is formed of divided interconnection lines 211a and 211b as shown in FIG. 69B, the induced magnetic fields of these divided interconnection lines 211a and 211b are opposite to each other in magneto-resistance element TV, and accordingly cancel the influences exerted on magneto-resistance element TMR by the induced magnetic fields of column select line CSL0. Therefore, the data can be accurately written into the memory cell according to the write current flowing through bit line BL0.

Figure 70A:
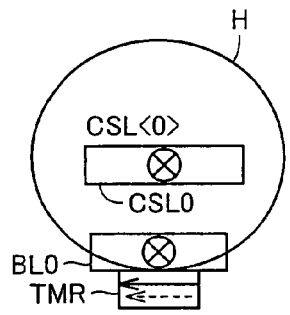
FIGS. 70A and 70B illustrate the magnetic fields induced by the column select lines at a time Td shown in FIG. 68.
Figure 70B:
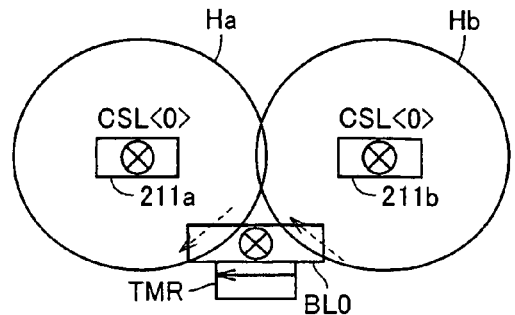

FIGS. 70A and 70B schematically show the induced magnetic fields of the column select line and bit line applied to magneto-resistance element TMR at time Td shown in FIG. 68. FIG. 70A schematically shows the magnetic fields in the case where the bit line and column select line are aligned to each other, and FIG. 70B schematically shows the magnetic fields in the arrangement according to the eleventh embodiment.

When column select signal CSL<0> is driven to the unselected state at time Td in the structure in which the column select line and bit line are aligned to each other as shown in FIG. 70A, if the write current is flowing through bit line BL0, the currents flow through the column select line and the bit line in the same direction, and the induced magnetic field of column select line CSL0 is applied to magneto-resistance element TMR. In this case, however, the magnetization of magneto-resistance element TMR is promoted only in the same direction, and no particular problem occurs.

In the case where the currents flow through bit line BL0 and divided interconnection lines 211a and 211b in the same direction as shown in FIG. 70B, magnetic fields Ha and Hb induced by the currents of divided interconnection lines 211a and 211b are applied to each of bit line BL0 and magneto-resistance element TMR in the opposite directions, and the influences exerted on magneto-resistance element TMR by these magnetic fields Ha and Hb cancel each other.

As shown in FIGS. 65-70A and 70B, therefore, by forming a column select line into a divided line structure and arranging the divided lines on symmetrical positions with respect to an associated the bit line, the influence of the induced magnetic fields of the column select line can be accurately suppressed to write accurate data even in the arrangement in which the column select line is arranged extending over the memory cell array, and the parasitic capacitance thereof causes a large peak current in driving of selection and non-selection of the column select signal. In particular, the column select signal can be used to define the time period of supply of the bit line write current, and therefore the bit line current can be easily controlled in data writing.

In the structure in which the column select line is displaced from the bit line in a plan view, due to the divided interconnection structure, the current amount in driving the column select line is reduced, and an influence on the memory cell (magneto-resistance element) connected to the adjacent bit line is sufficiently suppressed.

[Modification]

Figure 71:
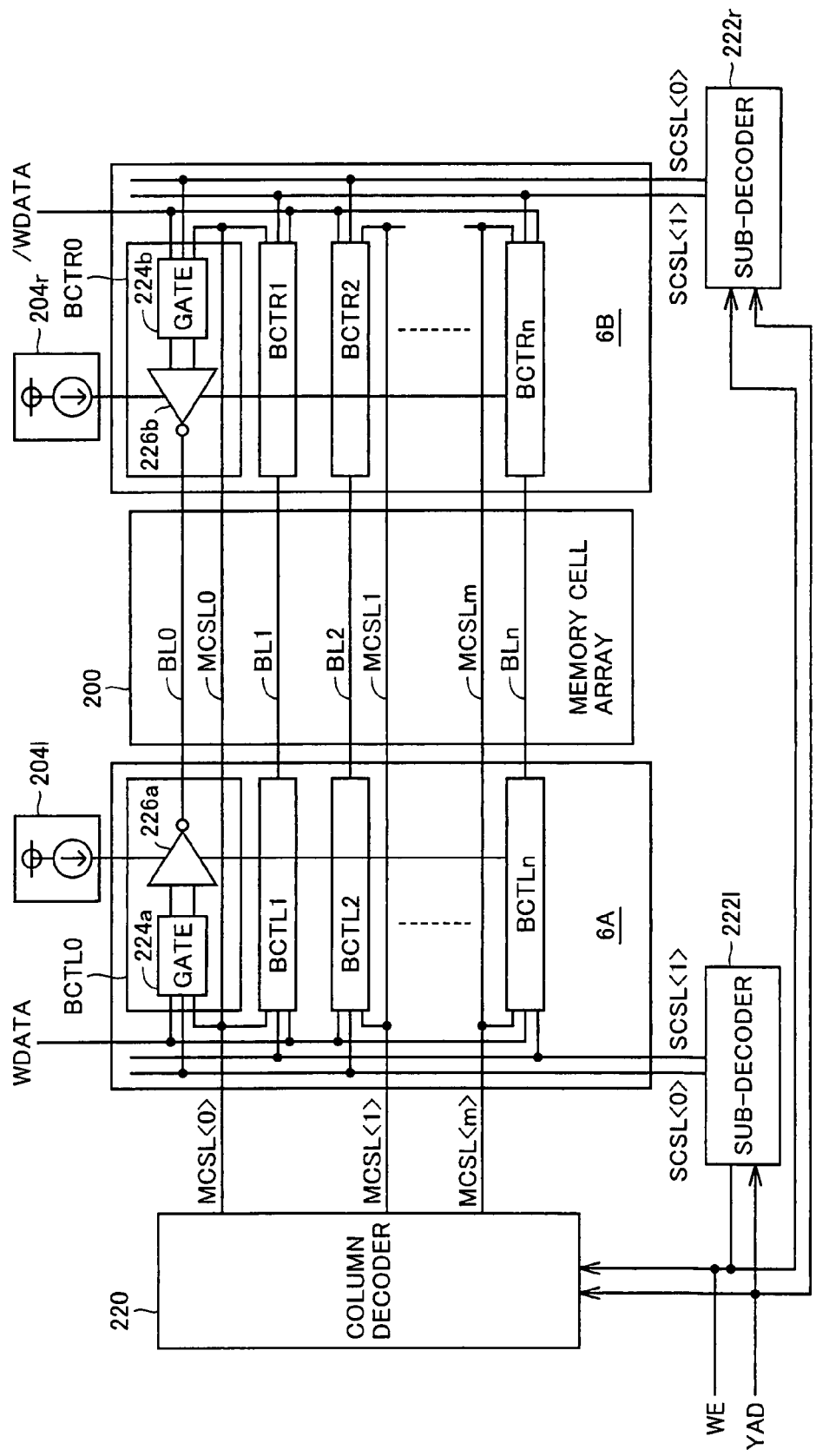
FIG. 71 schematically shows a construction of a main portion of a magnetic memory device according to a modification of an eleventh embodiment of the invention.

FIG. 71 diagrammatically shows a modification of the eleventh embodiment according to the invention, and particularly a construction of a main portion of a magnetic memory device. In FIG. 71, the magnetic memory device includes bit lines BL0-BLn arranged extending in the column direction over memory cell array 200, and main column select lines MCSL0-MCSLm, arranged extending in the column direction over the memory cell array, one for each predetermined number of bit lines. In the construction shown in FIG. 71, each main column select line MCSLi (I=0 to m) is provided for two bit lines BLj and BLj+1 (j=0 to n−1).

For driving the main column select line, there are provided a column decoder 220 for decoding upper bits of column address signal YAD to produce main column select signals MCSL<0>-MCSL<m> when write mode instructing signal WE is active, and sub-decoders 222l and 222r for decoding lower address bits of column address signal YAD to produce sub-column select signals SCSL<0> and SCSL<1> in response to the activation of write mode instructing signal WE. Sub-decoders 222l and 222r are arranged corresponding to bit line write current control circuits 6A and 6B, respectively.

Bit line write current control circuit 6A includes current control drive circuits BCTL0-BCTLn provided corresponding to bit lines BL0-BLn, respectively, and current control drive circuits BCTR0-BCTRn provided corresponding to bit lines BL0-BLn, respectively. Since current control drive circuits BCTL0-BCTLn have the same construction, FIG. 71 representatively shows the construction of current control drive circuit BCTL0. In addition, current control drive circuits BCTR0-BCTRn have the same construction and FIG. 71 representatively shows the construction of current control drive circuit BCTR0. Current control drive circuit BCTL0 includes a gate circuit 224a receiving internal write data WDATA, a corresponding main column select signal MCSL<0> and a corresponding sub-column select signal SCSL<0>, and a current driver 226a for driving bit line BL0 according to an output signal of gate circuit 224a. Current control drive circuit BCTL1 is supplied with main column select signal MCSL<0> and sub-column select signal SCSL<1>. Current control drive circuit BCTL2 is supplied with main column select signal MCSL<1> and sub-column select signal SCSL<0>. Finally, current control drive circuit BCTLn is supplied with main column select signal MCSL<m> and sub-column select signal SCSL<1>.

Sub-column select signals SCSL<0> and SCSL<1> are alternately applied to current control drive circuits BCTL0-

BCTLn. The main column select signal is supplied commonly to the two current drive control circuits. Internal write data WDATA is commonly supplied to current control drive circuit BCTL0-BCTLn.

Current control drive circuit BCTR0 includes a gate circuit 224b receiving complementary internal write data /WDATA, main column select signal MCSL<0> and sub-column select signal SCSL<0>, and a current driver 226b for driving the current on bit line BL0 according to the output signal of gate circuit 224b. Current control drive circuit BCTR1 is supplied with sub-column select signal SCSL<l> and main column select signal MCSL<0>, and current control drive circuit BCTR2 is supplied with main column select signal MCSL<1> and sub-column select signal SCSL<0>. Current control drive circuit BCTRn is supplied with main column select signal MCSL<m> and sub-column select signal SCSL<1>. These current control drive circuits BCTR0-BCTRn are commonly supplied with complementary internal write data /WDATA. Gate circuits 224a and 224b may have conventional constructions, or may include the timing control circuits of any of the previous first to tenth embodiments.

Current drivers 226a are commonly supplied with the constant current from a current supply 204l, and current drivers 226b are supplied with a constant current from a constant current source 204r.

In the magnetic memory device shown in FIG. 71, the column select signal has a hierarchical structure formed of the main column select signal and the sub-column select signal. Main column select signals MCSL<0>-MCSL<m> and sub-column select signals SCSL<0> and SCSL<1> in combination designate one bit line.

Figure 72:
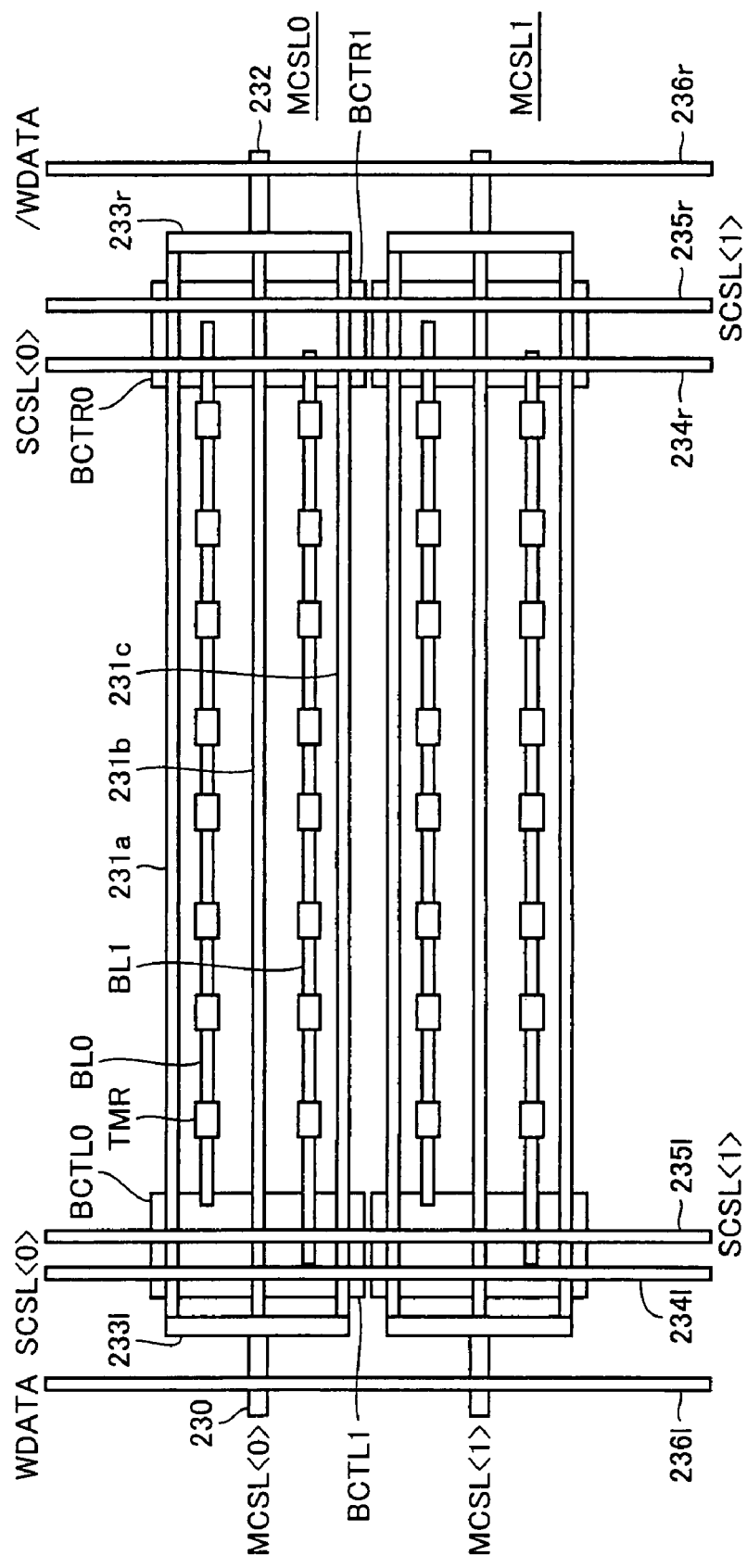
FIG. 72 schematically shows constructions of main column select lines shown in FIG. 71.

FIG. 72 schematically shows a planar layout of main column select lines MCSL0-MCSLm shown in FIG. 71. FIG. 72 shows a planar layout of the main column select lines transmitting main column select signals MCSL<0> and MCSL<1>, respectively. Since main column select lines MCSL0 and MCSL1 have the same planar layout, components of only main column select line MCSL0 are allotted with the reference numerals in FIG. 72.

Main column select line MCSL0 includes a main interconnection line 230 receiving main column select signal MCSL<0> from the column decoder shown in FIG. 71, divided interconnection lines 231a, 231b and 231c arranged sandwiching bit lines BL0 and BL1 and extending in the column direction, a lead-out interconnection line 233a commonly coupling first ends divided interconnection lines 231a-231c to main interconnection line 230, and a lead-out interconnection line 233r coupling the opposite second ends of divided interconnection lines 231a-231c to a main interconnection line 232. Thus, main column select line MCSL0 has a three-way split structure. In a planar layout, bit line BL0 is arranged between divided interconnection lines 231a and 231b, and bit line BL1 is arranged between divided interconnection lines 231b and 231c.

On the opposite sides of bit line BL0, there are arranged current control drive circuits BCTL0 and BCTR0. On the opposite sides of bit line BL1, there are arranged current control drive circuits BCTL1 and BCTR1.

Figure 73:
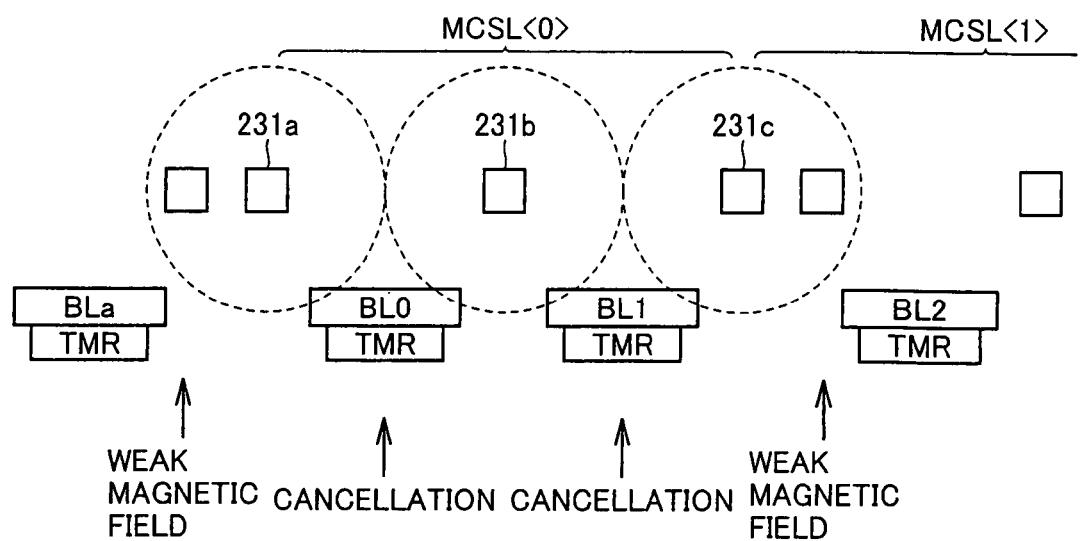
FIG. 73 illustrates magnetic fields induced in the data writing by main column select lines shown in FIG. 72.

FIG. 73 schematically shows induced magnetic fields in the main column line divided structure shown in FIG. 72. In FIG. 73, broken lines represent the magnetic fields induced by divided interconnection lines 231a-231c. When main column select line MCSL<0> is made active and inactive, the currents flow through divided interconnection lines 231a-231c in the same direction in both cases. Therefore, all divided interconnection lines 231a-231c induce the magnetic fields in the same direction. Accordingly, the magnetic fields induced by divided interconnection lines 231a and 231b are applied to bit line BL0 in opposite directions, and therefore cancel each other. Likewise, the magnetic fields induced by divided interconnection lines 231b and 231c are applied to bit line BL1 in opposite directions, and therefore cancel each other.

In this case, divided interconnection lines 231a and 231c induce the magnetic fields applied to adjacent bit lines BLa and BL2, respectively. However, the main column select line has the divided structure, and the current flowing through each of divided interconnection lines 231a-231c is nearly one-third times the current flowing through main interconnection lines 230 and 232, and thus causes only a sufficiently small magnetic field, which exerts no detrimental effect on magneto-resistance elements TMR of the adjacent bit line.

In the case of forming the main column select line into three-way split structure, divided interconnection lines of the adjacent main column select lines are arranged between the adjacent bit lines. For example, in FIG. 73, the divided interconnection lines of the adjacent main column select lines are arranged close to divided interconnection lines 231a and 231c, respectively. In the planar layout, one divided interconnection line and the two divided interconnection lines are arranged alternately between adjacent bit lines. In this case, however, by switching the pitch between the bit lines alternately to the pitch for one divided interconnection line and to the pitch for the two divided interconnection lines repeatedly, each divided interconnection line can be arranged at equal distance to a corresponding bit line. For example, as for bit line BL0, divided interconnection lines 231a and 231b are arranged at symmetrical positions with respect to an axis perpendicular to bit line BL0, and accordingly can be arranged at equally distant positions.

Interconnection lines 234l and 234r transmitting sub-column select signal SCSL<0> as well as interconnection lines 235l and 235r transmitting sub-column select signal SCSL<1> may be formed in a layer lower than divided interconnection lines 231a-231c or in a layer higher than them.

[Modification of Main Column Select Line]

Figure 74:
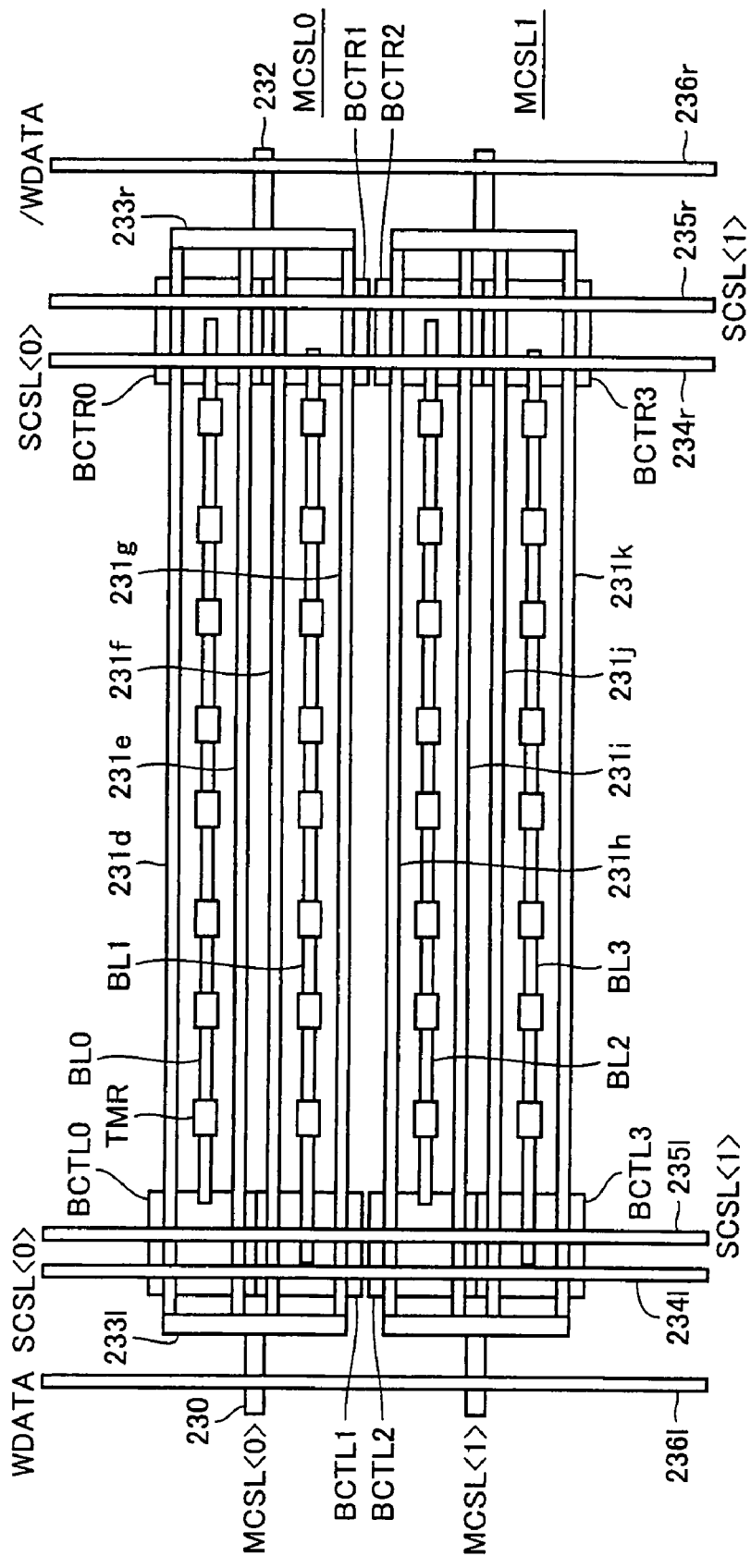
FIG. 74 schematically shows constructions of column select lines according to still another modification of the magnetic memory device of the eleventh embodiment of the invention.

FIG. 74 schematically shows another structure of the main column select line. FIG. 73 shows representatively a structure of main column select lines MCSL0 and MCSL1. The structure of the main column select signal shown in FIG. 73 differs from column select lines CSL0 and MCSL1 in the following points. Main column select line MCSL0 is divided into divided interconnection lines 231d-231g, and main column select signal line MCSL1 is divided into four divided interconnection lines 231h-231k. Divided interconnection lines 231d-231k are arranged such that two divided interconnection lines are arranged in each region between adjacent bit lines. Specifically, divided interconnection lines 231e and 231f are arranged between bit lines BL0 and BL1, and divided interconnection lines 231g and 231h are arranged between bit lines BL1 and BL2. Divided interconnection lines 231i and 231j are arranged between bit lines BL2 and BL3. Other structures shown in FIG. 73 are the same as those shown in FIG. 72, and corresponding portions are allotted with the same reference numerals, and description thereof is not repeated.

Figure 75:
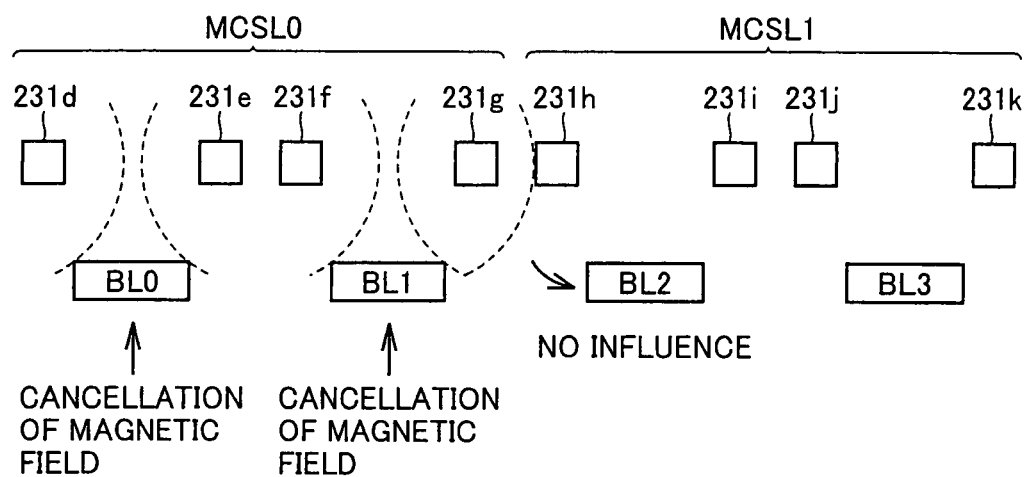
FIG. 75 illustrates magnetic fields induced in the data writing by main column select lines shown in FIG. 74.

FIG. 75 schematically shows induced magnetic fields in the main column select line structure shown in FIG. 74. FIG. 75 does not show magneto-resistance element TMR. When main column select line MCSL0 is selected, current flows through divided interconnection lines 231d-231g, and divided interconnection lines 231h-231k are maintained at the voltage level of the unselected state. Therefore, induced magnetic fields of divided interconnection lines 231d and 231e are applied to bit line BL0 in the opposite directions, and the effects of the magnetic fields applied from divided interconnection lines 231*d* and 231*e* to bit line BL0 cancel each other. In this state, the induced magnetic field of divided interconnection line 231*f* may affect bit line BL0. However, main column select line MCSL0 have a four-way split structure, and a current flowing through each of divided interconnection lines 231*d*-231*g* is about ¼ times as large as that in the non-divided structure, and induces only a sufficiently small magnetic field. In addition, the distance between bit line BL0 and divided interconnection line 231*f* is long, and the induced magnetic field caused by divided interconnection line 231*f* hardly affects bit line BL0.

Likewise, bit line BL1 is subjected to the magnetic fields caused in the opposite directions by divided interconnection lines 231*f* and 231*g*, and thus, the influences, which are exerted on bit line BL1 by the induced magnetic fields of divided interconnection lines 231*f* and 231*g*, cancel each other. In this case, the induced magnetic field of divided interconnection line 231*e* may likewise affect bit line BL1. However, the amount of current flowing through divided interconnection line 231*e* is about ¼ times as large as that flowing through main column select line in the non-divided structure, and it is possible to neglect the influence, which may be exerted on bit line BL1 by the induced magnetic field of divided interconnection line 231*e*. Likewise, the induced magnetic field of divided interconnection line 231*g* hardly affect bit line BL2.

According to the arrangement in which the main column select line MCSL (MCSL0 and MCSL1) is formed into the four-way divided (split) and two divided interconnection lines are arranged in a region between each pair of adjacent bit lines, bit lines BL0-BL*n* can be arranged with a bit line pitch being constant. When the divided interconnection lines of the main column select line can be placed at the pitch as the bit line pitch if an inter-bit-line interval is the same as a bit line width in bit lines BL0-BL*n*.

[Modification 2]

Figure 76:
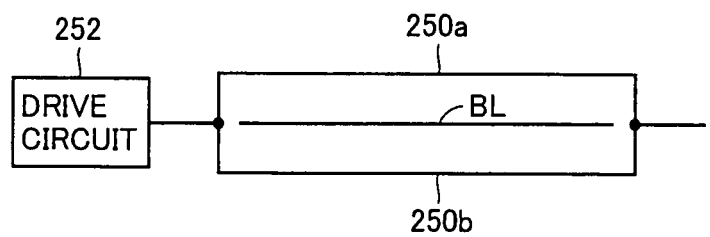
FIG. 76 illustrates further another modification of the eleventh embodiment of the invention.

FIG. 76 shows further another modification of the eleventh embodiment according to the invention. In FIG. 76, divided control signal lines (interconnection lines) 250*a* and 250*b* are arranged parallel to bit line BL. Each of divided signal lines (interconnection lines) 250*a* and 250*b* is driven by a drive circuit 252 arranged on one end thereof. Divided control signal lines 250*a* and 250*b* may be arranged in a layer higher than bit line BL, or may be arranged in a lower layer. Divided control signal lines 250*a* and 250*b* are parallel to bit line BL, and are driven by a drive circuit 252 when bit line BL is driven.

In the arrangement in which divided control signal lines 250*a* and 250*b* are arranged extending in the column direction, and form a source line connected to the access transistors of memory cells, and are driven to a first reference potential in the read operation and otherwise are maintained at a second reference potential, a peak current on the source line may possibly inverts the storage data of a memory cell in the data read operation. However, by forming the source line into the divided interconnection structure, the inversion of the memory cell data in the data read operation can be prevented.

In the arrangement in which the memory cell array is divided into blocks, data writing is effected on a selected block, and drive circuit 252 transmits a block select signal, erroneous writing into a bit line arranged near a signal line transmitting this block select signal can be prevented.

Therefore, when the control signal line is a signal line to generate a magnetic field in a direction of the easy axis of the magneto-resistance element of a memory cell in data writing or reading, the influence of the induced magnetic fields by the control signal line on a neighboring bit line can be cancelled.

In the hierarchical structure including the main and sub-column select lines, one main column select line selects two bit lines. However, the main column select line may be configured to designate four bit lines.

According to an eleventh embodiment of the invention, as described above, the a signal line, which extends in the same direction as the bit line, and induces the magnetic field in the direction of the easy axis of the magneto-resistance element, is formed into a divided structure and the divided signal lines are arranged at symmetrical positions on a planar layout with respect to a bit line. Thus, the influence by a peak current in driving the signal line can be readily suppressed to prevent occurrence of the magnetic disturbance.

This invention can be applied to various memory devices using the magneto-resistance elements as storage elements.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor wafer comprising:

a plurality of semiconductor chips arranged in rows and columns, the semiconductor chips each including a logic circuit for performing a predetermined processing on received data, and a plurality of magnetic memories integrated with said logic circuit on a common semiconductor chip, for storing at least data to be used by said logic circuit, each magnetic memory having a plurality of magnetic memory cells arranged in rows and columns, each magnetic memory cell including a magneto-resistance element formed of a fixed layer having a magnetization direction fixed independently of storage data, a free layer having a magnetization direction set according to the storage data, and a non-magnetic layer arranged between the fixed and free layers, the fixed layers in said plurality of magnetic memories being the same in magnetization direction, and said plurality of magnetic memories including first magnetic memories each having a common relationship of parallelism and anti-parallelism in magnetization direction between the free and fixed layers for a logical level of write data into each first magnetic memory, the fixed layers in said plurality of semiconductor chips being the same in magnetization direction, wherein each of the magnetic memories includes a plurality of write current lines each for transmitting a current in a direction changed according to a logical level of write data, and for writing the write data into a memory cell through utilization of a magnetic field induced by the current transmitted through said each write current line, and said plurality of magnetic memories each include an interface circuit to be individually accessed by said logic circuit through each respective interface circuit, and said first magnetic memories include magnetic memories having layouts arranged symmetrical with respect to an axis parallel to a direction of the write current line, the symmetrical layout including a layout of the interface circuit and a layout of a memory circuit including the plurality of magnetic memory cells.

* * * * *